United States Patent
Yamamoto et al.

(10) Patent No.: US 9,613,798 B2
(45) Date of Patent: Apr. 4, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Ryuji Yamamoto, Kodaira (JP); Yoshiro Hirose, Toyama (JP); Satoshi Shimamoto, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 7 days.

(21) Appl. No.: 14/634,280

(22) Filed: Feb. 27, 2015

(65) Prior Publication Data

US 2015/0255274 A1 Sep. 10, 2015

(30) Foreign Application Priority Data

Mar. 4, 2014 (JP) .................................. 2014-041965

(51) Int. Cl.

| | |
|---|---|
| *H01L 21/31* | (2006.01) |
| *H01L 21/469* | (2006.01) |
| *H01L 21/02* | (2006.01) |
| *C23C 16/30* | (2006.01) |
| *C23C 16/34* | (2006.01) |

(Continued)

(52) U.S. Cl.

CPC ...... *H01L 21/02167* (2013.01); *C23C 16/308* (2013.01); *C23C 16/345* (2013.01); *C23C 16/36* (2013.01); *C23C 16/45531* (2013.01); *C23C 16/45542* (2013.01); *C23C 16/45553* (2013.01); *H01L 21/022* (2013.01); *H01L 21/0228* (2013.01); *H01L 21/02126* (2013.01); *H01L 21/02211* (2013.01); *H01L 21/02274* (2013.01); *C23C 16/45544* (2013.01); *C23C 16/52* (2013.01)

(58) Field of Classification Search
None
See application file for complete search history.

(56) References Cited

U.S. PATENT DOCUMENTS

| | | | |
|---|---|---|---|
| 8,329,599 B2 | 12/2012 | Fukazawa et al. | |
| 8,956,984 B2 | 2/2015 | Okuda | |

(Continued)

FOREIGN PATENT DOCUMENTS

| | | |
|---|---|---|
| JP | 2005-159138 A | 6/2006 |
| JP | 2007-254810 A | 10/2007 |

(Continued)

*Primary Examiner* — Sonya D McCall Shepard
(74) *Attorney, Agent, or Firm* — Volpe and Koenig, P.C.

(57) ABSTRACT

A technique includes forming a film containing a first element, a second element and carbon on a substrate by performing a cycle a predetermined number of times. The cycle includes non-simultaneously performing: forming a first layer containing the first element and carbon by supplying a precursor gas having a chemical bond of the first element and carbon from a first supply part to the substrate in a process chamber, and forming a second layer by supplying a reaction gas containing the second element from a second supply part to the substrate in the process chamber and supplying a plasma-excited inert gas from a third supply part to the substrate in the process chamber to modify the first layer, the third supply part being different from the second supply part.

13 Claims, 14 Drawing Sheets

(51) Int. Cl.
*C23C 16/36* (2006.01)
*C23C 16/455* (2006.01)
*C23C 16/52* (2006.01)

(56) References Cited

U.S. PATENT DOCUMENTS

| | | |
|---|---|---|
| 9,018,104 B2 | 4/2015 | Hirose et al. |
| 9,200,364 B2 | 12/2015 | Ito |
| 2005/0118837 A1 | 6/2005 | Todd et al. |
| 2005/0255713 A1 | 11/2005 | Taguchi et al. |
| 2006/0088985 A1 | 4/2006 | Haverkort et al. |
| 2006/0110943 A1 | 5/2006 | Swerts et al. |
| 2008/0038936 A1 | 2/2008 | Todd et al. |
| 2009/0311857 A1 | 12/2009 | Todd et al. |
| 2012/0122302 A1 | 5/2012 | Weidman et al. |
| 2013/0065404 A1 | 3/2013 | Weidman et al. |
| 2014/0038427 A1 | 2/2014 | Weidman et al. |

FOREIGN PATENT DOCUMENTS

| | | |
|---|---|---|
| JP | 2010-209281 A | 2/2010 |
| JP | 2013-093551 A | 5/2013 |
| JP | 2013-179239 A | 9/2013 |
| KR | 10-1193628 B | 10/2012 |
| KR | 10-2013-0135261 A | 12/2013 |
| WO | 2004/006321 A1 | 1/2004 |
| WO | 2011/115250 A1 | 9/2011 |
| WO | 2011/125395 A1 | 10/2011 |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2014-041965, filed on Mar. 4, 2014, the entire contents of which are incorporated herein by reference.

TECHNICAL FIELD

The present disclosure relates to a method of manufacturing a semiconductor device, which includes a process for forming a thin film on a substrate, a substrate processing apparatus, and a recording medium.

BACKGROUND

As an example of procedures of manufacturing a semiconductor device, a procedure of forming a film such as a nitride film, an oxide film or the like on a substrate is often carried out by supplying, e.g., a precursor gas containing silicon and a reaction gas such as a nitriding gas, an oxidizing gas or the like to the substrate.

If carbon (C) or the like is added to the film formed on the substrate, it is possible to increase, e.g., a resistance to hydrogen fluoride (HF). If carbon is added to the film at a high concentration by accurately controlling a carbon concentration in the film, it is possible to further increase the HF resistance of the film.

SUMMARY

The present disclosure provides some embodiments of a technique capable of forming a film having a high carbon concentration.

According to one embodiment of the present disclosure, there is provided a technique including forming a film containing a first element, a second element and carbon on a substrate by performing a cycle a predetermined number of times, wherein the cycle includes non-simultaneously performing forming a first layer containing the first element and carbon by supplying a precursor gas having a chemical bond of the first element and carbon from a first supply part to the substrate in a process chamber; and forming a second layer by supplying a first reaction gas containing the second element from a second supply part to the substrate in the process chamber and supplying a plasma-excited inert gas from a third supply part to the substrate in the process chamber to modify the first layer, the third supply part being different from the second supply part.

DETAILED DESCRIPTION

One Embodiment of the Present Disclosure

One embodiment of the present disclosure is described with reference to FIGS. 1 to 3.

(1) Configuration of Substrate Processing Apparatus

Figure 1:
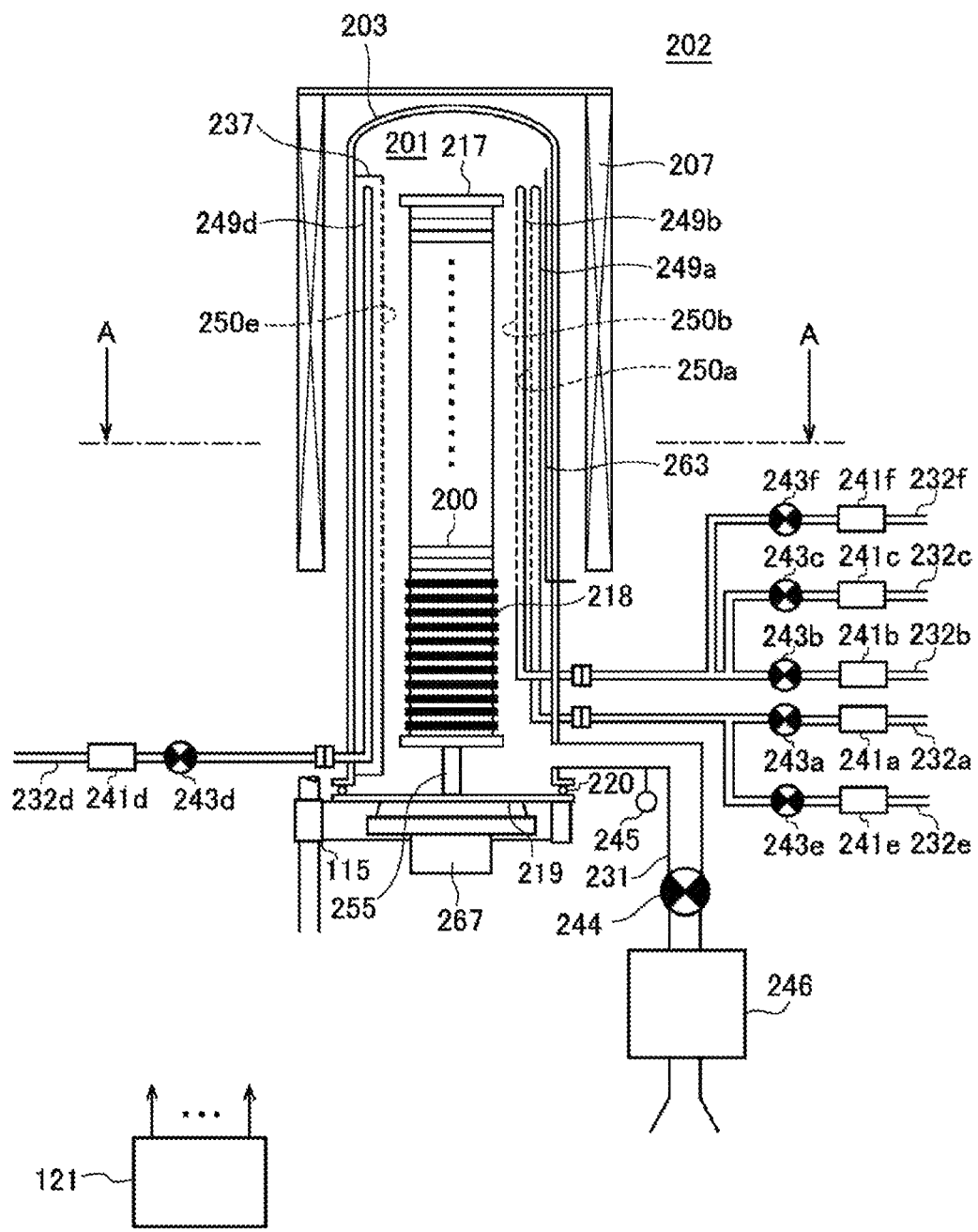
FIG. 1 is a schematic configuration view of a vertical processing furnace of a substrate processing apparatus suitably used in one embodiment of the present disclosure, in which a portion of the processing furnace is shown in a vertical cross section.

As shown in FIG. 1, a processing furnace 202 includes a heater 207 as a heating unit (a heating mechanism). The heater 207 has a cylindrical shape and is supported by a heater base (not shown) serving as a support plate so as to be vertically installed. As will be described later, the heater 207 functions as an excitation unit (an activation mechanism) configured to thermally excite (activate) a gas.

A reaction tube 203 constituting a reaction vessel (process vessel) is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate a plurality of wafers 200 as substrates. The wafers 200 are horizontally stacked at multiple stages along a vertical direction in a boat 217 which will be described later.

Nozzles 249a, 249b, and 249d serving as gas supply parts (or supply parts) are installed in the process chamber 201 to penetrate through a lower portion of the reaction tube 203. The nozzles 249a, 249b, and 249d are made of, e.g., a heat resistant material such as quartz, SiC or the like. Gas supply pipes 232a, 232b, and 232d are respectively connected to the nozzles 249a, 249b, and 249d. A gas supply pipe 232c is connected to the gas supply pipe 232b. In this way, the three nozzles 249a, 249b, and 249d and the four gas supply pipes 232a to 232d are installed in the reaction tube 203 and are configured to supply plural kinds of gases into the process chamber 201.

However, the processing furnace 202 of the present embodiment is not limited to the configuration as described above. For example, a manifold made of metal and configured to support the reaction tube 203 may be installed under the reaction tube 203. Each of the nozzles may be installed to penetrate through a sidewall of the manifold. In this case, an exhaust pipe 231, which will be described later, may be further installed in the manifold. Alternatively, the exhaust pipe 231 may be installed in a lower portion of the reaction tube 203 rather than in the manifold. A furnace opening portion of the processing furnace 202 may be made of metal and the nozzles or the like may be installed in the metal-made furnace opening portion.

Mass flow controllers (MFC) 241a to 241d, which are flow rate controllers (flow rate control units), and valves 243a to 243d, which are opening/closing valves, are sequentially installed in the gas supply pipes 232a to 232d from corresponding upstream sides. Gas supply pipes 232e and 232f, which supply an inert gas, are respectively connected to the gas supply pipes 232a and 232b at the downstream side of the valves 243a and 243b. MFCs 241e and 241f, which are flow rate controllers (flow rate control units), and valves 243e and 243f, which are opening/closing valves, are sequentially installed in the gas supply pipes 232e and 232f from the corresponding upstream sides.

The nozzles 249a and 249b are respectively connected to end portions of the gas supply pipes 232a and 232b. As shown in FIG. 2, the nozzles 249a and 249b are disposed in an annular space between the inner wall of the reaction tube 203 and the wafers 200 such that the nozzles 249a and 249b extend upward along a stacking direction of the wafers 200 from a lower portion of the inner wall of the reaction tube 203 to an upper portion thereof. Specifically, the nozzles 249a and 249b are installed along a wafer arrangement region in which the wafers 200 are arranged and in a region that horizontally surrounds the wafer arrangement region at a side of the wafer arrangement region. That is to say, the nozzles 249a and 249b are installed at a lateral side of the end portions of the wafers 200 carried into the process chamber 201. Each of the nozzles 249a and 249b is configured as an L-shaped nozzle. A horizontal portion of each of the nozzles 249a and 249b is installed to penetrate a lower sidewall of the reaction tube 203. A vertical portion of each of the nozzles 249a and 249b is installed to extend upward at least from one end portion of the wafer arrangement region toward the other end portion thereof. A plurality of gas supply holes 250a and 250b for supplying gas is respectively formed on the side surfaces of the nozzles 249a and 249b. Each of the gas supply holes 250a and 250b is opened toward the center of the reaction tube 203 to allow the gas to be supplied toward the wafers 200. The gas supply holes 250a and 250b may be formed in a plural number so as to span from the lower portion of the reaction tube 203 to the upper portion thereof. The respective gas supply holes 250a and 250b may have the same opening area. Further, the gas supply holes 250a and 250b may be formed at a predetermined opening pitch.

The nozzle 249d is connected to an end portion of the gas supply pipe 232d. The nozzle 249d is installed within a buffer chamber 237 as a gas supply part (or a supply part). The buffer chamber 237 serves also as a gas distribution space. The buffer chamber 237 is installed in an annular space defined between the inner wall of the reaction tube 203 and the wafers 200 and in a region spanning from the lower portion of the inner wall of the reaction tube 203 to the upper portion thereof, so as to extend along the stacking direction of the wafers 200. That is to say, the buffer chamber 237 is installed in a lateral side of a wafer arrangement region horizontally surrounding the wafer arrangement region, so as to extend along the wafer arrangement region. In other words, the buffer chamber 237 is installed at the lateral side of the end portions of the wafers 200 carried into the process chamber 201. Gas supply holes 250e configured to supply a gas is formed in the end portion of the wall of the buffer chamber 237 adjoining the wafers 200. The gas supply holes 250e are opened toward the center of the reaction tube 203 and are configured to supply a gas toward the wafers 200. The gas supply holes 250e are formed in a plural number so as to span from the lower portion of the reaction tube 203 to the upper portion thereof. The respective gas supply holes 250e have the same opening area and are formed at a regular opening pitch.

The nozzle 249d is installed at the opposite end portion of the buffer chamber 237 from the end portion in which the gas supply holes 250e are formed, so as to extend upward in the stacking direction of the wafers 200 from the lower portion of the inner wall of the reaction tube 203 to the upper portion thereof. Specifically, the nozzle 249d is installed along the wafer arrangement region in which the wafers 200 are arranged and in a region that horizontally surrounds the wafer arrangement region. In other words, the nozzle 249d is installed at a lateral side of end portions of the wafers 200 carried into the process chamber 201. The nozzle 249d is configured as an L-shaped nozzle. A horizontal portion of the nozzle 249d is installed to penetrate a lower sidewall of the reaction tube 203. A vertical portion of the nozzle 249d is installed to extend upward at least from one end portion of the wafer arrangement region toward the other end portion thereof. A plurality of gas supply holes 250d for supplying gas is formed on the side surface of the nozzle 249d. The gas supply holes 250d are opened toward the center of the buffer chamber 237. Similar to the gas supply holes 250e, the gas supply holes 250d are formed in a plural number so as to span from the lower portion of the reaction tube 203 to the upper portion thereof. If a pressure difference between an interior of the buffer chamber 237 and an interior of the process chamber 201 is small, the gas supply holes 250d may be configured to have the same opening area. Further, the gas supply holes 250d may be formed at a predetermined opening pitch from an upstream side (i.e., a lower portion) to a downstream side (i.e., an upper portion). In contrast, if the pressure difference between the interior of the buffer chamber 237 and the interior of the process chamber 201 is large, the opening area of the gas supply holes 250d may be set to become gradually larger from the upstream side toward the downstream side. Alternatively or additionally, the opening pitch of the gas supply holes 250d may be set to become gradually smaller from the upstream side toward the downstream side.

By adjusting the opening area and the opening pitch of the gas supply holes 250d from the upstream side to the downstream side as described above, gas may be injected from the respective gas supply holes 250d substantially at the same flow rate but at different flow velocities. The gas injected from the individual gas supply holes 250d is first introduced into the buffer chamber 237. This makes it possible to make uniform the flow velocities of the gas within the buffer chamber 237. The particle velocity of the gas injected from the respective gas supply holes 250d into the buffer chamber 237 are reduced in the buffer chamber 237. Then, the gas is injected from the respective gas supply holes 250e into the process chamber 201. The gas which has flown into the buffer chamber 237 from the respective gas supply holes 250d has a uniform flow rate and a uniform flow velocity when ejected from the respective gas supply holes 250e into the process chamber 201.

As described above, in the present embodiment, gas is transferred through the nozzles 249a, 249b, and 249d, which are disposed in the vertically-elongated annular space, i.e., a cylindrical space, defined by the inner wall of the reaction tube 203 and the end portions of the stacked wafers 200, and the buffer chamber 237. The gas is initially injected into the reaction tube 203, near the wafers 200, through the gas supply holes 250a, 250b, 250d, and 250e formed in the nozzles 249a, 249b, and 249d and the buffer chamber 237. Accordingly, the gas supplied into the reaction tube 203 mainly flows within the reaction tube 203 in a direction parallel to surfaces of the wafers 200, i.e., in a horizontal direction. With this configuration, the gas can be uniformly supplied to the respective wafers 200. This makes a thickness of a thin film formed on each of the wafers 200 uniform. In addition, the gas flowing on the surfaces of the wafers 200 after reaction, i.e., the reacted residual gas, flows toward an exhaust port, i.e., the exhaust pipe 231 which will be described later. The flow direction of the residual gas is not limited to a vertical direction but may be appropriately decided depending on a position of the exhaust port.

Figure 2:
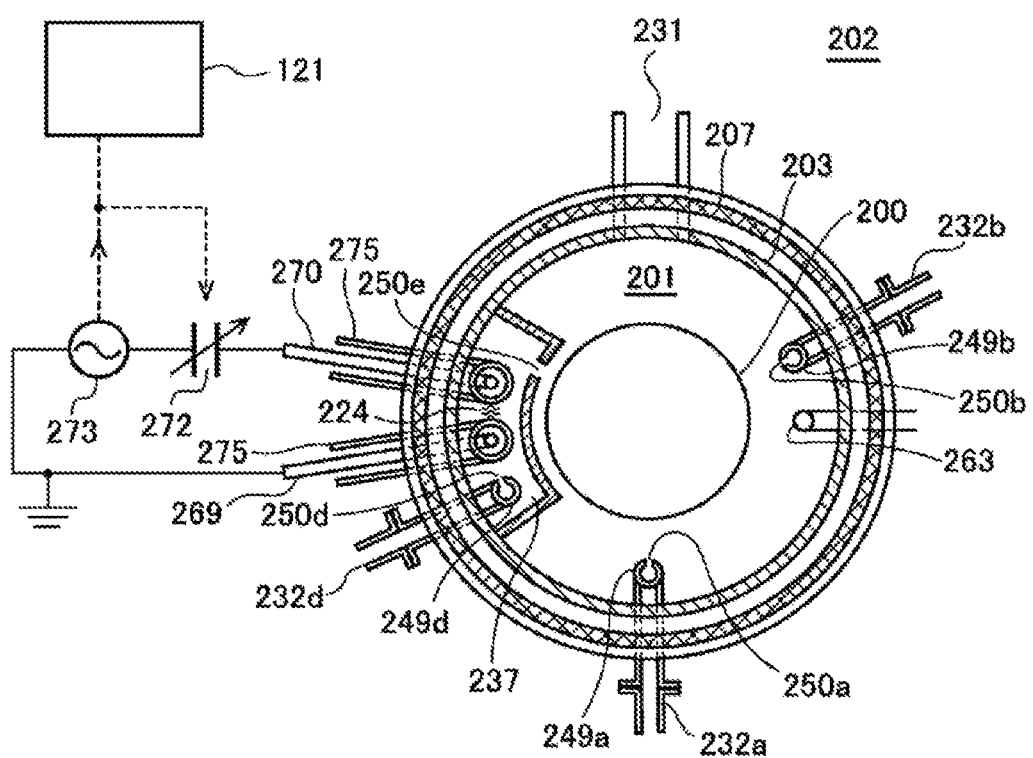
FIG. 2 is a schematic configuration view of the vertical processing furnace of the substrate processing apparatus suitably used in one embodiment of the present disclosure, in which a portion of the processing furnace is shown in a cross section taken along line A-A in FIG. 1.

As illustrated in FIG. 2, the processing opening of the substrate processing apparatus of the present embodiment is configured such that, when seen in a plan view, a perpendicular bisector of a straight line interconnecting each of the gas supply holes 250b of the nozzle 249b and each of the gas supply holes 250e of the buffer chamber 237 passes through a center of each of the wafers 200 carried into the process chamber 201. Thus, the gas supplied through the nozzle 249b and the gas supplied from the buffer chamber 237 are mixed within the plane of each of the wafers 200. That is to say, the mixing point of the gases lies within the plane of each of the wafers 200.

A precursor gas having a chemical bond of a predetermined element and carbon (C), for example, an alkylene halosilane precursor gas containing Si as the predetermined element, an alkylene group, and a halogen group and having a chemical bond of Si and C (an Si—C bond), or an alkyl halosilane precursor gas containing Si, an alkyl group, and a halogen group and having a Si—C bond, is supplied from the gas supply pipe 232a into the process chamber 201 through the MFC 241a, the valve 243a and the nozzle 249a.

In this configuration, the alkylene group is a functional group obtained by removing two hydrogen (H) atoms from chain-shaped saturated hydrocarbon (alkane), which is denoted as a chemical formula $C_nH_{2n+2}$ and is an aggregate of atoms that are denoted as a chemical formula $C_nH_{2n}$. The alkylene group includes a methylene group, an ethylene group, a propylene group, a butylene group, and so forth. The alkyl group is a functional group obtained by removing one H atom from chain-shaped saturated hydrocarbon, which is denoted as a chemical formula $C_nH_{2n+2}$ and is an aggregate of atoms that are denoted as a chemical formula $C_nH_{2n+1}$. The alkyl group includes a methyl group, an ethyl group, a propyl group, a butyl group, or the like. The halogen group includes a chloro group, a fluoro group, a bromo group, an iodine group, or the like. As such, the halogen group includes a halogen element such as chlorine (Cl), fluorine (F), bromine (Br), iodine (I) or the like.

As the alkylene halosilane precursor gas, it may be possible to use, e.g., a precursor gas containing Si, a methylene group (—$CH_2$—) as an alkylene group and a chloro group (Cl) as a halogen group, namely a chlorosilane precursor gas containing a methylene group, or a precursor gas containing Si, an ethylene group (—$C_2H_4$—) as an alkylene group and a chloro group (Cl) as a halogen group, namely a chlorosilane precursor gas containing an ethylene group. As the chlorosilane precursor gas containing a methylene group, it may be possible to use, e.g., a methylene bis(trichlorosilane) gas, namely a bis(trichlorosilyl)methane (($SiCl_3)_2CH_2$, abbreviation: BTCSM) gas. As the chlorosilane precursor gas containing an ethylene group, it may be possible to use, e.g., an ethylene bis(trichlorosilane) gas, namely a 1,2-bis(trichlorosilyl)ethane (($SiCl_3)_2C_2H_4$, abbreviation: BTCSE) gas.

Figure 14A:
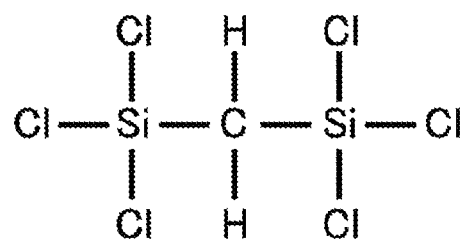
FIG. 14A is a view illustrating a chemical structural formula of BTCSM.

As shown in FIG. 14A, BTCSM contains one methylene group as an alkylene group in its chemical structural formula (in one molecule). Each of two bonds of the methylene group is bonded to Si, such that a Si—C—Si bond is formed.

Figure 14B:
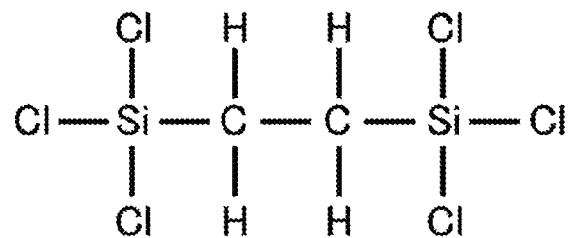
FIG. 14B is a view illustrating a chemical structural formula of BTCSE.

As shown in FIG. 14B, BTCSE contains one ethylene group as an alkylene group in one molecule. Each of two dangling bonds of the ethylene group is bonded to Si such that a Si—C—C—Si bond is formed.

As the alkyl halosilane precursor gas, it may be possible to use, e.g., a precursor gas containing Si, a methyl group (—$CH_3$) as an alkyl group and a chloro group (Cl) as a halogen group, namely a chlorosilane precursor gas containing a methyl group. As the chlorosilane precursor gas containing a methyl group, it may be possible to use, e.g., a 1,1,2,2-tetrachloro-1,2-dimethyldisilane (($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas, a 1-monochloro-1,1,2,2,2-pentamethyldisilane ((CH$_3$)$_5$Si$_2$Cl, abbreviation: MCPMDS) gas, or the like. Unlike the alkylene halosilane precursor gas such as the BTCSE gas or the BTCSM gas, the alkyl halosilane precursor gas such as the TCDMDS gas, the DCTMDS gas or the MCPMDS gas is a gas having a Si—Si bond, namely a precursor gas containing a predetermined element and a halogen element and having a chemical bond of the predetermined element.

Figures 14C, 14D:
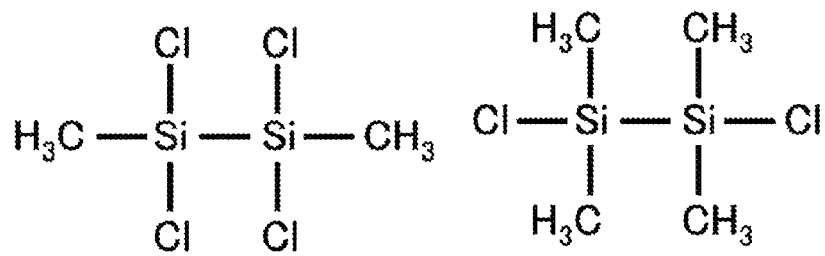
FIG. 14C is a view illustrating a chemical structural formula of TCDMDS.
FIG. 14D is a view illustrating a chemical structural formula of DCTMDS.

As shown in FIG. 14C, TCDMDS contains two methyl groups as alkyl groups in one molecule. Each of dangling bonds of the two methyl groups is bonded to Si such that Si—C bonds are formed. TCDMDS is a derivative of disilane, and has a Si—Si bond. As such, TCDMDS has a Si—Si—C bond in which Si and Si are bonded to each other, and Si is bonded to C.

As shown in FIG. 14D, DCTMDS contains four methyl groups as alkyl groups in one molecule. Each of dangling bonds of the four methyl groups is bonded to Si, such that Si—C bonds are formed. DCTMDS is a derivative of disilane, and has a Si—Si bond. As such, DCTMDS has a Si—Si—C bond in which Si and Si are bonded to each other, and Si is bonded to C.

Figure 14E:
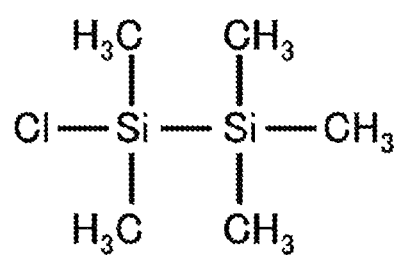
FIG. 14E is a view illustrating a chemical structural formula of MCPMDS.

As shown in FIG. 14E, MCPMDS contains five methyl groups as alkyl groups in one molecule. Each of dangling bonds of the five methyl groups is bonded to Si, such that Si—C bonds are formed. MCPMDS is a derivative of disilane, and has a Si—Si bond. As such, MCPMDS has a Si—Si—C bond in which Si and Si are bonded to each other, and Si is bonded to C. Unlike BTCSM, BTCSE, TCDMDS, and DCTMDS, MCPMDS has an asymmetry structure in which the methyl groups and the chloro groups surrounding Si are asymmetrically arranged in one molecule (in the chemical structural formula). As described above, in the present embodiment, it may be possible to use a precursor gas having an asymmetric chemical structural formula in addition to a precursor gas having a symmetric chemical structural formula as shown in FIGS. 14A to 14D.

The alkylene halosilane precursor gas such as the BTCSM gas or the BTCSE gas, and the alkyl halosilane precursor gas such as the TCDMDS gas, the DCTMDS gas, or the MCPMDS gas may be a precursor gases which contains at least two Si atoms in one molecule, contains C and Cl, and has Si—C bonds. In a substrate processing process, which will be described later, this gas acts as a Si source and a C source. The BTCSM gas or the BTCSE gas may be referred to as an alkylene chlorosilane precursor gas. The TCDMDS gas, the DCTMDS gas, and the MCPMDS gas may be referred to as an alkyl chlorosilane precursor gas.

In the subject specification, the precursor gas refers to a precursor in a gaseous state, for example, a gas obtained by vaporizing a precursor which is in a liquid state under room temperature and atmospheric pressure, or a precursor which stays in a gaseous state under room temperature and atmospheric pressure. When the term "precursor" is used herein, it may refer to "a liquid precursor staying in a liquid state," "a precursor gas staying in a gaseous state," or both. In case of using a liquid precursor staying in a liquid state under room temperature and atmospheric pressure, such as BTCSM or the like, the liquid precursor is vaporized by a vaporization system, such as a vaporizer or a bubbler, and is supplied as a precursor gas (a BTCSM gas or the like).

A reaction gas, e.g., a nitrogen (N)-containing gas, which differs in chemical structure (molecular structure) from the precursor gas, may be supplied from the gas supply pipe 232b into the process chamber 201 through the MFC 241b, the valve 243b, and the nozzle 249b. As the nitrogen-containing gas, it may be possible to use, e.g., a hydrogen nitride-based gas. The hydrogen nitride-based gas may be referred to as a substance consisting of only two elements N and H. In a substrate processing process, which will be described later, the nitrogen-containing gas acts as a nitriding gas, namely an N source. As the hydrogen nitride-based gas, it may be possible to use, e.g., an ammonia (NH$_3$) gas.

Alternatively, a reaction gas, e.g., an oxygen (O)-containing gas, which differs in chemical structure from the precursor gas, may be supplied from the gas supply pipe 232b into the process chamber 201 through the MFC 241b, the valve 243b, and the nozzle 249b. In a substrate processing process, which will be described later, the oxygen-containing gas acts as an oxidizing gas, namely an O source. As the oxygen-containing gas, it may be possible to use, e.g., an oxygen (O$_2$) gas.

Further alternatively, a reaction gas, e.g., an N- and C-containing gas, which differs in chemical structure from the precursor gas, may be supplied from the gas supply pipe 232b into the process chamber 201 through the MFC 241b, the valve 243b, and the nozzle 249b. As the N- and C-containing gas, it may be possible to use, e.g., an amine-based gas.

The amine-based gas is a gaseous amine gas, e.g., a gas which is obtained by vaporizing amine which is in a liquid state under room temperature and atmospheric pressure or a gas which contains an amine group such as amine or the like staying in a gaseous state under room temperature and atmospheric pressure. The amine-based gas contains amine such as ethylamine, methylamine, propylamine, isopropylamine, butylamine, isobutylamine, or the like. As used herein, the term "amine" is a generic name of compounds in which a hydrogen atom of ammonia (NH$_3$) is substituted with a hydrocarbon group such as an alkyl group or the like. Amine contains a hydrocarbon group such as an alkyl group or the like as a ligand containing C atoms, namely an organic ligand. The amine-based gas may be referred to as a Si-free gas since it contains three elements C, N, and H while not containing Si. The amine-based gas may be referred to as a Si-free and metal-free gas since it does not contain Si and metal. The amine-based gas may be a substance consisting of only three elements C, N and H. The amine-based gas acts as an N source and as a C source in a substrate processing procedure, which will be described later. The term "amine" as used herein refers to "amine in a liquid state," an "amine-based gas in a gaseous state," or both.

As the amine-based gas, it may be possible to use, e.g., a triethylamine ((C$_2$H$_5$)$_3$N, abbreviation: TEA) gas, in which the number of C-containing ligands (ethyl groups) in the chemical structural formula (in one molecule) is two or more and the number of C atoms in one molecule is larger than the number of N atoms. In the case of using amine such as TEA or the like which is in a liquid state under room temperature and atmospheric pressure, the amine in a liquid state is vaporized by a vaporization system such as a vaporizer or a bubbler, and is supplied as an N- and C-containing gas (a TEA gas).

A reaction gas, e.g., a borazine-ring-skeleton-free boron-containing gas, which differs in chemical structure from the precursor gas, may be supplied from the gas supply pipe 232b into the process chamber 201 through the MFC 241b, the valve 243b, and the nozzle 249b. As the borazine-ring-skeleton-free boron-containing gas, it may be possible to use, e.g., a borane-based gas.

The borane-based gas refers to a borane compound in a gaseous state, e.g., a gas obtained by vaporizing a borane compound in a liquid state under room temperature and atmospheric pressure, a borane compound in a gaseous state under room temperature and atmospheric pressure, or the like. The borane compound includes a haloborane compound containing B and a halogen element, e.g., a chloroborane compound containing B and Cl. Further, the borane compound includes borane (borohydride) such as monoborane ($BH_3$), diborane ($B_2H_6$) or the like, or a borane compound (borane derivative) in which H of borane is substituted with another element or the like. The borane-based gas acts as a B source in a substrate processing procedure, which will be described later. As the borane-based gas, it may be possible to use, e.g., a trichloroborane ($BCl_3$) gas. The $BCl_3$ gas is a boron-containing gas which does not contain a borazine compound, which will be described later, namely a non-borazine-based boron-containing gas.

In addition, a reaction gas, e.g., a borazine-ring-skeleton-containing gas, which differs in chemical structure from the precursor gas, may be supplied from the gas supply pipe 232b into the process chamber 201 through the MFC 241b, the valve 243b, and the nozzle 249b. As the borazine-ring-skeleton-containing gas, it may be possible to use, e.g., a gas containing a borazine ring skeleton and an organic ligand, namely an organic borazine-based gas.

As the organic borazine-based gas, it may be possible to use, e.g., a gas containing an alkyl borazine compound which is an organic borazine compound. The organic borazine-based gas may be referred to as a borazine compound gas or a borazine-based gas.

Figure 15A:
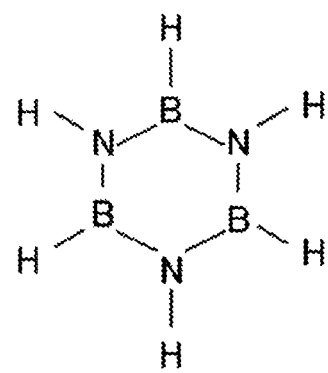
FIG. 15A is a view showing a chemical structural formula of borazine.
Figure 15B:
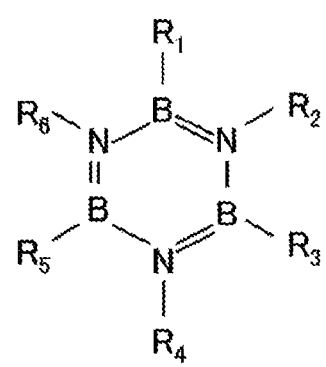
FIG. 15B is a view showing a chemical structural formula of a borazine compound.

As used herein, borazine is a heterocyclic compound composed of three elements, B, N and H. Borazine may be represented by a composition formula of $B_3H_6N_3$ and may be denoted as a chemical structural formula shown in FIG. 15A. A borazine compound is a compound which includes a borazine ring skeleton (also referred to as a "borazine skeleton") constituting a borazine ring containing three B atoms and three N atoms. The organic borazine compound is a borazine compound containing C, and may also be referred to as a borazine compound containing a C-containing ligand, namely an organic ligand. The alkyl borazine compound is a borazine compound containing an alkyl group and may be referred to as a borazine compound containing an alkyl group as an organic ligand. The alkyl borazine compound is a compound in which at least one of six H atoms contained in borazine is substituted with hydrocarbon containing one or more C atoms, and may be denoted as a chemical structural formula shown in FIG. 15B. In this case, each of $R_1$ to $R_6$ in the chemical structural formula shown in FIG. 15B is a H atom or an alkyl group containing one to four C atoms. $R_1$ to $R_6$ may be the same kind of alkyl group or may be different kinds of alkyl groups. However, not all of $R_1$ to $R_6$ should be H. The alkyl borazine compound may refer to a substance including a borazine ring skeleton, which constitutes a borazine ring, and contains B, N, H, and C. Further, the alkyl borazine compound may refer to a substance having a borazine ring skeleton and containing an alkyl ligand. In addition, each of $R_1$ to $R_6$ may be an H atom, or an alkenyl group or an alkynyl group containing one to four C atoms. $R_1$ to $R_6$ may be the same kind of an alkenyl group or an alkynyl group, or may be different kinds of alkenyl groups or alkynyl groups. However, not all of $R_1$ to $R_6$ should be H.

The borazine-based gas acts as a B source, an N source and a C source in a substrate processing procedure, which will be described later.

Figure 15C:
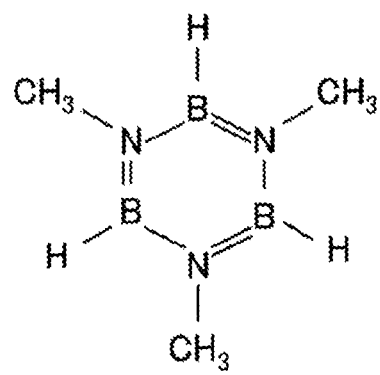
FIG. 15C is a view showing a chemical structural formula of n,n',n"-trimethylborazine.
Figure 15D:
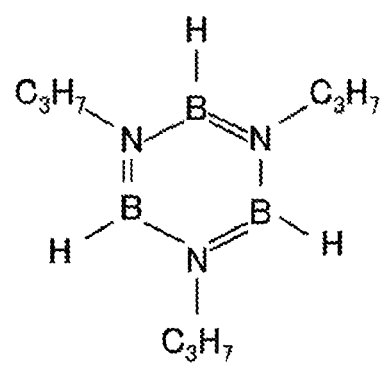
FIG. 15D is a view showing a chemical structural formula of n,n',n"-tri-n-propylborazine.

As the borazine-based gas, it may be possible to use, e.g., an n, n', n''-trimethylborazine (abbreviation: TMB) gas; an n, n', n''-triethylborazine (abbreviation: TEB) gas; an n, n', n''-tri-n-propylborazine (abbreviation: TPB) gas; an n, n', n''-triisopropylborazine (abbreviation: TIPB) gas; an n, n', n''-tri-n-butylborazine (abbreviation: TBB) gas; an n, n', n''-triisobutylborazine (abbreviation: TIBB) gas, or the like. TMB is a borazine compound in which $R_1$, $R_3$, and $R_5$ of the chemical structural formula shown in FIG. 15B are H atoms while $R_2$, $R_4$, and $R_6$ of the chemical structural formula are methyl groups. TMB may be denoted as a chemical structural formula shown in FIG. 15C. TEB is a borazine compound in which $R_1$, $R_3$, and $R_5$ of the chemical structural formula shown in FIG. 15B are H atoms while $R_2$, $R_4$, and $R_6$ of the chemical structural formula are ethyl groups. TPB is a borazine compound in which $R_1$, $R_3$, and $R_5$ of the chemical structural formula shown in FIG. 15B are H atoms while $R_2$, $R_4$, and $R_6$ of the chemical structural formula are propyl groups. TPB may be denoted as a chemical structural formula shown in FIG. 15D. TIPB is a borazine compound in which $R_1$, $R_3$, and $R_5$ of the chemical structural formula shown in FIG. 15B are H atoms while $R_2$, $R_4$, and $R_6$ of the chemical structural formula are isopropyl groups. TIBB is a borazine compound in which $R_1$, $R_3$, and $R_5$ of the chemical structural formula shown in FIG. 15B are H atoms while $R_2$, $R_4$, and $R_6$ of the chemical structural formula are isobutyl groups.

In the case of using a borazine compound such as TMB or the like, which is in a liquid state under room temperature and atmospheric pressure, the borazine compound in a liquid state is vaporized by a vaporization system such as a vaporizer or a bubbler, and is supplied as a borazine-based gas (e.g., a TMB gas).

A reaction gas, e.g., a carbon-containing gas, which differs in chemical structure from the precursor gas, may be supplied from the gas supply pipe 232c into the process chamber 201 through the MFC 241c, the valve 243c, the gas supply pipe 232b, and the nozzle 249b. As the carbon-containing gas, it may be possible to use, e.g., a hydrocarbon-based gas. The hydrocarbon-based gas may be referred to as a substance consisting of only two elements C and H. The hydrocarbon-based gas acts as a C source in a substrate processing procedure, which will be described later. As the hydrocarbon-based gas, it may be possible to use, e.g., a propylene ($C_3H_6$) gas.

An inert gas, e.g., a nitrogen ($N_2$) gas, is supplied from the gas supply pipes 232d to 232f into the process chamber 201 through the MFCs 241d to 241f, the valves 243d to 243f, the gas supply pipes 232a, 232b and 232d, the nozzles 249a, 249b and 249d, and the buffer chamber 237. The inert gas supplied through the gas supply pipes 232d to 232f acts as a purge gas or a carrier gas. Further, the inert gas supplied through the gas supply pipe 232d is plasma-excited within the buffer chamber 237 as will be described later. Thereafter, the plasma-excited inert gas is supplied into the process chamber 201 and is mixed with the reaction gas which is supplied into the process chamber 201. Thus, the inert gas acts as an exciting (activating) gas, i.e., a reaction promoting gas, which indirectly excites (activates) the reaction gas or activates the uppermost surface of each of the wafers 200.

In the case of supplying the aforementioned precursor gas from the gas supply pipe 232a, a precursor gas supply system includes the gas supply pipe 232a, the MFC 241a, and the valve 243a. The precursor gas supply system may include the nozzle 249a. The precursor gas supply system may be referred to as a precursor supply system. In the case of supplying an alkyl halosilane precursor gas from the gas supply pipe 232a, the precursor gas supply system may be referred to as an alkyl halosilane precursor gas supply system or an alkyl halosilane precursor supply system. In the case of supplying an alkylene halosilane precursor gas from the gas supply pipe 232a, the precursor gas supply system may be referred to as an alkylene halosilane precursor gas supply system or an alkylene halosilane precursor supply system.

In the case of supplying a nitrogen-containing gas from the gas supply pipe 232b, a nitrogen-containing gas supply system includes the gas supply pipe 232b, the MFC 241b, and the valve 243b. The nitrogen-containing gas supply system may also include the nozzle 249b. The nitrogen-containing gas supply system may be referred to as a nitriding gas supply system or a nitriding agent supply system. In the case of supplying a hydrogen nitride-based gas from the gas supply pipe 232b, the nitrogen-containing gas supply system may be referred to as a hydrogen nitride-based gas supply system or a hydrogen nitride supply system.

In the case of supplying an oxygen-containing gas from the gas supply pipe 232b, an oxygen-containing gas supply system includes the gas supply pipe 232b, the MFC 241b, and the valve 243b. The oxygen-containing gas supply system may also the nozzle 249b. The oxygen-containing gas supply system may be referred to as an oxidizing gas supply system or an oxidizing agent supply system.

In the case of supplying an N- and C-containing gas from the gas supply pipe 232b, a nitrogen- and carbon-containing gas supply system includes the gas supply pipe 232b, the MFC 241b and the valve 243b. The nitrogen- and carbon-containing gas supply system may also include the nozzle 249b. In the case of supplying an amine-based gas from the gas supply pipe 232b, the nitrogen- and carbon-containing gas supply system may be referred to as an amine-based gas supply system or an amine supply system. The N- and C-containing gas is a nitrogen-containing gas or a carbon-containing gas. Thus, a nitrogen-containing gas supply system or a carbon-containing gas supply system, which will be described later, may include the nitrogen- and carbon-containing gas supply system.

In the case of supplying a boron-containing gas from the gas supply pipe 232b, a boron-containing gas supply system includes the gas supply pipe 232b, the MFC 241b, and the valve 243b. The boron-containing gas supply system may also include the nozzle 249b. In the case of supplying a borane-based gas from the gas supply pipe 232b, the boron-containing gas supply system may be referred to as a borane-based gas supply system or a borane compound supply system. In the case of supplying a borazine-based gas from the gas supply pipe 232b, the boron-containing gas supply system may be referred to as a borazine-based gas supply system, an organic borazine-based gas supply system, or a borazine compound supply system. The borazine-based gas is an N- and C-containing gas, which is also a nitrogen-containing gas or a carbon-containing gas. Thus, a nitrogen- and carbon-containing gas supply system, a nitrogen-containing gas supply system or a carbon-containing gas supply system may include the borazine-based gas supply system.

In the case of supplying a carbon-containing gas from the gas supply pipe 232c, a carbon-containing gas supply system includes the gas supply pipe 232c, the MFC 241c, and the valve 243c. The carbon-containing gas supply system may also include the nozzle 249b disposed at a downstream side of a connection portion of the gas supply pipe 232b and the gas supply pipe 232c. In the case of supplying a hydrocarbon-based gas from the gas supply pipe 232c, the carbon-containing gas supply system may be referred to as a hydrocarbon-based gas supply system or a hydrocarbon supply system.

One or all of the nitrogen-containing gas supply system, the oxygen-containing gas supply system, the nitrogen- and carbon-containing gas supply system, the boron-containing gas supply system and the carbon-containing gas supply system may be referred to as a reaction gas supply system.

Furthermore, an inert gas supply system includes the gas supply pipes 232d to 232f, the MFCs 241d to 241f, and the valves 243d to 243f. The inert gas supply system may also include the downstream side of a connection portion where the gas supply pipe 232a is connected to the gas supply pipe 232e, the downstream side of a connection portion where the gas supply pipe 232b is connected to the gas supply pipe 232f, the nozzles 249a, 249b, and 249d, and the buffer chamber 237. The inert gas supply system may be referred to as a purge gas supply system or a carrier gas supply system. In the case of supplying a plasma-excited inert gas from the buffer chamber 237, the inert gas supply system including the gas supply pipe 232d, the MFC 241d, and the valve 243d may be referred to as an exciting (activating) gas supply system or a reaction promoting gas supply system. In this case, the nozzle 249d and the buffer chamber 237 may be included in the exciting gas supply system.

In the buffer chamber 237, as illustrated in FIG. 2, two rod-shaped electrodes 269 and 270, which are made of a conductor and have an elongated structure, are disposed along the stacking direction of the wafers 200 to span from the lower portion of the reaction tube 203 to the upper portion thereof. Each of the rod-shaped electrodes 269 and 270 is disposed parallel to the nozzle 249d. Each of the rod-shaped electrodes 269 and 270 is covered with and protected by an electrode protection tube 275 over a region spanning from an upper portion to a lower portion thereof. One of the rod-shaped electrodes 269 and 270 is connected to a high-frequency power source 273 via a matcher 272, and the other is connected to ground having a reference electric potential. By applying high-frequency (RF) power from the high-frequency power source 273 between the rod-shaped electrodes 269 and 270 via the matcher 272, plasma is generated in a plasma generation region 224 between the rod-shaped electrodes 269 and 270. A plasma source as a plasma generator (plasma generating unit) includes the rod-shaped electrodes 269 and 270 and the electrode protection tubes 275. The matcher 272 and the high-frequency power source 273 may also be included in the plasma source. As will be described later, the plasma source functions as an exciting unit (an activating mechanism) that plasma-excites gas, namely excites (activates) gas into a plasma state.

The electrode protection tube 275 has a structure in which each of the rod-shaped electrodes 269 and 270 can be inserted into the buffer chamber 237 while keeping each of the rod-shaped electrodes 269 and 270 isolated from an internal atmosphere of the buffer chamber 237. If an oxygen concentration within the electrode protection tube 275 is substantially equal to an oxygen concentration in ambient air (atmosphere), each of the rod-shaped electrodes 269 and 270 inserted into the electrode protection tubes 275 is oxidized by the heat generated from the heater 207. By charging the interior of the electrode protection tubes 275 with an inert gas such as a $N_2$ gas or the like, or by purging the interior of the electrode protection tubes 275 with an inert gas such as a $N_2$ gas or the like through the use of an inert gas purge mechanism, it is possible to reduce the oxygen concentration within the electrode protection tubes 275, thereby preventing oxidation of the rod-shaped electrodes 269 and 270.

An exhaust pipe 231 for exhausting an internal atmosphere of the process chamber 201 is connected to the reaction tube 203. A connection portion of the reaction tube 203 connected to the exhaust pipe 231 is configured as an exhaust port configured to exhaust the internal atmosphere of the process chamber 201. A vacuum exhaust device, e.g., a vacuum pump 246, is connected to the exhaust pipe 231 via a pressure sensor 245, which is a pressure detector (pressure detecting unit) for detecting an internal pressure of the process chamber 201, and an Auto Pressure Controller (APC) valve 244, which is a pressure regulator (pressure regulating unit). The APC valve 244 is configured to perform or stop vacuum exhaust in the process chamber 201 by opening or closing the valve while the vacuum pump 246 is actuated and is also configured to regulate the internal pressure of the process chamber 201 by adjusting an opening degree of the valve pursuant to pressure information detected by the pressure sensor 245 while the vacuum pump 246 is actuated. An exhaust system includes the exhaust pipe 231, the APC valve 244, and the pressure sensor 245. The vacuum pump 246 may be included in the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, e.g., stainless steel or the like, and is formed into a disc shape. An O-ring 220, which is a seal member making contact with the lower end portion of the reaction tube 203, is installed on an upper surface of the seal cap 219. A rotary mechanism 267 configured to rotate a boat 217, which will be described later is installed at a side of the seal cap 219 apposite to the process chamber 201. A rotary shaft 255 of the rotary mechanism 267, which penetrates through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. As such, the boat elevator 115 is configured as a transfer device (transfer mechanism) which transfers the boat 217, ultimately, the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction, with the centers of the wafers 200 concentrically aligned, to be spaced-apart from one another. The boat 217 is made of heat resistant material such as quartz or SiC. Heat insulating plates 218 made of heat resistant material such as quartz or SiC are installed below the boat 217 in a horizontal posture and in multiple stages. With this configuration, it is hard for heat generated from the heater 207 to be transferred to the seal cap 219. However, the present embodiment is not limited to the above-described configuration. For example, instead of installing the heat insulating plates 218 below the boat 217, a heat insulating tube as a tubular member made of heat resistant material such as quartz or SiC may be installed below the boat 217.

A temperature sensor 263 serving as a temperature detector is installed in the reaction tube 203. Based on temperature information detected by the temperature sensor 263, a state of supplying electronic power to the heater 207 is adjusted such that the interior of the process chamber 201 has a desired temperature distribution. Similar to the nozzles 249a, 249b, and 249d, the temperature sensor 263 is formed in an L-shape. The temperature sensor 263 is installed along the inner wall of the reaction tube 203.

Figure 3:
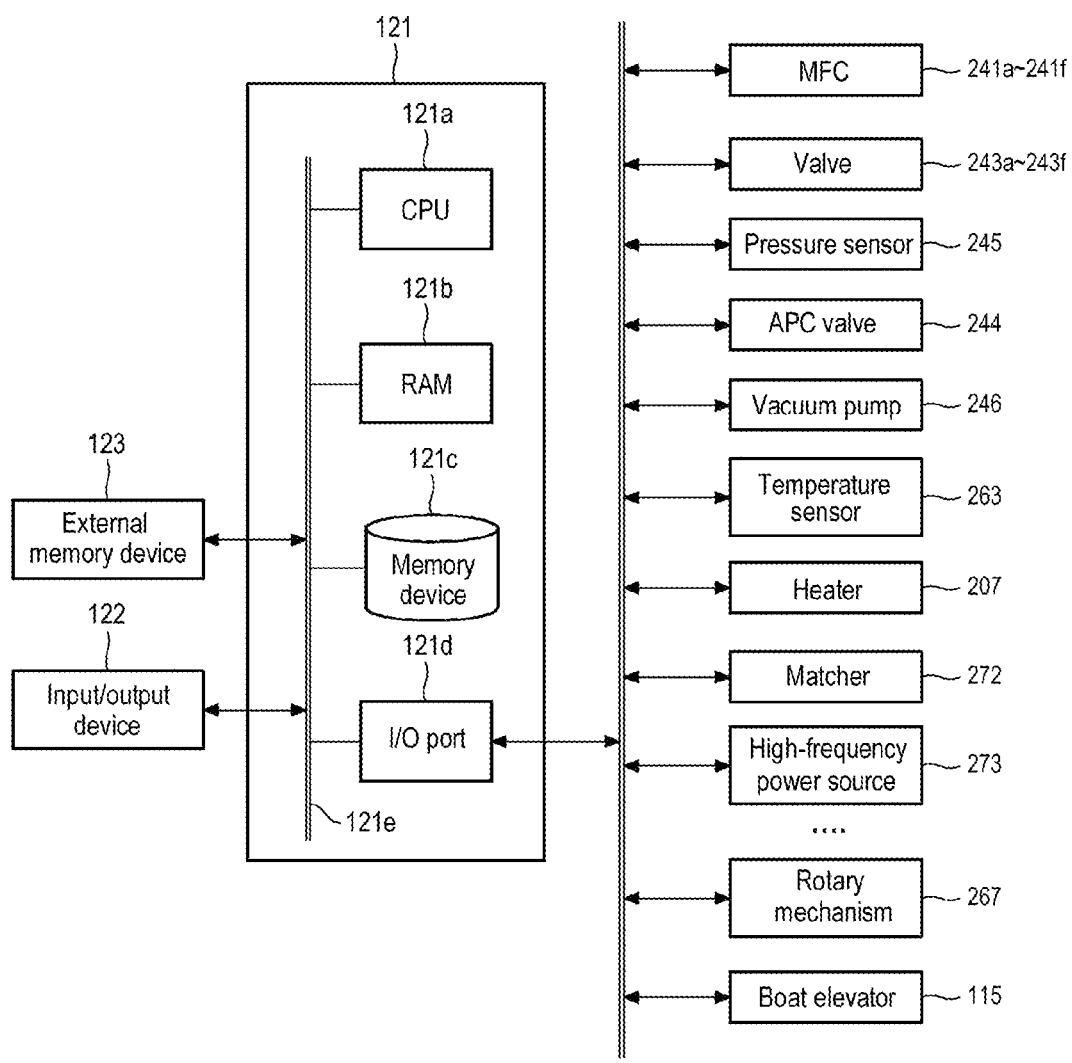
FIG. 3 is a schematic configuration view of a controller of the substrate processing apparatus suitably used in one embodiment of the present disclosure, in which a control system of the controller is shown in a block diagram.

As illustrated in FIG. 3, a controller 121, which is a control unit (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured with, for example, a flash memory, a hard disc drive (HDD), or the like. A control program for controlling operations of a substrate processing apparatus or a process recipe, in which a sequence or condition for processing a substrate to be described later is written, is readably stored in the memory device 121c. Also, the process recipe functions as a program for the controller 121 to execute each sequence in the substrate processing procedure, which will be described later, to obtain a predetermined result. Hereinafter, such a process recipe or control program may be generally referred to as "a program." Also, when the term "program" is used herein, it may indicate a case of including only a process recipe, a case of including only a control program, or a case of including both a process recipe and a control program. In addition, the RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the heater 207, the temperature sensor 263, the high-frequency power source 273, the matcher 272, the rotary mechanism 267, the boat elevator 115, and the like.

The CPU 121a is configured to read and execute the control program from the memory device 121c. The CPU 121a also reads the process recipe from the memory device 121c according to an input of an operation command from the input/output device 122. In addition, the CPU 121a is configured to control the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the start/stop operation of the vacuum pump 246, the temperature adjusting operation performed by the heater 207 based on the temperature sensor 263, the power supply operation of the high-frequency power source 273, the impedance adjusting operation performed by the matcher 272, the operation of rotating the boat 217 with the rotary mechanism 267 and adjusting the rotation speed of the boat 217, the operation of moving the boat 217 up and down with the boat elevator 115, and the like, according to contents of the read process recipe.

Moreover, the controller 121 is not limited to being configured as a dedicated computer but may be configured as a general-purpose computer. For example, the controller 121 according to the present embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, means for providing the program to the computer is not limited to the case in which the program is provided through the external memory device 123. For example, the program may be supplied using communication means such as the Internet or a dedicated line, rather than through the external memory device 123. Also, the memory device 121c or the external memory device 123 is configured as a non-transitory computer-readable recording medium. Hereinafter, the means for supplying the program will be simply referred to as a "recording medium." In addition, when the term "recording medium" is used herein, it may indicate a case of including only the memory device 121c, a case of including only the external memory device 123, or a case of including both the memory device 121c and the external memory device 123.

(2) Substrate Processing Process

An example of a procedure for forming a thin film on a substrate, which is one of the procedures for manufacturing a semiconductor device by using the above described substrate processing apparatus, is described below with reference to FIG. 4. In the following descriptions, the operations of the respective units or parts constituting the substrate processing apparatus are controlled by the controller 121.

Figure 4:
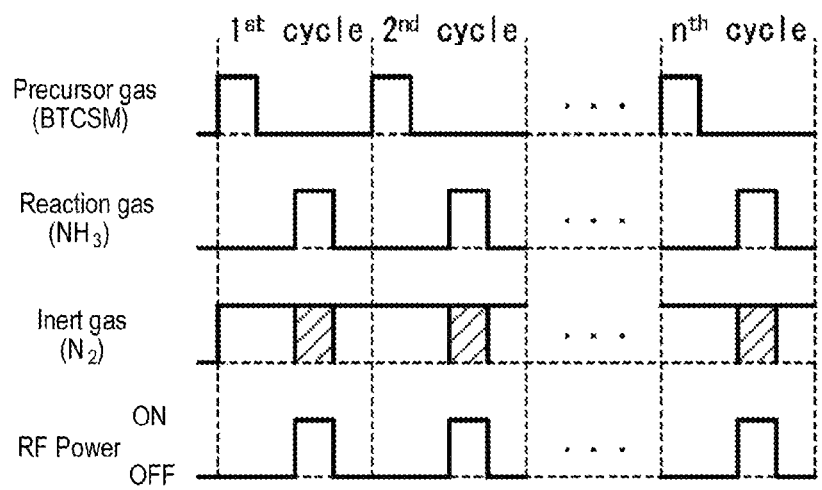
FIG. 4 is a view illustrating gas supply and plasma power supply timings in a film forming sequence according to one embodiment of the present disclosure.

In a film forming sequence shown in FIG. 4, a silicon carbonitride film (SiCN film) as a film containing Si, N, and C is formed on a wafer 200 by performing, a predetermined number of times (n times), a cycle that non-simultaneously (without synchronization) performs a step of forming a first layer containing Si and C by supplying a BTCSM gas as a precursor gas having a Si—C bond from the nozzle 249a as a first supply part to the wafer 200 as a substrate disposed in the process chamber 201; and a step of forming a second layer by supplying a NH₃ gas as a reaction gas containing N from the nozzle 249b as a second supply part to the wafer 200 in the process chamber 201 and supplying a plasma-excited N₂ gas as a plasma-excited inert gas from the buffer chamber 237 as a third supply part differing from the nozzle 249b to the wafer 200 in the process chamber 201 by modifying the first layer.

In the step of forming the second layer, the NH₃ gas not excited with plasma, namely the thermally-excited NH₃ gas, and the plasma-excited N₂ gas may be mixed (post-mixed) within the process chamber 201. Thus, the thermally-excited NH₃ gas may be further excited (activated) by the plasma-excited N₂ gas. The hatchings indicated in FIG. 4 may mean that the N₂ gas is supplied in a plasma-excited state, and which may also apply in FIGS. 5 to 13.

As used herein, the phrase "performing a cycle a predetermined number of times" means that the cycle is performed once or a plurality of times. That is to say, the phrase may also mean that the cycle is performed one or more times. FIG. 4 illustrates an example in which the cycle is repeated n times.

As used herein, the term "wafer" may refer to "a wafer itself" or "a wafer and a laminated body (a collected body) of predetermined layers or films formed on a surface of the wafer" (i.e., a wafer including predetermined layers or films formed on its surface may be referred to as a wafer). In addition, as used herein, the phrase "a surface of a wafer" may refer to "a surface (exposed surface) of a wafer itself" or "a surface of a predetermined layer or film formed on a wafer, namely an uppermost surface of the wafer, which is a laminated body".

As such, as used herein, the phrase "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the phrase "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" as used herein may be synonymous with the term "wafer." In this case, the term "wafer" and "substrate" may be used interchangeably in the above descriptions.

(Wafer Charging and Boat Loading)

When the plurality of wafers 200 is charged on the boat 217 (wafer charging) as illustrated in FIG. 1, the boat 217 charged with the plurality of wafers 200 is lifted up by the boat elevator 115 and is loaded into the process chamber 201 (boat loading). In this state, the seal cap 219 seals the lower end of the reaction tube 203 through the O-ring 220.

(Pressure Regulation and Temperature Adjustment)

An internal pressure of the process chamber 201, namely the space in which the wafers 200 exist is vacuum-exhausted (pressure-reducing exhaust) by the vacuum pump 246 to reach a desired pressure (desired vacuum level). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 reaches a desired temperature distribution. In addition, the heating of the interior of the process chamber 201 by the heater 207 may be continuously performed at least until the processing of the wafers 200 is completed. The boat 217 and the wafers 200 begin to be rotated by the rotary mechanism 267. The rotation of the boat 217 and the wafers 200 by the rotary mechanism 267 may be continuously performed at least until the processing of the wafers 200 is completed.

(SiCN Film Forming Process)

Next, the following two steps, i.e., Steps 1 and 2, are sequentially performed.

[Step 1]

(BTCSM Gas Supply)

The valve 243a is opened to flow a BTCSM gas through the gas supply pipe 232a. The BTCSM gas is flow rate-adjusted by the MFC 241a. The BTCSM gas is supplied from the gas supply holes 250a into the process chamber 201 and is exhausted from the exhaust pipe 231. At this time, the BTCSM gas is supplied to the wafer 200. At the same time, the valve 243e is opened to flow a N₂ gas through the gas supply pipe 232e. The N₂ gas is flow rate-adjusted by the MFC 241e. The flow rate-adjusted N₂ gas is supplied into the process chamber 201 together with the BTCSM gas and is exhausted from the exhaust pipe 231.

In order to prevent the BTCSM gas from infiltrating into the nozzle 249b and the buffer chamber 237, the valves 243f and 243d are opened to flow the N₂ gas through the gas supply pipes 232f and 232d. The N₂ gas is supplied into the process chamber 201 through the gas supply pipe 232b, the nozzles 249b and 249d, and the buffer chamber 237 and is exhausted from the exhaust pipe 231.

In this operation, the APC valve 244 is appropriately adjusted such that the internal pressure of the process chamber 201 falls within a range of, e.g., 1 to 2,666 Pa, specifically, 67 to 1,333 Pa. A supply flow rate of the BTCSM gas controlled by the MFC 241a is set to fall within a range of, e.g., 1 to 2,000 sccm, specifically, 10 to 1,000 sccm. Each of supply flow rates of the $N_2$ gas controlled by the MFCs 241d and 241f is set to fall within a range of, e.g., 100 to 10,000 sccm. A time period for supplying the BTCSM gas into the process chamber 201, namely the gas supply time (irradiation time) in which the BTCSM gas is supplied to the wafer 200, is set to fall within a range of, e.g., 1 to 120 seconds, specifically, 1 to 60 seconds. The temperature of the heater 207 is set such that the temperature of the wafer 200 falls within a range of, e.g., room temperature or more and 800 degrees C. or less, specifically, 400 degrees C. or more and 800 degrees C. or less, more specifically, 500 degrees C. or more and 700 degrees C. or less, or still more specifically, 600 degrees C. or more and 700 degrees C. or less.

If the temperature of the wafer 200 is lower than room temperature, BTCSM is hard to be physically adsorbed onto the wafer 200, eventually making it impossible to obtain a practical deposition rate. This problem can be solved by setting the temperature of the wafer 200 at a temperature equal to or more than room temperature. By setting the temperature of the wafer 200 at 400 degrees C. or more, it becomes possible to have BTCSM adsorbed onto the wafer 200 to thereby increase the deposition rate. By setting the temperature of the wafer 200 at 500 degrees C. or more, it becomes possible to have BTCSM sufficiently adsorbed onto the wafer 200 to thereby obtain a sufficient deposition rate. By setting the temperature of the wafer 200 at 600 degrees C. or more, specifically, at 650 degrees C. or more, it becomes possible to have BTCSM further sufficiently adsorbed onto the wafer 200 to thereby obtain a further sufficient deposition rate.

If the temperature of the wafer 200 exceeds 800 degrees C., a CVD reaction may be made too strong (an excessive gas phase reaction may be generated). In this case, the film thickness uniformity may be hard to control and often deteriorate. By setting the temperature of the wafer 200 at 800 degrees C. or less, a suitable gas phase reaction may be generated. In this way, the deterioration of the film thickness uniformity can be suppressed, and thus the film thickness uniformity can be controlled. In particular, if the temperature of the wafer 200 is set at 700 degrees C. or less, the surface reaction becomes more dominant than the gas phase reaction. Thus, it becomes possible to secure the film thickness uniformity and control the film thickness uniformity.

Accordingly, the temperature of the wafer 200 may be set to fall within a range of room temperature or more and 800 degrees C. or less, specifically, 400 degrees C. or more and 800 degrees C. or less, more specifically, 500 degrees C. or more and 700 degrees C. or less, or still more specifically, 600 degrees C. or more and 700 degrees C. or less. The BTCSM gas is low in degradability (low in reactivity) and a pyrolysis temperature of the BTCSM gas is high. Therefore, even if a film is formed in a relatively-high temperature zone of, e.g., 650 to 800 degrees C., it is possible to generate a suitable gas phase reaction. Thus, it becomes possible to suppress generation of an excessive gas phase reaction and suppress resultant generation of particles.

By supplying the BTCSM gas to the wafer 200 under the aforementioned conditions, a first layer, e.g., a Si-containing layer containing C and Cl and having a thickness of one atomic layer or less to several atomic layers, is formed on the wafer 200 (on a base film of the surface of the wafer 200). The Si-containing layer containing C and Cl may become a layer which includes a Si—C bond. The Si-containing layer containing C and Cl may be a Si layer, an adsorption layer of BTCSM, or both.

The Si-containing layer containing C and Cl is a generic name that encompasses a continuous or discontinuous layer containing C and Cl, which is composed of Si, and a Si thin film containing C and Cl, which is formed of the layers overlapping with one another. The continuous layer containing C and Cl, which is composed of Si, is sometimes referred to as a Si thin film containing C and Cl. The Si which constitutes the Si layer containing C and Cl includes not only Si whose bond to C or Cl is not completely broken, but also Si whose bond to C or Cl is completely broken.

The adsorption layer of BTCSM includes a continuous adsorption layer composed of BTCSM molecules and a discontinuous adsorption layer composed of BTCSM molecules. That is to say, the adsorption layer of BTCSM includes an adsorption layer having a thickness of one molecular layer or less, which is composed of BTCSM molecules. The BTCSM molecules that constitute the adsorption layer of BTCSM include a BTCSM molecule in which a part of bonds of Si and C is broken and a BTCSM molecule in which a part of bonds of Si and Cl is broken. In other words, the adsorption layer of BTCSM may be a physical adsorption layer of BTCSM, a chemisorption layer of BTCSM, or both.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The silicon-containing layer containing C and Cl may include both a Si layer containing C and Cl and an adsorption layer of BTCSM. As described above, expressions such as "one atomic layer", "several atomic layers" and the like will be used with respect to the Si-containing layer containing C and Cl.

Under a condition in which the BTCSM gas is autolyzed (or pyrolyzed), i.e., a condition in which a pyrolysis reaction of the BTCSM gas is generated, Si is deposited on the wafer 200 to form the Si layer containing C and Cl. Under a condition in which the BTCSM gas is not autolyzed (or pyrolyzed), i.e., a condition in which a pyrolysis reaction of the BTCSM gas is not generated, BTCSM is adsorbed onto the wafer 200 to form an adsorption layer of BTCSM. In either condition, at least a part of the Si—C bonds of the BTCSM gas is maintained without being broken and is directly introduced into the Si-containing layer containing C and Cl (the Si layer containing C and Cl or the adsorption layer of BTCSM). For example, even if one Si—C bond of an Si—C—Si bond of the BTCSM gas is broken, the other Si—C bond is maintained without being broken and is directly introduced into the Si layer containing C and Cl. From the viewpoint of increasing the deposition rate, it may be advantageous to form the Si layer containing C and Cl on the wafer 200 than to form the adsorption layer of BTCSM on the wafer 200.

If the thickness of the first layer formed on the wafer 200 exceeds several atomic layers, a modifying reaction at Step 2, which will be described later, does not affect the entire first layer. In addition, a minimum value of the thickness of the first layer to be formed on the wafer 200 is less than one atomic layer. Accordingly, the thickness of the first layer may be set to fall within a range of less than one atomic layer to several atomic layers. By setting the thickness of the first layer equal to or less than one atomic layer, i.e., at one atomic layer or less than, it is possible to relatively increase the action of the modifying reaction at Step 2, which will be described later, and to shorten the time required in the modifying reaction at Step 2. It is also possible to shorten the time required in forming the first layer at Step 1. As a result, a processing time per cycle can be shortened, and a total processing time can also be shortened. That is to say, the deposition rate can be increased. In addition, if the thickness of the first layer is set at one atomic layer or less, it is possible to improve the controllability of the film thickness uniformity.

(Residual Gas Removal)

After the first layer is formed, the valve 243a is closed to stop the supply of the BTCSM gas. Further, the APC valve 244 is opened and the interior of the process chamber 201 is evacuated by the vacuum pump 246. The BTCSM gas, which has not reacted or remains after contribution to the formation of the first layer, remaining within the process chamber 201, is removed from the interior of the process chamber 201. At this time, the valves 243d to 243f are opened to supply the $N_2$ gas into the process chamber 201. The $N_2$ gas acts as a purge gas. This makes it possible to effectively remove the BTCSM gas, which has not reacted or remains after contribution to the formation of the first layer, remaining within the process chamber 201 from the interior of the process chamber 201.

In this operation, the gas remaining within the process chamber 201 may not be completely removed and the interior of the process chamber 201 may not be completely purged. If the amount of the gas remaining within the process chamber 201 is small, an adverse effect may not be generated at Step 2, which will be subsequently performed. The flow rate of the $N_2$ gas supplied into the process chamber 201 need not be made large. For example, an amount of the $N_2$ gas to be supplied into the process chamber 201 may be substantially equal to the volume of the reaction tube 203 (the process chamber 201) such that a purge operation is performed without causing an adverse effect at Step 2. As such, by not completely purging the interior of the process chamber 201, it is possible to shorten the purge time and to improve the throughput. It is also possible to suppress the consumption of the $N_2$ gas to a necessary minimum level.

As the precursor gas, in addition to the BTCSM gas, it is possible to use, e.g., a BTCSE gas, a TCDMDS gas, a DCTMDS gas or an MCPMDS gas. As the inert gas, in addition to the $N_2$ gas, it is possible to use, e.g., a rare gas such as an Ar gas, a He gas, a Ne gas, a Xe gas or the like.

[Step 2]

($NH_3$ Gas and Plasma-Excited $N_2$ Gas Supply)

After Step 1 is completed, a $NH_3$ gas is supplied from the nozzle 249b and a plasma-excited $N_2$ gas is supplied from the buffer chamber 237.

At this step, the $NH_3$ gas flows through the gas supply pipe 232b. The opening/closing control of the valves 243b and 243d to 243f are executed in the same or similar manner as the opening/closing control of the valves 243a and 243d to 243f executed at Step 1. High-frequency power is applied between the rod-shaped electrodes 269 and 270, thereby plasma-exciting the $N_2$ gas supplied into the buffer chamber 237.

At this operation, a supply flow rate of the $NH_3$ gas is controlled by the MFC 241b and set to fall within a range of, e.g., 100 to 10,000 sccm. A supply flow rate of the $N_2$ gas controlled by the MFC 241d is set to fall within a range of, e.g., 100 to 10,000 sccm. Each of supply flow rates of the $N_2$ gas controlled by the MFCs 241e and 241f is set to fall within a range of, e.g., 100 to 10,000 sccm. The high-frequency power applied between the rod-shaped electrodes 269 and 270 is set at electric power which falls within a range of, e.g., 50 to 1,000 W. An internal pressure of the process chamber 201 is set to fall within a range of, e.g., 1 to 4,000 Pa, specifically, 1 to 3,000 Pa. A partial pressure of the $NH_3$ gas within the process chamber 201 is set to fall within a range of, e.g., 0.01 to 3,960 Pa, specifically, 0.01 to 2,970 Pa. The time period in which the $NH_3$ gas is supplied to the wafer 200, namely the gas supply time (irradiation time), is set to fall within a range of, e.g., 1 to 120 seconds, specifically, 1 to 60 seconds. Other processing conditions may be the same or similar to the processing conditions of Step 1 described above.

The $NH_3$ gas supplied from the nozzle 249b into the process chamber 201 moves toward the center of the wafer 200. At this time, the $NH_3$ gas is thermally excited (activated), whereby excited species of the $NH_3$ gas are generated within the process chamber 201. That is to say, the $NH_3$ gas can be thermally excited during the course of supplying the $NH_3$ gas to the wafer 200 disposed within the process chamber 201 through the nozzle 249b.

The plasma-excited $N_2$ gas supplied from the buffer chamber 237 into the process chamber 201 moves toward the center of the wafer 200 while getting deactivated. At this time, the plasma-excited $N_2$ gas moves toward the center of the wafer 200 while breaking Si—Cl bonds contained in the first layer and forming dangling bonds on the surface of the first layer. That is to say, the plasma-excited $N_2$ gas moves toward the center of the wafer 200 while activating the surface of the first layer. Since the wafer 200 is rotated during this time, the activation of the surface of the first layer by the plasma-excited $N_2$ gas is substantially uniformly performed over the plane of the wafer 200.

The thermally-excited $NH_3$ gas and the plasma-excited $N_2$ gas are mixed with each other during the course of their movement toward the center of the wafer 200. Thus, the thermally-excited $NH_3$ gas is further excited (activated), whereby a larger amount of excited species is generated within the process chamber 201. By arranging the nozzle 249b and the buffer chamber 237 as illustrated in FIG. 2, the mixing point of the thermally-excited $NH_3$ gas and the plasma-excited $N_2$ gas exists within the plane of the wafer 200. That is to say, these gases are mixed with each other within the plane of the wafer 200. In other words, the thermally-excited $NH_3$ gas is further excited within the plane of the wafer 200. Thus, the $NH_3$ gas excited by the mixture with the plasma-excited $N_2$ gas is efficiently supplied to the uppermost surface of the wafer 200, i.e., the first layer. Since the wafer 200 is rotated during this time, the $NH_3$ gas indirectly excited by the plasma-excited $N_2$ gas is substantially uniformly supplied over the plane of the wafer 200.

The amount of excited species contained in the $NH_3$ gas excited by the mixture with the plasma-excited $N_2$ gas is larger than the amount of excited species contained in the $NH_3$ gas thermally excited under a non-plasma condition and is smaller than the amount of excited species contained in the $NH_3$ gas directly excited with plasma. Furthermore, the energy of excited species contained in the $NH_3$ gas excited by the mixture with the plasma-excited $N_2$ gas is stronger than the energy of excited species contained in the $NH_3$ gas thermally excited under a non-plasma condition and is weaker than the energy of excited species contained in the $NH_3$ gas directly excited with plasma. That is to say, by indirectly exciting the $NH_3$ gas with the plasma-excited $N_2$ gas, it is possible to allow the gas to be in an intermediate excitation state which is between an excitation state available when the $NH_3$ gas is directly excited with plasma and an excitation state available when the $NH_3$ gas is thermally excited.

By allowing the $NH_3$ gas in the intermediate excitation state as described above, namely by appropriately increasing the nitriding power of the $NH_3$ gas, it becomes possible to appropriately nitride (modify) the first layer even in a low temperature zone. For example, even in a low temperature zone ranging from room temperature to 400 degrees C., it is possible to nitride at least a portion of the first layer. As the first layer is nitrided, a second layer containing Si, C and N, namely a SiCN layer, is formed on the wafer 200. Not only by appropriately increasing the nitriding power of the $NH_3$ gas but also by activating the surface of the first layer with the plasma-excited $N_2$ gas, it is possible to further promote the nitriding of the first layer.

By allowing the $NH_3$ gas in the intermediate excitation state as described above, namely by appropriately reducing the nitriding power of the $NH_3$ gas, it becomes possible to softly perform the aforementioned nitriding procedure. For example, when forming the second layer by nitriding the first layer, at least a part of Si—C bonds contained in the first layer can be directly introduced (or remained) into the second layer under a condition in which the at least a part of Si—C bonds is maintained without being broken. Thus, the second layer becomes a layer which is larger in the percentage of the Si—C bonds than a layer formed under a condition in which the Si—C bonds contained in the first layer are easily broken due to, e.g., the direct excitation of the $NH_3$ gas with plasma. As a result, the second layer becomes a stable layer which contains a larger amount of strong Si—C bonds. Since the percentage of Si—C bonds contained in the layer is large, the second layer becomes a layer having a low probability of desorption of C.

When forming the second layer, the impurities such as Cl and the like contained in the first layer may become a gaseous substance containing at least Cl, during the course of the modifying reaction by the indirectly-excited $NH_3$ gas and during the course of activation of the first layer by the plasma-excited $N_2$ gas. The gaseous substance is discharged from the interior of the process chamber 201. That is to say, the impurities such as Cl and the like contained in the first layer are extracted or desorbed from the first layer and are eventually separated from the first layer. As such, the second layer becomes a layer having a smaller amount of impurities such as Cl and the like than the first layer.

(Residual Gas Removal)

After the second layer is formed, the valve 243b is closed to stop the supply of the $NH_3$ gas. Furthermore, the application of the high-frequency power between the rod-shaped electrodes 269 and 270 is stopped and the supply of the plasma-excited $N_2$ gas is stopped. Then, with similar processing procedures to those of Step 1, it is possible to remove the $NH_3$ gas, which has not reacted or remains after contribution to the formation of the second layer, or the reaction byproduct, remaining within the process chamber 201 from the interior of the process chamber 201. Similar to Step 1, the gas remaining within the process chamber 201 may not be completely removed.

As the nitrogen-containing gas (nitriding gas) used as the reaction gas, in addition to the $NH_3$ gas, it is possible to use, e.g., a hydrogen nitride-based gas such as a diazene ($N_2H_2$) gas, a hydrazine ($N_2H_4$) gas, an $N_3H_8$ gas or the like, or a gas containing these compounds. As the inert gas, in addition to the $N_2$ gas, it is possible to use, e.g., a rare gas such as an Ar gas, a He gas, a Ne gas, a Xe gas, or the like.

(Performing a Cycle a Predetermined Number of Times)

A cycle which non-simultaneously performs Steps 1 and 2 as described above one or more times (a predetermined number of times) to form a SiCN film having a predetermined composition and a predetermined thickness on the wafer 200 may be repeated multiple times. As such, a thickness of the SiCN layer formed per one cycle is set to be smaller than a desired film thickness and the above cycle may be repeated multiple times until the desired film thickness is obtained.

In the configuration in which the cycle is performed multiple times, the phrase "a predetermined gas is supplied to the wafer 200" at each step in at least a second cycle or subsequent cycles may mean that "a predetermined gas is supplied to a layer formed on the wafer 200, namely on the uppermost surface of the wafer 200 as a laminated body." The phrase "a predetermined layer is formed on the wafer 200" may mean that "a predetermined layer is formed on a layer formed on the wafer 200, namely on the uppermost surface of the wafer 200 as a laminated body." The above definitions are the same as those described above. These definitions also apply to each of modifications and other embodiments, which will be described later.

(Purge and Return to Atmospheric Pressure)

The valves 243d to 243f are opened. The $N_2$ gas is supplied into the process chamber 201 from each of the gas supply pipes 232d to 232f, and is exhausted through the exhaust pipe 231. The $N_2$ gas serves as a purge gas. Thus, the interior of the process chamber 201 is purged, and residual gas or the reaction byproduct remaining within the process chamber 201 is removed from the interior of the process chamber 201 (purge). Thereafter, the internal atmosphere of the process chamber 201 is substituted with an inert gas (inert gas substitution), and the internal pressure of the process chamber 201 is returned to atmospheric pressure (return to atmospheric pressure).

(Boat Unloading and Wafer Discharge)

The seal cap 219 is moved down by the boat elevator 115 to open the lower end of the reaction tube 203. The processed wafers 200 supported by the boat 217 are unloaded from the lower end of the reaction tube 203 outside of the reaction tube 203 (boat unloading). Thereafter, the processed wafers 200 are discharged from the boat 217 (wafer discharge).

(3) Effects According to the Present Embodiment

According to the present embodiment, one or more effects may be achieved, as follows.

(a) By supplying the $NH_3$ gas from the nozzle 249b and supplying the plasma-excited $N_2$ gas from the buffer chamber 237, the thermally-excited $NH_3$ gas can be further excited by the plasma-excited $N_2$ gas. The amount (energy) of excited species contained in the $NH_3$ gas excited by the mixture with the plasma-excited $N_2$ gas is larger than the amount (energy) of excited species contained in the $NH_3$ gas thermally excited under a non-plasma condition. That is to say, by exciting the $NH_3$ gas at multiple stages, it becomes possible to appropriately increase the nitriding power of the $NH_3$ gas. This makes it possible to perform the nitriding of the first layer even in a low temperature zone of, e.g., from room temperature to 400 degrees C. For example, at step 1, even if the first layer is formed under a low temperature condition in which the chemisorption of BTCSM is not generated, namely even if a physical adsorption layer of BTCSM is formed as the first layer, it is possible to appropriately nitride the first layer and to modify the first layer into a SiCN layer having strong bonds. That is to say, even in the low temperature zone, it becomes possible to appropriately perform a film forming process of a SiCN film and to expand a process window of a film forming process.

(b) By supplying the $NH_3$ gas from the nozzle 249b and supplying the plasma-excited $N_2$ gas from the buffer chamber 237, the surface of the first layer can be activated by the plasma-excited $N_2$ gas. By activating the surface of the first layer, it is possible to appropriately promote the nitriding of the first layer by the $NH_3$ gas. This makes it possible to increase the formation rate of the second layer, namely the deposition rate of the SiCN film. That is to say, in the present embodiment, there is used not only the action of the $NH_3$ gas whose nitriding power is increased by the multi-stage excitation but also the action of the plasma-excited $N_2$ gas. Due to the synergistic effect of these actions, it becomes possible to efficiently perform the nitriding of the first layer even in a low temperature zone of, e.g., from room temperature to 400 degrees C.

(c) By mixing the thermally-excited $NH_3$ gas and the plasma-excited $N_2$ gas within the plane of the wafer 200, namely by allowing the mixing point of these gases to exist within the plane of the wafer 200, it is possible to efficiently supply the $NH_3$ gas excited by the mixture with the plasma-excited $N_2$ gas, namely the excited species contained in the $NH_3$ gas, to the surface of the wafer 200. This makes it possible to efficiently perform the nitriding of the first layer and to increase the deposition rate of the SiCN film.

In the present embodiment, there is used the processing furnace configured such that, when seen in a plane view, a perpendicular bisector of a straight line interconnecting each of the gas supply holes 250b of the nozzle 249b and each of the gas supply holes 250e of the buffer chamber 237 passes through the center of the wafer 200 carried into the process chamber 201. This makes it easy to have the aforementioned mixing point exist within the plane of the wafer 200. Furthermore, the use of this processing furnace makes it easy to uniformly supply the thermally-excited $NH_3$ gas and the plasma-excited $N_2$ gas to the wafer 200. Moreover, it is easy to control the position of the aforementioned mixing point within the plane of the wafer 200. By adjusting the position of the mixing point, it becomes easy to control the thickness uniformity and the quality uniformity of the SiCN film within the plane of the wafer 200.

By disposing the gas supply holes 250b and 250e and the exhaust pipe 231 such that the perpendicular bisector mentioned above passes through the center of the exhaust port, it becomes easier to have the aforementioned mixing point exist within the plane of the wafer 200. Furthermore, the use of this processing furnace makes it easier to uniformly supply the thermally-excited $NH_3$ gas and the plasma-excited $N_2$ gas to the wafer 200. Moreover, it is easier to control the position of the aforementioned mixing point within the plane of the wafer 200. By adjusting the position of the mixing point, it becomes easier to control the thickness uniformity and the quality uniformity of the SiCN film within the plane of the wafer 200.

(d) By supplying the indirectly-excited $NH_3$ gas and the plasma-excited $N_2$ gas to the first layer, it is possible to urge desorption of the impurities such as Cl and the like from the first layer. As a result, it becomes possible to reduce the impurity concentration in the SiCN film. Consequently, the SiCN film can be made of a film having a high resistance to hydrogen fluoride (HF).

(e) The amount (energy) of excited species contained in the $NH_3$ gas excited by the mixture with the plasma-excited $N_2$ gas is smaller than the amount (energy) of excited species contained in the $NH_3$ gas directly excited with plasma. That is to say, by indirectly exciting the $NH_3$ gas rather than directly exciting the $NH_3$ gas with plasma, it is possible to appropriately suppress the nitriding power of the $NH_3$ gas. By appropriately suppressing the nitriding power of the $NH_3$ gas in this way, it becomes possible to suppress breakage of the Si—C bonds contained in the first layer and to suppress desorption of C from the first layer. By performing the formation of the second film under a condition in which at least a part of the Si—C bonds contained in the first layer is maintained without being broken, it becomes possible to suppress reduction of the Si—C bonds in the first layer and to suppress desorption of C from the first layer. As a result, the finally-formed SiCN film can be made a stable film which contains a larger amount of strong Si—C bonds. Furthermore, the finally-formed SiCN film can be made a film which has a low probability of desorption of C and which contains C at a high concentration with high controllability. Consequently, the SiCN film can be made of a film having a high HF resistance.

(f) By using an inert gas such as a $N_2$ gas or the like as a gas which is plasma-excited within the buffer chamber 237, it is possible to appropriately control the activation degree of the indirectly excited $NH_3$ gas, namely the nitriding power of the $NH_3$ gas. The reasons are as follows. An inert gas such as a $N_2$ gas or the like has a short time period during which the inert gas exists as plasma, namely a short plasma lifespan. Thus, the inert gas is excited within the buffer chamber 237 and is deactivated while moving toward the center of the wafer 200. Consequently, it is possible to appropriately control the amount of the $N_2$ gas mixed with the $NH_3$ gas in a plasma state. This makes it possible to restrain the $NH_3$ gas from being excessively activated. As a result, it is possible to softly perform the nitriding as described above. By appropriately controlling the amount of the $N_2$ gas supplied to the wafer 200 in a plasma state and by restraining the $NH_3$ gas from being excessively activated, it is possible to reduce plasma damage suffered by the wafer 200 or the SiCN film formed on the wafer 200.

As the gas to be plasma-excited within the buffer chamber 237, in addition to the $N_2$ gas, it may be possible to use a rare gas such as an Ar gas, a He gas or the like. In this regard, the energy when the gas is kept in a plasma state grows larger in the order of the Ar gas, the $N_2$ gas and the He gas, namely in the order of the mass number (the energy of the Ar gas is largest and the energy of the He gas is smallest). Furthermore, the plasma lifespan grows longer in the order of the Ar gas, the $N_2$ gas and the He gas (the plasma lifespan of the Ar gas is longest and the plasma lifespan of the He gas is shortest). Using these natures of the gases, if the kind of the gas to be plasma-excited within the buffer chamber 237 is properly selected or if the gases are used by mixing them at a predetermined ratio, it is possible to appropriately control the activation degree of the $NH_3$ gas which is indirectly excited by the plasma-excited inert gas. Even when one of the aforementioned gases is used as the gas to be plasma-excited within the buffer chamber 237, the plasma lifespan becomes sufficiently short. Therefore, for example, even if the Ar gas having the largest energy and the longest plasma lifespan is used as the gas to be plasma-excited within the buffer chamber 237, it is possible to appropriately suppress the activation degree of the indirectly-excited NH$_3$ gas or the activation degree of the surface of the first layer by the plasma-excited Ar gas. This makes it possible to softly perform the nitriding as mentioned above.

(g) By using the halosilane precursor gas such as the BTCSM gas or the like containing a plurality of halogen elements (Cl) in one molecule, it becomes possible to efficiently form the first layer and to increase the deposition rate of the SiCN film. Furthermore, it is possible to reduce the consumption amount of the BTCSM gas that does not contribute to the film formation. This makes it possible to reduce the film forming cost.

(h) By using the alkylene halosilane precursor gas such as the BTCSM gas or the like which is small in molecular weight (molecular size) of alkylene groups contained in one molecule, it is possible to further increase the deposition rate and to form a strong film. The reasons are as follows. For example, in the case of using an alkylene halosilane precursor gas which contains, in one molecule, alkylene groups such as hexylene groups or heptylene groups having a large molecular weight, the alkylene groups having a large molecular weight may sometimes cause steric hindrance that inhibits the reaction of Si contained in the precursor gas, thereby inhibiting formation of the first layer. Moreover, if the aforementioned alkylene groups remain in the first layer in a non-decomposed state or an only partially decomposed state, the alkylene groups having a large molecular weight may sometimes cause steric hindrance that inhibits the reaction of Si contained in the first layer with the NH$_3$ gas, thereby inhibiting formation of the second layer. In contrast, by using the alkylene halosilane precursor gas such as the BTCSM gas or the like which is small in molecular weight of alkylene groups contained in one molecule, it is possible to suppress generation of the aforementioned steric hindrance and to promote formation of the first layer and the second layer. Consequently, it is possible to increase a deposition rate and to form a strong film. The same effect is obtained in the case of using an alkyl halosilane precursor gas such as a TCDMDS gas or the like which is small in molecular weight of alkyl groups contained in one molecule.

(i) By using the precursor gas such as the BTCSM gas or the like containing two Si atoms in one molecule, the finally-formed SiCN film can be made a film in which Si atoms adjoin one another. The reasons are as follows. When forming the first layer under a condition in which the BTCSM gas is not autolyzed, two Si atoms contained in a BTCSM gas molecule are adsorbed onto the wafer 200 (the base film of the surface of the wafer 200) in a mutually adjoining state. Furthermore, when forming the first layer under a condition in which the BTCSM gas is autolyzed, two Si atoms contained in a BTCSM gas molecule have a strong tendency to be deposited on the wafer 200 in a mutually adjoining state. That is to say, by using a gas such as the BTCSM gas or the like containing two Si atoms in one molecule, as compared with a case where a gas such as a dichlorosilane (SiH$_2$Cl$_2$, abbreviation: DCS) gas or the like containing only one Si atom in one molecule is used, it is possible to make sure that Si atoms contained in the first layer stay in a mutually-adjoining state. Consequently, the SiCN film can be made a film in which Si atoms adjoin one another. This makes it possible to enhance the HF resistance of the film.

(j) By using the alkylene halosilane precursor gas such as the BTCSM gas or the like acting as a Si source and a C source, and the nitrogen-containing gas such as the NH$_3$ gas or the like acting as an N source, namely by using two kinds of gases, it is possible to form a film containing three elements, Si, C and N. In other words, when forming a film, there is no need to independently supply three kinds of gases, namely a Si source, a C source and an N source. For that reason, as compared with a case where three kinds of gases are used, it is possible to reduce the number of gas supply steps by one step. This makes it possible to shorten the required time per one cycle and to improve the productivity of a film forming process. Moreover, as compared with a case where three kinds of gases are used, it is possible to reduce the number of gas supply lines by one line. This makes it possible to simplify the structure of the substrate processing apparatus and to reduce the manufacturing cost or the maintenance cost of the substrate processing apparatus.

(k) The BTCSM gas is low in degradability (low in reactivity) and is high in pyrolysis temperature. Therefore, even if a film is formed in a relatively-high temperature zone of, e.g., 650 to 800 degrees C., it is possible to suppress an excessive gas phase reaction. As a result, it is possible to suppress generation of particles within the process chamber 201 and to improve the substrate processing quality.

(l) By non-simultaneously or alternately performing the supply steps of different gases, it is possible to allow the gases to appropriately contribute to a reaction under a condition in which a gas phase reaction or a surface reaction is properly generated. Consequently, it is possible to improve the step coverage of the SiCN film and the controllability of film thickness control. In addition, it is possible to avoid generation of an excessive gas phase reaction within the process chamber 201 and to suppress generation of particles.

(m) The aforementioned effects may also be achieved in a case where a precursor gas other than the BTCSM gas, which has an Si—C bond, is used as the precursor gas, a case where a nitrogen-containing gas other than the NH$_3$ gas is used as the reaction gas, or a case where a gas other than the nitrogen-containing gas, e.g., a gas containing N and C, an oxygen-containing gas, a boron-containing gas or a carbon-containing gas, is used as the reaction gas. In addition, the aforementioned effects may also be achieved in a case where an inert gas other than the N$_2$ gas is used as the inert gas to be excited with plasma.

(4) Modifications

The film forming sequence according to the present embodiment is not limited to the form illustrated in FIG. 4 and may be modified as in the modifications to be described below.

Modification 1

Instead of the step of supplying the NH$_3$ gas, it may be possible to perform a step of supplying a gas containing N and C, such as a TEA gas or the like. That is to say, a cycle which non-simultaneously performs a step of supplying a BTCSM gas from the nozzle 249*a* and a step of supplying a gas containing N and C, such as a TEA gas or the like, from the nozzle 249*b* and supplying a plasma-excited N$_2$ gas from the buffer chamber 237, may be performed a predetermined number of times (n times).

At the step of supplying the TEA gas from the nozzle 249*b* and supplying the plasma-excited N$_2$ gas from the buffer chamber 237, the TEA gas is allowed to flow from the gas supply pipe 232*b*. The opening/closing control of the APC valve 244 and the valves 243*b* and 243*d* to 243*f* is executed in the same manner as the opening/closing control of the APC valve 244 and the valves 243b and 243d to 243f executed at step 2 of the film forming sequence illustrated in FIG. 4. Furthermore, the application of the high-frequency power to between the rod-shaped electrodes 269 and 270 is performed in the same procedures as those of step 2 of the film forming sequence illustrated in FIG. 4. A supply flow rate of the TEA gas controlled by the MFC 241b is set to fall within a range of, e.g., 100 to 10,000 sccm. An internal pressure of the process chamber 201 is set to fall within a range of, e.g., 1 to 5,000 Pa or 1 to 4,000 Pa. A partial pressure of the TEA gas within the process chamber 201 is set to fall within a range of, e.g., 0.01 to 4,950 Pa. By setting the internal pressure of the process chamber 201 so as to fall within this relatively-high pressure zone, it becomes possible to thermally activate the TEA gas under a non-plasma condition. By supplying the plasma-excited $N_2$ gas together with the TEA gas, it is possible to further excite the thermally-excited TEA gas. The time during which the TEA gas is supplied into the process chamber 201, namely the gas supply time (irradiation time), is set to fall within a range of, e.g., 1 to 200 seconds, or 1 to 120 seconds or 1 to 60 seconds. Other processing conditions may be the same as, e.g., the processing conditions of step 2 of the film forming sequence illustrated in FIG. 4. Moreover, in this modification, the processing procedures and processing conditions at the step of supplying the BTCSM gas may be the same as those of the film forming sequence illustrated in FIG. 4.

By further exciting the thermally-excited TEA gas and supplying the thermally-excited TEA gas to the wafer 200 under the aforementioned conditions, the first layer (the Si-containing layer containing C and Cl) formed on the wafer 200 can react with the TEA gas, thereby modifying the first layer. At this time, the N component and the C component contained in the TEA gas are added to the first layer, whereby a second layer, which is a layer containing Si, C and N, namely a SiCN layer, is formed on the wafer 200. As a result of the introduction of the C component contained in the TEA gas, the second layer thus formed becomes a layer having a larger amount of C components than the second layer formed in the film forming sequence illustrated in FIG. 4, namely a C-rich layer. In some embodiments the thermally-excited TEA gas can be supplied by indirectly exciting the same with plasma-excited $N_2$ gas than to supply the TEA gas by directly exciting the same with plasma. By doing so, it is possible to generate a soft reaction. This makes it possible to softly perform the modification of the first layer. For example, when performing the modification of the first layer, it is possible to suppress breakage of the Si—C bonds contained in the first layer and to suppress desorption of C from the first layer.

When forming the SiCN layer, the impurities such as Cl and the like contained in the first layer make up a gaseous substance containing at least Cl during the course of the modifying reaction of the first layer by the indirectly-excited TEA gas and during the course of activation of the surface of the first layer by the plasma-excited $N_2$ gas. The gaseous substance is then discharged from the interior of the process chamber 201. That is to say, the impurities such as Cl and the like contained in the first layer are extracted or desorbed from the first layer, whereby the impurities are separated from the first layer. Thus, the SiCN layer becomes a layer which is lower in the amount of impurities such as Cl and the like than the first layer.

After the SiCN layer is formed, the valve 243b is closed to stop the supply of the TEA gas. Furthermore, the application of the high-frequency power to between the rod-shaped electrodes 269 and 270 is stopped and the supply of the plasma-excited $N_2$ gas is stopped. By the same processing procedures as those of step 2 of the film forming sequence illustrated in FIG. 4, the TEA gas, which has not reacted or remains after contribution to the formation of the SiCN layer, or the reaction byproduct, remaining within the process chamber 201, is removed from the interior of the process chamber 201.

As the N- and C-containing gas, in addition to the TEA gas, it may be possible to use, e.g., an ethylamine-based gas such as a diethylamine (($C_2H_5$)$_2$NH, abbreviation: DEA) gas, a monoethylamine ($C_2H_5NH_2$, abbreviation: MEA) gas or the like, a methylamine-based gas such as a trimethylamine (($CH_3$)$_3$N, abbreviation: TMA) gas, a dimethylamine (($CH_3$)$_2$NH, abbreviation: DMA) gas, a monomethylamine ($CH_3NH_2$, abbreviation: MMA) gas or the like, a propylamine-based gas such as a tripropylamine (($C_3H_7$)$_3$N, abbreviation: TPA) gas, a dipropylamine (($C_3H_7$)$_2$NH, abbreviation: DPA) gas, a monopropylamine ($C_3H_7NH_2$, abbreviation: MPA) gas or the like, an isopropylamine-based gas such as a triisopropylamine ([($CH_3$)$_2$CH]$_3$N, abbreviation: TIPA) gas, a diisopropylamine ([($CH_3$)$_2$CH]$_2$NH, abbreviation: DIPA) gas, a monoisopropylamine (($CH_3$)$_2$CHNH$_2$, abbreviation: MIPA) gas or the like, a butylamine-based gas such as a tributylamine ($C_4H_9$)$_3$N, abbreviation: TBA) gas, a dibutylamine (($C_4H_9$)$_2$NH, abbreviation: DBA) gas, a monobutylamine ($C_4H_9NH_2$, abbreviation: MBA) gas or the like, and an isobutylamine-based gas such as a triisobutylamine ([($CH_3$)$_2$CHCH$_2$]$_3$N, abbreviation: TIBA) gas, a diisobutylamine ([($CH_3$)$_2$CHCH$_2$]$_2$NH, abbreviation: DIBA) gas, a monoisobutylamine (($CH_3$)$_2$CHCH$_2$NH$_2$, abbreviation: MIBA) gas or the like. That is to say, as the amine-based gas, it may be possible to use, for example, at least one of the gases expressed by composition formulae, ($C_2H_5$)$_x$NH$_{3-x}$, ($CH_3$)$_x$NH$_{3-x}$, ($C_3H_7$)$_x$NH$_{3-x}$, [($CH_3$)$_2$CH]$_x$NH$_{3-x}$, ($C_4H_9$)$_x$NH$_{3-x}$, and [($CH_3$)$_2$CHCH$_2$]$_x$NH$_{3-x}$ (where x is an integer of from 1 to 3). In order to increase the C concentration while suppressing an increase of the N concentration in the SiCN film, a gas having a molecule in which the number of C atoms is larger than the number of N atoms is may be used as the amine-based gas. That is to say, as the amine-based gas, a gas which contains at least one amine selected from a group consisting of TEA, DEA, MEA, TMA, DMA, TPA, DPA, MPA, TIPA, DIPA, MIPA, TBA, DBA, MBA, TIBA, DIBA and MIBA may be used.

As the N- and C-containing gas, in addition to the amine-based gas, it may be possible to use, e.g., an organic hydrazine-based gas. In this regard, the organic hydrazine-based gas refers to gaseous organic hydrazine (compound), for example, a gas which is obtained by vaporizing organic hydrazine staying in a liquid state under room temperature and atmospheric pressure or a gas which contains a hydrazine group, such as organic hydrazine or the like staying in a gaseous state under room temperature and atmospheric pressure. The organic hydrazine-based gas may be simply referred to as an organic hydrazine gas or an organic hydrazine compound gas. The organic hydrazine-based gas is a Si-free gas composed of three elements, C, N and H, and is a gas which does not contain Si and metal. As the organic hydrazine-based gas, it may be possible to use, for example, a methylhydrazine-based gas such as a monomethylhydrazine (($CH_3$)HN$_2$H$_2$, abbreviation: MMH) gas, a dimethylhydrazine (($CH_3$)$_2$N$_2$H$_2$, abbreviation: DMH) gas, a trimethylhydrazine (($CH_3$)$_2$N$_2$($CH_3$)H, abbreviation; TMH) gas or the like, and an ethylhydrazine-based gas such as an ethylhydrazine (($C_2H_5$)HN$_2$H$_2$, abbreviation: EH) gas or the like. In order to increase the C concentration while suppressing an increase of the N concentration in the SiCN film, a gas having a molecule in which the number of C atoms is larger than the number of N atoms may be used as the organic hydrazine-based gas.

As the amine-based gas or the organic hydrazine-based gas, a gas having a plurality of C-containing ligands in one molecule, namely a gas having a plurality of hydrocarbon groups such as alkyl groups or the like in one molecule may be used. More specifically, as the amine-based gas or the organic hydrazine-based gas, a gas having three or two C-containing ligands (hydrocarbon groups such as alkyl groups or the like), i.e., organic ligands, in one molecule may be used.

By performing, one or more times (a predetermined number of times), a cycle which non-simultaneously performs the respective steps described above, it is possible to form a SiCN film having a predetermined composition and a predetermined thickness on the wafer 200. As mentioned in respect of the film forming sequence illustrated in FIG. 4, the thickness of the SiCN layer formed per one cycle may be set smaller than a desired film thickness and the aforementioned cycle is repeated a multiple number of times until the desired film thickness is obtained.

According to this modification, the same effects as those of the film forming sequence illustrated in FIG. 4 may be achieved. In addition, by performing the step of supplying the TEA gas which acts as a C source, namely by performing deposition using two kinds of carbon sources (double carbon sources) in one cycle, the SiCN film formed on the wafer 200 can be made a film having a larger amount of C components than the SiCN film formed in the film forming sequence illustrated in FIG. 4, namely a C-rich film. That is to say, it is possible to expand the window of control of the composition ratio of the SiCN film.

Modification 2

Figure 5:
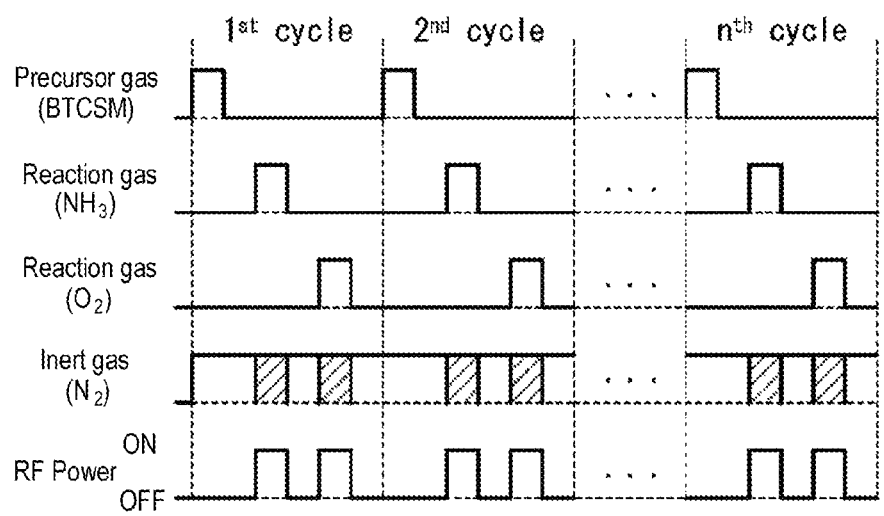
FIG. 5 is a view illustrating gas supply and plasma power supply timings in modification 2 (under a low temperature condition) of the film forming sequence according to one embodiment of the present disclosure.

As illustrated in FIG. 5, a step of supplying an oxygen-containing gas such as an $O_2$ gas or the like may be additionally performed. That is to say, a cycle which non-simultaneously performs a step of supplying a BTCSM gas from the nozzle 249a, a step of supplying a $NH_3$ gas from the nozzle 249b and supplying a plasma-excited $N_2$ gas from the buffer chamber 237 and a step of supplying an oxygen-containing gas such as an $O_2$ gas or the like from the nozzle 249b and supplying a plasma-excited $N_2$ gas from the buffer chamber 237, may be performed a predetermined number of times (n times).

At the step of supplying the $O_2$ gas from the nozzle 249b and supplying the plasma-excited $N_2$ gas from the buffer chamber 237, the $O_2$ gas is allowed to flow from the gas supply pipe 232b. The opening/closing control of the APC valve 244 and the valves 243b and 243d to 243f is executed in the same manner as the opening/closing control of the APC valve 244 and the valves 243b and 243d to 243f executed at step 2 of the film forming sequence illustrated in FIG. 4. Furthermore, the application of the high-frequency power between the rod-shaped electrodes 269 and 270 is performed in the same procedures as those of step 2 of the film forming sequence illustrated in FIG. 4. A supply flow rate of the $O_2$ gas controlled by the MFC 241b is set to fall within a range of, e.g., 100 to 10,000 sccm. An internal pressure of the process chamber 201 is set to fall within a range of, e.g., 1 to 4,000 Pa or 1 to 3,000 Pa. A partial pressure of the $O_2$ gas within the process chamber 201 is set to fall within a range of, e.g., 0.01 to 3,960 Pa. By setting the internal pressure of the process chamber 201 so as to fall within this relatively-high pressure zone, it becomes possible to thermally excite the $O_2$ gas under a non-plasma condition. By supplying the plasma-excited $N_2$ gas together with the $O_2$ gas, it becomes possible to further excite the thermally-excited $O_2$ gas. The time during which the $O_2$ gas is supplied into the process chamber 201, namely the gas supply time (irradiation time), is set to fall within a range of, e.g., 1 to 120 seconds or 1 to 60 seconds. Other processing conditions may be the same as, e.g., the processing conditions of step 2 of the film forming sequence illustrated in FIG. 4. Moreover, in this modification, the processing procedures and processing conditions at the step of supplying the BTCSM gas from the nozzle 249a and at the step of supplying the $NH_3$ gas from the nozzle 249b and supplying the plasma-excited $N_2$ gas from the buffer chamber 237 may be the same as those of the film forming sequence illustrated in FIG. 4.

By further exciting the thermally-excited $O_2$ gas and supplying the thermally-excited $O_2$ gas to the wafer 200 under the aforementioned conditions, at least a portion of the second layer (the SiCN layer) formed on the wafer 200 is oxidized (modified). As a result of the modification of the SiCN layer, a third layer which a layer containing Si, O, C and N, i.e., a silicon oxycarbonitride layer (or a SiOCN layer), is formed on the wafer 200. The thermally-excited $O_2$ gas may be supplied by indirectly exciting the same with plasma-excited $N_2$ gas than to supply the $O_2$ gas by directly exciting the same with plasma. By doing so, it is possible to generate a soft reaction. This makes it possible to softly perform oxidation of the SiCN layer. For example, when performing oxidation of the SiCN layer, it is possible to suppress breakage of the Si—C bonds contained in the SiCN layer and to suppress desorption of C from the SiCN layer.

When forming the SiOCN layer, impurities such as Cl and the like contained in the SiCN layer make up a gaseous substance containing at least Cl during the course of the modifying reaction of the SiCN layer by the $O_2$ gas and during the course of activation of the surface of the SiCN layer by the plasma-excited $N_2$ gas. The gaseous substance is discharged from the interior of the process chamber 201. That is to say, the impurities such as Cl and the like contained in the SiCN layer are extracted or desorbed from the SiCN layer, whereby the impurities are separated from the SiCN layer. Thus, the SiOCN layer becomes a layer which is lower in the amount of impurities such as Cl and the like than the SiCN layer.

After the SiOCN layer is formed, the valve 243b is closed to stop the supply of the $O_2$ gas. Furthermore, the application of the high-frequency power to between the rod-shaped electrodes 269 and 270 is stopped and the supply of the plasma-excited $N_2$ gas is stopped. By the same processing procedures as those of step 2 of the film forming sequence illustrated in FIG. 4, the $O_2$ gas, which has not reacted or remains after contribution to the formation of the SiOCN layer, or the reaction byproduct, remaining within the process chamber 201, is removed from the interior of the process chamber 201.

As the oxygen-containing gas, in addition to the $O_2$ gas, it may be possible to use, e.g., a nitrous oxide ($N_2O$) gas, a nitric monoxide (NO) gas, a nitrogen dioxide ($NO_2$) gas, an ozone ($O_3$) gas, a hydrogen ($H_2$)+$O_2$ gas, a $H_2$+$O_3$ gas, a water vapor ($H_2O$), a carbon monoxide (CO) gas, or a carbon dioxide ($CO_2$) gas.

By performing, one or more times (a predetermined number of times), a cycle which non-simultaneously performs the respective steps described above, it is possible to form a silicon oxycarbonitride film (or a SiOCN film) having a predetermined composition and a predetermined thickness, as a film containing Si, O, C and N, on the wafer 200. As mentioned in respect of the film forming sequence illustrated in FIG. 4, the thickness of the SiOCN layer formed per one cycle may be set smaller than a desired film thickness and the aforementioned cycle is repeated a multiple number of times until the desired film thickness is obtained.

According to this modification, the same effects as those of the film forming sequence illustrated in FIG. 4 may be achieved. In addition, the supply of the $O_2$ gas and the plasma-excited $N_2$ gas makes it possible to further desorb the impurities such as Cl and the like from the SiCN layer. It is therefore possible to further reduce the impurity concentration within the finally-formed SiOCN film. As a result, it is possible to further increase the HF resistance of the film.

Figure 6:
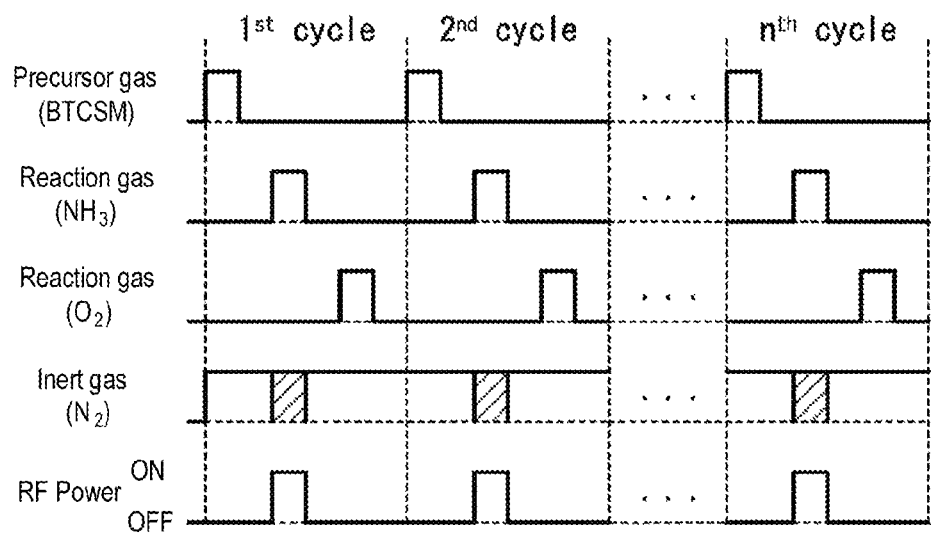
FIG. 6 is a view illustrating gas supply and plasma power supply timings in modification 2 (under a high temperature condition) of the film forming sequence according to one embodiment of the present disclosure.
Figure 7:
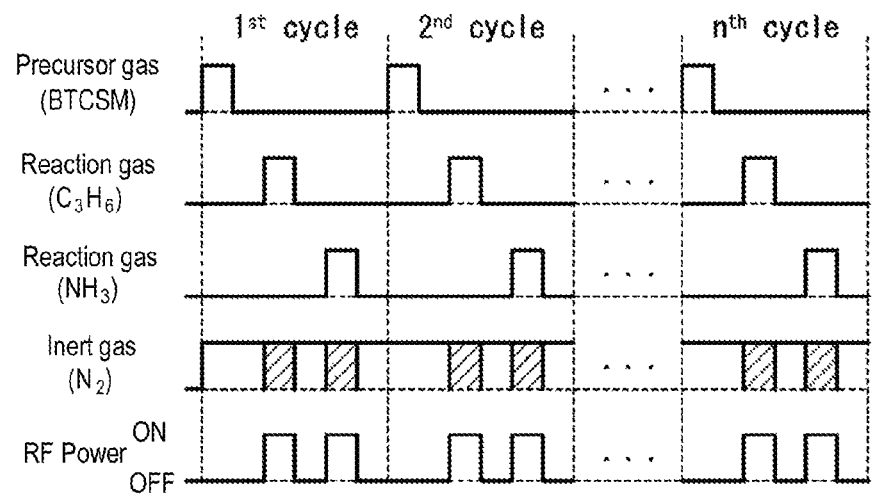
FIG. 7 is a view illustrating gas supply and plasma power supply timings in modification 9 of the film forming sequence according to one embodiment of the present disclosure.

If the film forming temperature is relatively high, for example, if the film forming process is performed in a temperature zone of 400 degrees C. or more, as illustrated in FIG. 6, the plasma-excited $N_2$ gas may not be supplied from the interior of the buffer chamber 237 at the step of supplying the $O_2$ gas. That is to say, the thermally-excited $O_2$ gas may not be excited by the plasma-excited $N_2$ gas and may be directly used in the oxidizing process. By doing so, it is possible to appropriately suppress the oxidizing power of the $O_2$ gas. This makes it possible to suppress breakage of the Si—C bonds contained in the SiCN layer and desorption of C from the SiCN layer, which may be caused by the supply of the $O_2$ gas. That is to say, it is possible to suppress reduction of the percentage of the Si—C bonds in the SiOCN film and reduction of the C concentration in the SiOCN film.

Modification 3

Instead of the step of supplying the $NH_3$ gas, it may be possible to perform a step of supplying a TEA gas. Furthermore, a step of supplying an $O_2$ gas may be performed. That is to say, a cycle which non-simultaneously performs a step of supplying a BTCSM gas from the nozzle 249a, a step of supplying a TEA gas from the nozzle 249b and supplying a plasma-excited $N_2$ gas from the buffer chamber 237 and a step of supplying an $O_2$ gas from the nozzle 249b and supplying a plasma-excited $N_2$ gas from the buffer chamber 237, may be performed a predetermined number of times (n times). The processing procedures and processing conditions at the respective steps of this modification may be the same as those of the film forming sequence illustrated in FIG. 4 or those of modifications 1 and 2 described above.

By performing the step of supplying the BTCSM gas from the nozzle 249a and the step of supplying the TEA gas from the nozzle 249b and supplying the plasma-excited $N_2$ gas from the buffer chamber 237, a second layer (SiCN layer) is formed on the wafer 200. Thereafter, by performing the step of supplying the $O_2$ gas from the nozzle 249b and supplying the plasma-excited $N_2$ gas from the buffer chamber 237, at least a portion of the SiCN layer formed on the wafer 200 is oxidized (modified). At this time, if the oxidizing power of the $O_2$ gas is increased by, for example, increasing the internal pressure of the process chamber 201 or increasing the flow rate of the plasma-excited $N_2$ gas supplied from the buffer chamber 237, it is possible to desorb most of the N atoms contained in the SiCN layer such that the N atoms exist at an impurity level. It is also possible to substantially extinguish the N atoms contained in the SiCN layer. Thus, the SiCN layer is modified into a third layer which is a SiOCN layer or a layer containing Si, O and C, namely a silicon oxycarbide layer (SiOC layer). The thermally-excited $O_2$ gas may instead be supplied by indirectly exciting the same with plasma-excited $N_2$ gas rather than to supply the $O_2$ gas by directly exciting the same with plasma. By doing so, it is possible to generate a soft reaction. This makes it possible to softly perform oxidation of the SiCN layer. For example, when performing oxidation of the SiCN layer, it is possible to suppress breakage of the Si—C bonds contained in the SiCN layer and to suppress desorption of C from the SiCN layer. According to this modification, a SiOCN film, or a silicon oxycarbide film (SiOC film) having a predetermined composition and a predetermined film thickness as a film containing Si, O and C, is formed on the wafer 200.

According to this modification, the same effects as those of the film forming sequence illustrated in FIG. 4 and those of modifications 1 and 2 may be achieved. Furthermore, according to this modification, the supply of the $O_2$ gas and the plasma-excited $N_2$ gas makes it possible to further desorb the impurities such as Cl and the like from the SiCN layer and to reduce the impurity concentration in the SiOCN film or the SiOC film. As a result, it becomes possible to enhance the HF resistance of the film.

If the film forming temperature is relatively high, for example, if the film forming process is performed in a temperature zone of 400 degrees C. or more, the plasma-excited $N_2$ gas may not be supplied from the interior of the buffer chamber 237 at the step of supplying the $O_2$ gas. This is just like modification 2. By doing so, it is possible to appropriately suppress the oxidizing power of the $O_2$ gas. This makes it possible to suppress reduction of the percentage of the Si—C bonds in the finally-formed film and reduction of the C concentration in the finally-formed film.

Modification 4

Instead of the step of supplying the $NH_3$ gas, it may be possible to perform a step of supplying an $O_2$ gas. That is to say, a cycle which non-simultaneously performs a step of supplying a BTCSM gas from the nozzle 249a and a step of supplying an $O_2$ gas from the nozzle 249b and supplying a plasma-excited $N_2$ gas from the buffer chamber 237, may be performed a predetermined number of times (n times). The processing procedures and processing conditions at the respective steps of this modification may be the same as those of the film forming sequence illustrated in FIG. 4 or those of modification 2 described above.

By performing the step of supplying the BTCSM gas from the nozzle 249a, a first layer (a Si-containing layer containing C and Cl) is formed on the wafer 200. Thereafter, by performing the step of supplying the $O_2$ gas from the nozzle 249b and supplying the plasma-excited $N_2$ gas from the buffer chamber 237, at least a portion of the first layer formed on the wafer 200 is oxidized (modified). As a result of the modification of the first layer, a SiOC layer as a second layer is formed on the wafer 200. According to this modification, a SiOC film is formed on the wafer 200.

According to this modification, the same effects as those of the film forming sequence illustrated in FIG. 4 may be achieved. In addition, according to this modification, the supply of the $O_2$ gas and the plasma-excited $N_2$ gas makes it possible to desorb the impurities such as Cl and the like from the first layer. It is therefore possible to reduce the impurity concentration in the finally-formed SiOC film. As a result, it is possible to enhance the HF resistance of the film.

If the film forming temperature is relatively high, for example, if the film forming process is performed in a temperature zone of 400 degrees C. or more, the plasma-excited $N_2$ gas may not be supplied from the interior of the buffer chamber 237 at the step of supplying the $O_2$ gas. This is just like modification 2. By doing so, it is possible to appropriately suppress the oxidizing power of the $O_2$ gas. This makes it possible to suppress reduction of the percentage of the Si—C bonds in the SiOC film and reduction of the C concentration in the SiOC film.

Modification 5

A step of supplying a borane-based gas such as a $BCl_3$ gas or the like may be performed between the step of supplying the BTCSM gas and the step of supplying the $NH_3$ gas. That is to say, a cycle which non-simultaneously performs a step of supplying a BTCSM gas from the nozzle 249a, a step of supplying a borane-based gas such as a $BCl_3$ gas or the like, a step of supplying a borane-based gas such as a $BCl_3$ gas or the like from the nozzle 249b and supplying a plasma-excited $N_2$ gas from the buffer chamber 237 and a step of supplying a $NH_3$ gas from the nozzle 249b and supplying a plasma-excited $N_2$ gas from the buffer chamber 237, may be performed a predetermined number of times (n times). In this modification, the processing procedures and processing conditions at the step of supplying the BTCSM gas from the nozzle 249a and the step of supplying the $NH_3$ gas from the nozzle 249b and supplying the plasma-excited $N_2$ gas from the buffer chamber 237 may be the same as those of the film forming sequence illustrated in FIG. 4.

At the step of supplying the $BCl_3$ gas from the nozzle 249b and supplying the plasma-excited $N_2$ gas from the buffer chamber 237, the $BCl_3$ gas is allowed to flow from the gas supply pipe 232b. The opening/closing control of the APC valve 244 and the valves 243b and 243d to 243f is executed in the same manner as the opening/closing control of the APC valve 244 and the valves 243b and 243d to 243f executed at step 2 of the film forming sequence illustrated in FIG. 4. Furthermore, the application of the high-frequency power to between the rod-shaped electrodes 269 and 270 is performed in the same procedures as those of step 2 of the film forming sequence illustrated in FIG. 4. A supply flow rate of the $BCl_3$ gas controlled by the MFC 241b is set to fall within a range of, e.g., 100 to 10,000 sccm. An internal pressure of the process chamber 201 is set to fall within a range of, e.g., 1 to 2,666 Pa or 67 to 1,333 Pa. A partial pressure of the $BCl_3$ gas within the process chamber 201 is set to fall within a range of, e.g., 0.01 to 2,640 Pa. The time during which the $BCl_3$ gas is supplied into the process chamber 201, namely the gas supply time (irradiation time), is set to fall within a range of, e.g., 1 to 120 seconds or 1 to 60 seconds. Other processing conditions may be the same as, e.g., the processing conditions of step 2 of the film forming sequence illustrated in FIG. 4.

By further exciting the thermally-excited $BCl_3$ gas and supplying the thermally-excited $BCl_3$ gas to the wafer 200 under the aforementioned conditions, a B-containing layer having a thickness of less than one atomic layer, namely a discontinuous B-containing layer, is formed on the surface of the first layer (the Si-containing layer containing C and Cl) formed on the wafer 200. The B-containing layer may be a B layer, a chemisorption layer of the $BCl_3$ gas, or both. As a result of the formation of the B-containing layer on the surface of the first layer, a layer containing Si, B and C is formed on the wafer 200. Since the $BCl_3$ gas is a non-borazine-based boron-containing gas, i.e., a borazine-ring-skeleton-free boron-containing gas, the layer containing Si, B and C becomes a borazine-ring-skeleton-free layer. The thermally-excited $BCl_3$ gas maybe be supplied by indirectly exciting the same with plasma-excited $N_2$ gas than to supply the $BCl_3$ gas by directly exciting the same with plasma. By doing so, it is possible to generate a soft reaction. This makes it possible to softly perform the formation of the B-containing layer. For example, when performing the formation of the B-containing layer, it is possible to suppress breakage of the Si—C bonds contained in the first layer and to suppress desorption of C from the first layer.

When forming the layer containing Si, B and C, the impurities such as Cl and the like contained in the first layer make up a gaseous substance containing at least Cl during the course of activation of the surface of the first layer by the plasma-excited $N_2$ gas. The gaseous substance is discharged from the interior of the process chamber 201. That is to say, the impurities such as Cl and the like contained in the first layer are extracted or desorbed from the first layer and are eventually separated from the first layer. Thus, the layer containing Si, B and C becomes a layer which is smaller in the amount of the impurities such as Cl and the like than the first layer.

As the borazine-ring-skeleton-free boron-containing gas, it may be possible to use a halogenated boron-based gas (haloborane-based gas) other than the $BCl_3$ gas, e.g., a chloroborane-based gas other than the $BCl_3$ gas, a fluoroborane-based gas such as a trifluoroborane ($BF_3$) gas or the like, and a bromoborane-based gas such as a tribromoborane ($BBr_3$) gas or the like. It is also possible to use a borane-based gas such as a $B_2H_6$ gas or the like. It is also possible to use an organic borane-based gas in addition to the inorganic borane-based gas.

After the layer containing Si, B and C is formed, the valve 243b is closed to stop the supply of the $BCl_3$ gas. Furthermore, the application of the high-frequency power between the rod-shaped electrodes 269 and 270 is stopped and the supply of the plasma-excited $N_2$ gas is stopped. By the same processing procedures as those of step 2 of the film forming sequence illustrated in FIG. 4, the $BCl_3$ gas, which has not reacted or remains after contribution to the formation of the layer containing Si, B and C, or the reaction byproduct, remaining within the process chamber 201, is removed from the interior of the process chamber 201.

Thereafter, the step of supplying the $NH_3$ gas from the nozzle 249b and supplying the plasma-excited $N_2$ gas from the buffer chamber 237 to the wafer 200, namely the layer containing Si, B and C, is performed. Thus, the layer containing Si, B and C is modified into a second layer which is a layer containing Si, B, C and N, namely a silicon borocarbonitride layer (SiBCN layer).

By performing, one or more times (a predetermined number of times), a cycle which non-simultaneously performs the respective steps described above, it is possible to form a silicon borocarbonitride film (or a SiBCN film) having a predetermined composition and a predetermined thickness, as a film containing Si, B, C and N, on the wafer 200. As mentioned in respect of the film forming sequence illustrated in FIG. 4, the thickness of the SiBCN layer formed per one cycle may be set smaller than a desired film thickness and the aforementioned cycle is repeated a multiple number of times until the desired film thickness is obtained.

According to this modification, the same effects as those of the film forming sequence illustrated in FIG. 4 and those of the respective modifications described above may be achieved. In addition, the addition of B to the film formed on the wafer 200 makes it possible to enhance, e.g., the HF resistance of the film.

Modification 6

A step of supplying a TEA gas may be performed instead of the step of supplying the NH₃ gas, and a step of supplying a BCl₃ gas may be performed between the step of supplying the BTCSM gas and the step of supplying the TEA gas. That is to say, a cycle which non-simultaneously performs a step of supplying a BTCSM gas from the nozzle 249a, a step of supplying a BCl₃ gas from the nozzle 249b and supplying a plasma-excited N₂ gas from the buffer chamber 237 and a step of supplying a TEA gas from the nozzle 249b and supplying a plasma-excited N₂ gas from the buffer chamber 237, may be performed a predetermined number of times (n times). According to this modification, a SiBCN film is formed on the wafer 200. The processing procedures and processing conditions at the respective steps of this modification may be the same as those of the film forming sequence illustrated in FIG. 4 and those of modifications 1 and 5.

According to this modification, the same effects as those of the film forming sequence illustrated in FIG. 4 and those of modification 5 may be achieved. In addition, by performing the step of supplying the TEA gas, the SiBCN film formed on the wafer 200 can be made a film having a larger amount of C components than the SiBCN film formed in modification 5, namely a C-rich film. That is to say, it is possible to expand the window of control of the composition ratio of the SiBCN film.

Modification 7

A step of supplying a borazine-based gas such as a TMB gas or the like may be performed instead of the step of supplying the NH₃ gas. That is to say, a cycle which non-simultaneously performs a step of supplying a BTCSM gas from the nozzle 249a and a step of supplying a borazine-based gas such as a TMB gas or the like from the nozzle 249b and supplying a plasma-excited N₂ gas from the buffer chamber 237, may be performed a predetermined number of times (n times). In this modification, the processing procedures and processing conditions at the step of supplying the BTCSM gas from the nozzle 249a may be the same as those of the film forming sequence illustrated in FIG. 4.

At the step of supplying the TMB gas from the nozzle 249b and supplying the plasma-excited N₂ gas from the buffer chamber 237, the TMB gas is allowed to flow from the gas supply pipe 232b. The opening/closing control of the APC valve 244 and the valves 243b and 243d to 243f is executed in the same manner as the opening/closing control of the APC valve 244 and the valves 243b and 243d to 243f executed at step 2 of the film forming sequence illustrated in FIG. 4. Furthermore, the application of the high-frequency power to between the rod-shaped electrodes 269 and 270 is performed in the same procedures as those of step 2 of the film forming sequence illustrated in FIG. 4. A supply flow rate of the TMB gas controlled by the MFC 241b is set to fall within a range of, e.g., 1 to 1,000 sccm. An internal pressure of the process chamber 201 is set to fall within a range of, e.g., 1 to 2,666 Pa or 67 to 1,333 Pa. A partial pressure of the TMB gas within the process chamber 201 is set to fall within a range of, e.g., 0.0001 to 2,424 Pa. The time during which the TMB gas is supplied into the process chamber 201, namely the gas supply time (irradiation time), is set to fall within a range of, e.g., 1 to 120 seconds or 1 to 60 seconds. Other processing conditions may be the same as, e.g., the processing conditions of step 2 of the film forming sequence illustrated in FIG. 4.

As the thermally-excited TMB gas is further excited and supplied to the wafer 200 under the aforementioned conditions, the first layer (the Si-containing layer containing C and Cl) reacts with the TMB gas. That is to say, the Cl (chloro group) contained in the first layer reacts with the ligand (methyl group) contained in the TMB. Thus, the Cl of the first layer reacted with the ligand of the TMB can be separated (extracted) from the first layer. The ligand of the TMB reacted with the Cl of the first layer can be separated from the TMB. Then, the N that constitutes the borazine ring of the TMB from which the ligand is separated can be bonded to the Si of the first layer. That is to say, among B and N constituting the borazine ring of the TMB, the N caused to have a dangling bond due to the separation of the methyl ligand may be bonded to the Si included in the first layer and caused to have a dangling bond or the Si originally provided with a dangling bond, thereby forming a Si—N bond. At this time, the borazine ring skeleton constituting the borazine ring of the TMB is maintained without being broken.

By supplying the TMB gas under the aforementioned conditions, it is possible to have the first layer and the TMB properly react with each other while maintaining the borazine ring skeleton of the TMB without destroying the same. This makes it possible to generate the series of reactions described above. The most important factors (conditions) for generating the series of reactions while maintaining the borazine ring skeleton of the TMB are considered to be the temperature of the wafer 200 and the internal temperature of the process chamber 201, particularly the temperature of the wafer 200. By appropriately controlling those factors, it becomes possible to generate appropriate reactions.

Through the series of reactions, the borazine ring is newly introduced into the first layer, and the first layer is changed (or modified) into a second layer which is a layer including a borazine ring skeleton and containing Si, B, C, and N, namely a silicon borocarbonitride layer (SiBCN layer) having a borazine ring skeleton. The SiBCN layer including a borazine ring skeleton becomes a layer having a thickness of, e.g., from less than one atomic layer to several atomic layers. The SiBCN layer including a borazine ring skeleton may also be referred to as a layer containing Si, C and a borazine ring skeleton.

As the borazine ring is newly introduced into the first layer, the B component and the N component constituting the borazine ring are introduced into the first layer. At this time, the C component contained in the ligand of the TMB is also introduced into the first layer. That is to say, if the borazine ring is introduced into the first layer by causing the first layer and the TMB to react with each other, it is possible to add the B component, the C component and the N component to the first layer.

During the formation of the SiBCN layer including a borazine ring skeleton, the Cl which was contained in the first layer or the H which was contained in the TMB gas makes up a gaseous substance containing at least Cl or H in the course of the modifying reaction of the first layer by the TMB gas and in the course of activation of the surface of the first layer by the plasma-excited N₂ gas. The gaseous substance thus formed is discharged from the interior of the process chamber 201. That is to say, impurities such as Cl and the like contained in the first layer are extracted or desorbed from the first layer and are eventually separated from the first layer. Thus, the SiBCN layer including a borazine ring skeleton becomes a layer which is smaller in the amount of impurities such as Cl and the like than the first layer.

During the formation of the SiBCN layer including a borazine ring skeleton, if the borazine ring skeleton that constitutes the borazine ring of the TMB is maintained without destroying the same, it is possible to maintain a central space of the borazine ring. Thus, a porous SiBCN layer can be formed.

After the SiBCN layer including a borazine ring skeleton is formed, the valve 243b is closed to stop the supply of the TMB gas. Furthermore, the application of high-frequency power between the rod-shaped electrodes 269 and 270 is stopped and the supply of the plasma-excited $N_2$ gas is stopped. Then, by the same processing procedures as those of step 2 of the film forming sequence illustrated in FIG. 4, the TMB gas, which has not reacted or remains after contribution to the formation of the SiBCN layer including a borazine ring skeleton, or the reaction byproduct, remaining within the process chamber 201, is removed from the interior of the process chamber 201.

As the gas containing a borazine ring skeleton, in addition to the TMB gas, it may be possible to use, e.g., a TEB gas, a TPB gas, a TIPB gas, a TBB gas or a TIBB gas.

By performing, one or more times (a predetermined number of times), a cycle which non-simultaneously performs the respective steps described above, it is possible to form a SiBCN film having a predetermined composition and a predetermined thickness and including a borazine ring skeleton on the wafer 200. As mentioned with respect to the film forming sequence illustrated in FIG. 4, the thickness of the SiBCN layer formed per one cycle may be set smaller than a desired film thickness and the aforementioned cycle is repeated a multiple number of times until the desired film thickness is obtained.

According to this modification, the same effects as those of the film forming sequence illustrated in FIG. 4 and those of modifications 5 and 6 may be achieved. In addition, the film formed on the wafer 200 is made of a film including a borazine ring skeleton, namely a porous film having a low atomic density. It is therefore possible to make the dielectric constant of the film lower than the dielectric constant of the SiBCN film formed in, e.g., modifications 5 and 6. Moreover, the film formed on the wafer 200 is made of a film including a borazine ring skeleton, namely a film containing B as one component of the borazine ring skeleton that constitutes the film. This makes it possible to enhance the oxidation resistance of the film.

Modification 8

A step of supplying a TMB gas may be performed between the step of supplying the BTCSM gas and the step of supplying the $NH_3$ gas. That is to say, a cycle which non-simultaneously performs a step of supplying a BTCSM gas from the nozzle 249a, a step of supplying a TMB gas from the nozzle 249b and supplying a plasma-excited $N_2$ gas from the buffer chamber 237 and a step of supplying a $NH_3$ gas from the nozzle 249b and supplying a plasma-excited $N_2$ gas from the buffer chamber 237, may be performed a predetermined number of times (n times). The processing procedures and processing conditions at the respective steps of this modification may be the same as those of the film forming sequence illustrated in FIG. 4 and those of modification 7.

By performing the step of supplying the BTCSM gas from the nozzle 249a and the step of supplying the TMB gas from the nozzle 249b and supplying the plasma-excited $N_2$ gas from the buffer chamber 237, a second layer (or a SiBCN layer containing a borazine ring skeleton) is formed on the wafer 200. Thereafter, at least a portion of the SiBCN layer containing a borazine ring skeleton, which is formed on the wafer 200, is nitrided (modified) by performing the step of supplying the $NH_3$ gas from the nozzle 249b and supplying the plasma-excited $N_2$ gas from the buffer chamber 237. Thus, the SiBCN layer containing a borazine ring skeleton is modified into a third layer which is an N-rich SiBCN layer containing a borazine ring skeleton. According to this modification, an N-rich SiBCN film containing a borazine ring skeleton is formed on the wafer 200.

According to this modification, the same effects as those of the film forming sequence illustrated in FIG. 4 and those of modification 7 may be achieved. In addition, according to this modification, the supply of the $NH_3$ gas and the plasma-excited $N_2$ gas makes it possible to desorb the impurities such as Cl and the like from the second layer and to reduce the impurity concentration in the finally-formed film. As a result, it is possible to enhance the HF resistance of the film.

Modification 9

A step of supplying a carbon-containing gas such as a $C_3H_6$ gas or the like may be performed between the step of supplying the BTCSM gas and the step of supplying the $NH_3$ gas. That is to say, a cycle which non-simultaneously performs a step of supplying a BTCSM gas from the nozzle 249a, a step of supplying a carbon-containing gas such as a $C_3H_6$ gas or the like from the nozzle 249b and supplying a plasma-excited $N_2$ gas from the buffer chamber 237 and a step of supplying a $NH_3$ gas from the nozzle 249b and supplying a plasma-excited $N_2$ gas from the buffer chamber 237, may be performed a predetermined number of times (n times). In this modification, the processing procedures and processing conditions at the step of supplying the BTCSM gas from the nozzle 249a and at the step of supplying the $NH_3$ gas from the nozzle 249b and supplying the plasma-excited $N_2$ gas from the buffer chamber 237 may be the same as those of the film forming sequence illustrated in FIG. 4.

At the step of supplying the $C_3H_6$ gas from the nozzle 249b and supplying the plasma-excited $N_2$ gas from the buffer chamber 237, the $C_3H_6$ gas is allowed to flow from the gas supply pipe 232c. The opening/closing control of the APC valve 244 and the valves 243c and 243d to 243f is executed in the same manner as the opening/closing control of the APC valve 244 and the valves 243b and 243d to 243f executed at step 2 of the film forming sequence illustrated in FIG. 4. Furthermore, the application of the high-frequency power to between the rod-shaped electrodes 269 and 270 is performed in the same procedures as those of step 2 of the film forming sequence illustrated in FIG. 4. A supply flow rate of the $C_3H_6$ gas controlled by the MFC 241c is set to fall within a range of, e.g., 100 to 10,000 sccm. An internal pressure of the process chamber 201 is set to fall within a range of, e.g., 1 to 5,000 Pa or 1 to 4,000 Pa. A partial pressure of the $C_3H_6$ gas within the process chamber 201 is set to fall within a range of, e.g., 0.01 to 4,950 Pa. The time during which the $C_3H_6$ gas is supplied into the process chamber 201, namely the gas supply time (irradiation time), is set to fall within a range of, e.g., 1 to 200 seconds, or 1 to 120 seconds or 1 to 60 seconds. Other processing conditions may be the same as, e.g., the processing conditions of step 2 of the film forming sequence illustrated in FIG. 4.

By further exciting the thermally-excited $C_3H_6$ gas and supplying the thermally-excited $C_3H_6$ gas to the wafer 200 under the aforementioned conditions, a C-containing layer having a thickness of less than one atomic layer, namely a discontinuous C-containing layer, is formed on the surface of the first layer (the Si-containing layer containing C and Cl) formed on the wafer 200. The C-containing layer may be a C layer, a chemisorption layer of $C_3H_6$, or both. The thermally-excited $C_3H_6$ gas may be supplied by indirectly exciting the same with plasma-excited $N_2$ gas than to supply the $C_3H_6$ gas by directly exciting the same with plasma. By doing so, it is possible to generate a soft reaction. This makes it possible to softly perform the formation of the C-containing layer. For example, when performing the formation of the C-containing layer, it is possible to suppress breakage of the Si—C bonds contained in the first layer and to suppress desorption of C from the first layer.

When forming the C-containing layer, the impurities such as Cl and the like contained in the first layer make up a gaseous substance containing at least Cl during the course of activation of the surface of the first layer by the plasma-excited $N_2$ gas. The gaseous substance is discharged from the interior of the process chamber 201. That is to say, the impurities such as Cl and the like contained in the first layer are extracted or desorbed from the first layer and are eventually separated from the first layer. Thus, the C-containing layer becomes a layer which is smaller in the amount of the impurities such as Cl and the like than the first layer.

As the carbon-containing gas, in addition to the $C_3H_6$ gas, it may be possible to use, e.g., a hydrocarbon-based gas such as an acetylene ($C_2H_2$) gas, an ethylene ($C_2H_4$) gas or the like.

After the C-containing layer is formed, the valve 243c is closed to stop the supply of the $C_3H_6$ gas. Furthermore, the application of the high-frequency power to between the rod-shaped electrodes 269 and 270 is stopped and the supply of the plasma-excited $N_2$ gas is stopped. Then, by the same processing procedures as those of step 2 of the film forming sequence illustrated in FIG. 4, the $C_3H_6$ gas, which has not reacted or remains after contribution to the formation of the C-containing layer, or the reaction byproduct, remaining within the process chamber 201, is removed from the interior of the process chamber 201.

Thereafter, by performing the step of supplying the $NH_3$ gas from the nozzle 249b and supplying the plasma-excited $N_2$ gas from the buffer chamber 237 to the wafer 200, namely the first layer on which the C-containing layer is formed, the first layer on which the C-containing layer is formed is modified into a SiCN layer. At this time, in order to reliably perform the reaction of the $NH_3$ gas with the first layer on which the C-containing layer is formed, namely the formation of the SiCN layer, the step of supplying the $C_3H_6$ gas may be completed before the reaction of adsorption of the $C_3H_6$ gas onto the surface of the first layer is saturated, namely before the C-containing layer such as an adsorption layer (chemisorption layer) of $C_3H_6$ or the like formed on the surface of the first layer becomes a continuous layer (while the C-containing layer is maintained as a discontinuous layer).

By performing, one or more times (a predetermined number of times), a cycle which non-simultaneously performs the respective steps described above, it is possible to form a SiCN film on the wafer 200. As mentioned with respect to the film forming sequence illustrated in FIG. 4, the thickness of the SiCN layer formed per one cycle may be set smaller than a desired film thickness and the aforementioned cycle is repeated a multiple number of times until the desired film thickness is obtained.

According to this modification, the same effects as those of the film forming sequence illustrated in FIG. 4 and those of the respective modifications described above may be achieved.

In addition, according to this modification, by performing the step of supplying the $C_3H_6$ gas which acts as a C source, namely by performing deposition using two kinds of carbon sources (double carbon sources) in one cycle, the finally-formed SiCN film can be made a film which is higher in the C concentration than the SiCN film formed by the film forming sequence illustrated in FIG. 4. Moreover, by adding the step of supplying the $C_3H_6$ gas as in this modification, even if C is desorbed from the first layer for any reason, it is possible to supplement (reinforce) the desorbed C.

Furthermore, according to this modification, a gas not containing N, namely a hydrocarbon-based gas not acting as an N-source, such as a $C_3H_6$ gas or the like, is used as the carbon-containing gas. It is therefore possible to prevent an N-component derived from the carbon-containing gas from being added to the SiCN film. This makes it possible to increase the C concentration in the finally-formed SiCN film while suppressing an increase of the N concentration in the finally-formed SiCN film. That is to say, it becomes possible to improve the controllability of the composition ratio control of the SiCN film.

Modification 10

Figure 8:
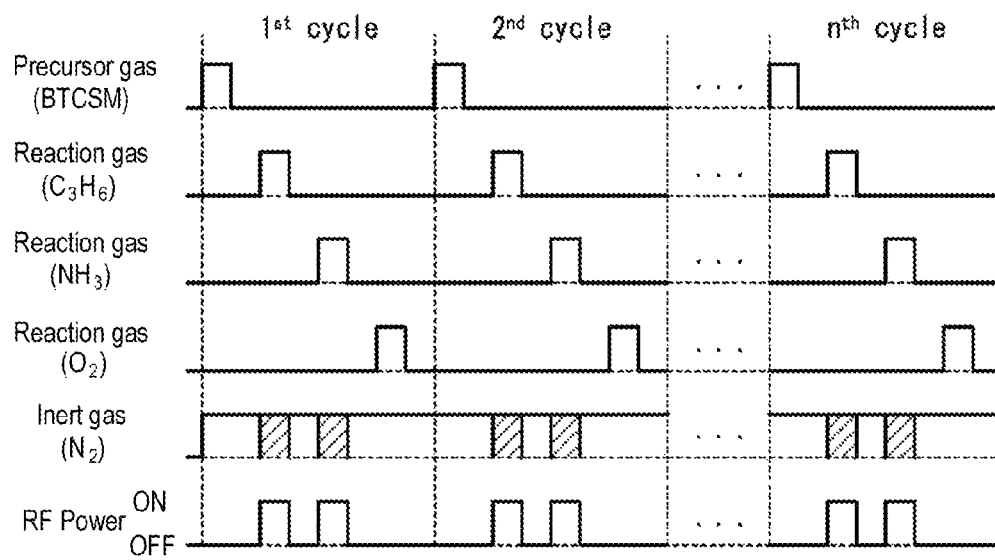
FIG. 8 is a view illustrating gas supply and plasma power supply timings in modification 10 of the film forming sequence according to one embodiment of the present disclosure.

As illustrated in FIG. 8, a step of supplying an $O_2$ gas may be additionally performed. That is to say, a cycle which non-simultaneously performs a step of supplying a BTCSM gas from the nozzle 249a, a step of supplying a $C_3H_6$ gas from the nozzle 249b and supplying a plasma-excited $N_2$ gas from the buffer chamber 237, a step of supplying a $NH_3$ gas from the nozzle 249b and supplying a plasma-excited $N_2$ gas from the buffer chamber 237 and a step of supplying an $O_2$ gas from the nozzle 249b, may be performed a predetermined number of times (n times).

At the step of supplying the $O_2$ gas from the nozzle 249b, the plasma-excited $N_2$ gas may not be supplied from the interior of the buffer chamber 237. That is to say, the thermally-excited $O_2$ gas may not be excited by the plasma-excited $N_2$ gas and may be directly used in an oxidizing process. Except for the points mentioned above, the processing procedures and the processing conditions at the respective steps of this modification may be the same as those of the film forming sequence illustrated in FIG. 4 and those of modifications 2 and 9.

By performing the step of supplying the $C_3H_6$ gas from the nozzle 249b and supplying the plasma-excited $N_2$ gas from the buffer chamber 237 and the step of supplying the $NH_3$ gas from the nozzle 249b and supplying the plasma-excited $N_2$ gas from the buffer chamber 237, a SiCN layer is formed on the wafer 200. Thereafter, by performing the step of supplying the $O_2$ gas from the nozzle 249b, at least a portion of the SiCN layer formed on the wafer 200 is oxidized (modified). Thus, the SiCN layer is modified into a SiOCN layer. According to this modification, a SiOCN film is formed on the wafer 200.

According to this modification, the same effects as those of the film forming sequence illustrated in FIG. 4 and those of modification 9 may be achieved. In addition, according to this modification, the supply of the thermally-excited $O_2$ gas makes it possible to desorb the impurities such as Cl and the like from the SiCN layer and to reduce the impurity concentration in the SiOCN film. As a result, it is possible to enhance the HF resistance of the film.

Modification 11

Figure 9:
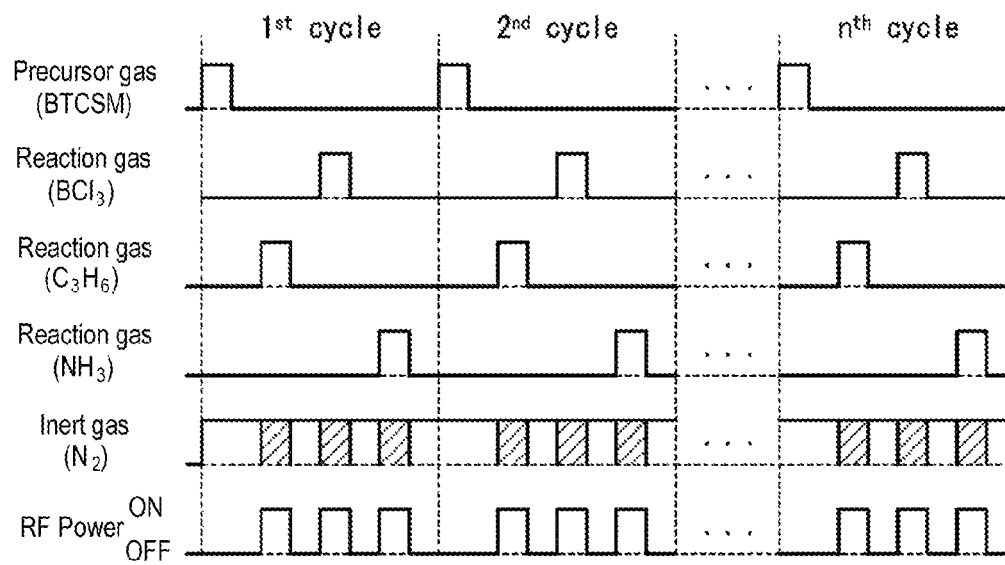
FIG. 9 is a view illustrating gas supply and plasma power supply timings in modification 11 of the film forming sequence according to one embodiment of the present disclosure.

As illustrated in FIG. 9, a step of supplying a $C_3H_6$ gas may be performed between the step of supplying the BTCSM gas and the step of supplying the BCl₃ gas in modification 5. That is to say, a cycle which non-simultaneously performs a step of supplying a BTCSM gas from the nozzle 249a, a step of supplying a C₃H₆ gas from the nozzle 249b and supplying a plasma-excited N₂ gas from the buffer chamber 237, a step of supplying a BCl₃ gas from the nozzle 249b and supplying a plasma-excited N₂ gas from the buffer chamber 237, and a step of supplying a NH₃ gas from the nozzle 249b and supplying a plasma-excited N₂ gas from the buffer chamber 237, may be performed a predetermined number of times (n times). The processing procedures and the processing conditions at the respective steps of this modification may be the same as those of the film forming sequence illustrated in FIG. 4 and those of modifications 5 and 9.

By performing the step of supplying the BTCSM gas from the nozzle 249a, a first layer (a Si-containing layer containing C and Cl) is formed. Thereafter, by performing the step of supplying the C₃H₆ gas from the nozzle 249b and supplying the plasma-excited N₂ gas from the buffer chamber 237 and the step of supplying the BCl₃ gas from the nozzle 249b and supplying the plasma-excited N₂ gas from the buffer chamber 237, a C-containing layer and a B-containing layer can be formed on the first layer. Then, by performing the step of supplying the NH₃ gas from the nozzle 249b and supplying the plasma-excited N₂ gas from the buffer chamber 237, the first layer on which the C-containing layer and the B-containing layer are formed is modified into a SiBCN layer. According this modification, a SiBCN film is formed on the wafer 200.

According to this modification, the same effects as those of the film forming sequence illustrated in FIG. 4 and those of modifications 5 and 9 may be achieved.

Modification 12

Instead of the step of supplying the NH₃ gas, a step of supplying a C₃H₆ gas may be performed. That is to say, a cycle which non-simultaneously performs a step of supplying a BTCSM gas from the nozzle 249a and a step of supplying a C₃H₆ gas from the nozzle 249b and supplying a plasma-excited N₂ gas from the buffer chamber 237, may be performed a predetermined number of times (n times). The processing procedures and the processing conditions at the respective steps of this modification may be the same as those of the film forming sequence illustrated in FIG. 4 and those of modification 9.

By performing the step of supplying the BTCSM gas from the nozzle 249a, a first layer (a Si-containing layer containing C and Cl) is formed. Thereafter, by performing the step of supplying the C₃H₆ gas from the nozzle 249b and supplying the plasma-excited N₂ gas from the buffer chamber 237, the first layer is modified into a layer containing Si and C, namely a silicon carbide layer (SiC layer). As a result of introduction of the C components contained in the C₃H₆ gas, the modified layer becomes a layer having a larger amount of C components than the first layer, namely a C-rich layer. When forming the SiC layer, the impurities such as Cl and the like contained in the first layer make up a gaseous substance containing at least Cl during the course of the modifying reaction of the first layer by the C₃H₆ gas and during the course of activation of the surface of the first layer by the plasma-excited N₂ gas. The gaseous substance is discharged from the interior of the process chamber 201. That is to say, impurities such as Cl and the like contained in the first layer are extracted or desorbed from the first layer, whereby the impurities are separated from the first layer. Thus, the SiC layer becomes a layer which is lower in the amount of impurities such as Cl and the like than the first layer. According to this modification, a silicon carbide film (SiC film) having a predetermined composition and a predetermined film thickness as a film containing Si and C is formed on the wafer 200.

According to this modification, the same effects as those of the film forming sequence illustrated in FIG. 4 and those of modification 9 may be achieved. In addition, according to this modification, by performing the step of supplying the C₃H₆ gas which acts as a C source, namely by performing deposition using two kinds of carbon sources (double carbon sources) in one cycle, a SiC film having an increased carbon concentration can be formed on the wafer 200.

Modifications 13 to 17

Figure 10:
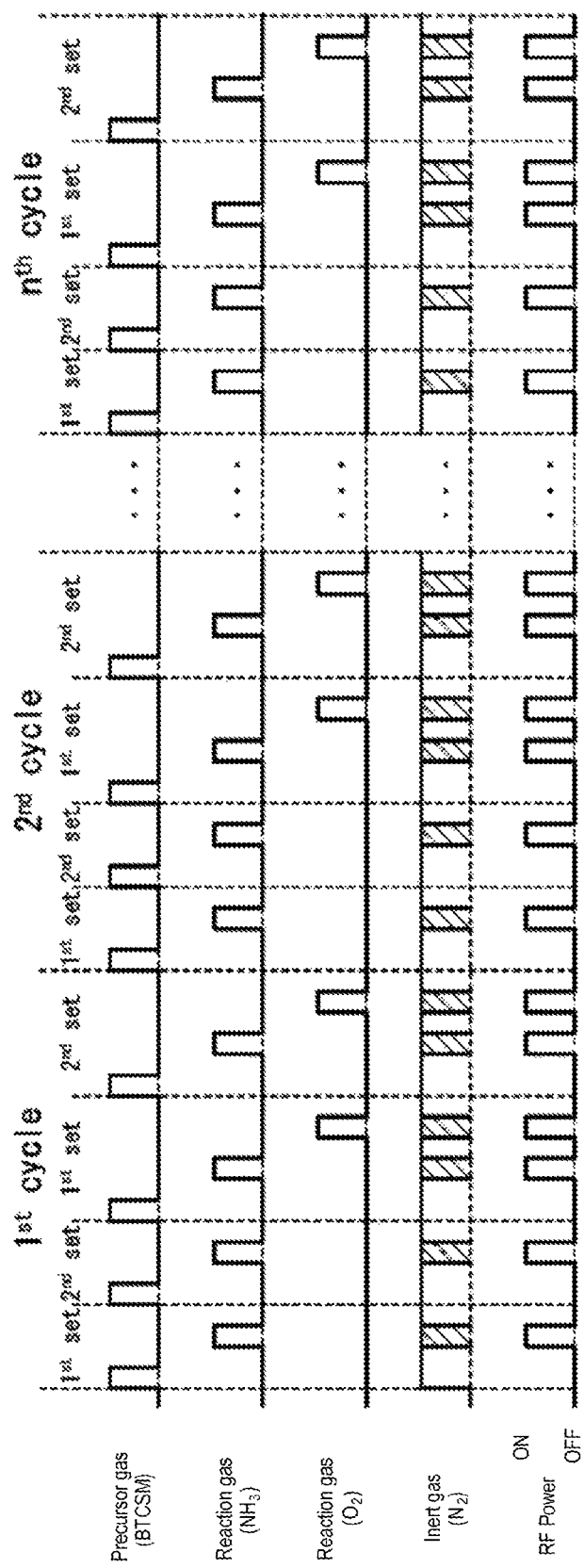
FIG. 10 is a view illustrating gas supply and plasma power supply timings in modification 13 of the film forming sequence according to one embodiment of the present disclosure.

As illustrated in FIG. 10, a laminated film (or a SiOCN film) composed of a first film and a second film alternately laminated at a nano level may be formed on the wafer 200 by performing, a predetermined number of times (n times), a cycle which includes:

a step of forming a SiCN film as the first film by performing, a predetermined number of times ($m_1$ times), a set which non-simultaneously performs a step of supplying a BTCSM gas from the nozzle 249a and a step of supplying a NH₃ gas from the nozzle 249b and supplying a plasma-excited N₂ gas from the buffer chamber 237; and a step of forming a SiOCN film as the second film by performing, a predetermined number of times ($m_2$ times), a set which non-simultaneously performs a step of supplying a BTCSM gas from the nozzle 249a, a step of supplying a NH₃ gas from the nozzle 249b and supplying a plasma-excited N₂ gas from the buffer chamber 237 and a step of supplying an O₂ gas from the nozzle 249b and supplying a plasma-excited N₂ gas from the buffer chamber 237 (Modification 13). FIG. 10 illustrates an example where the performing times (m1 times or m2 times) of each of the sets are two times.

Figure 11:
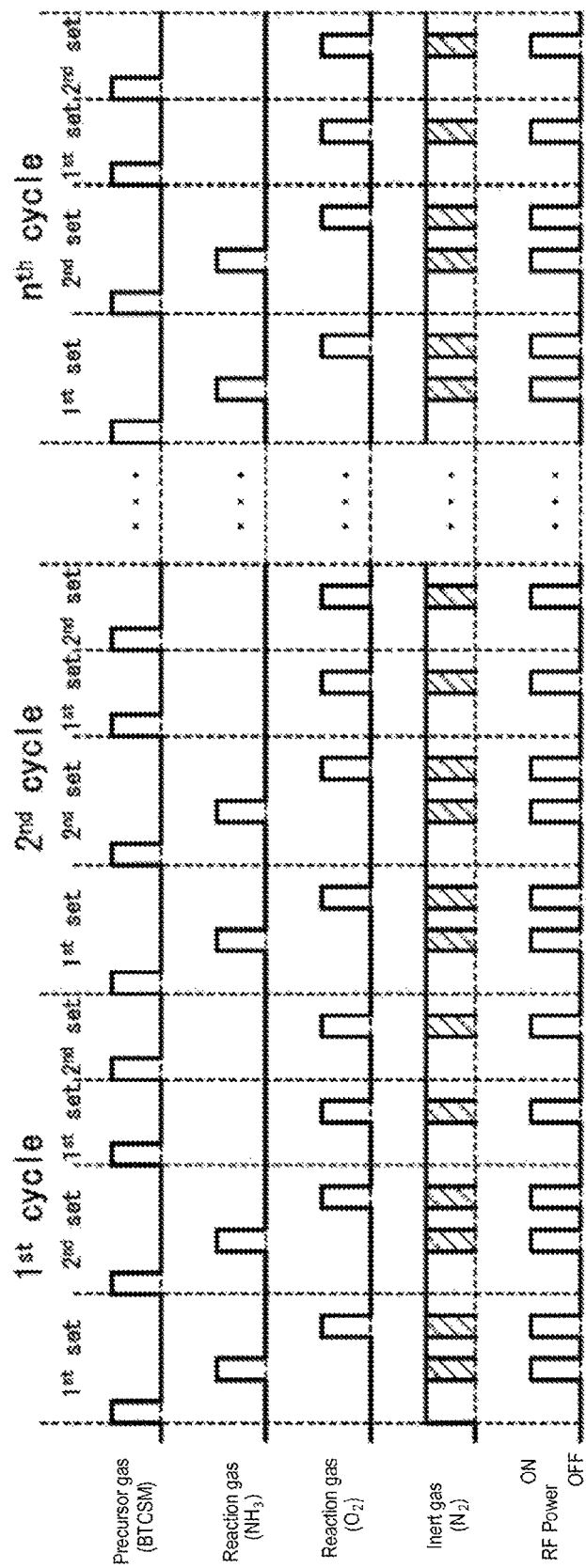
FIG. 11 is a view illustrating gas supply and plasma power supply timings in modification 14 of the film forming sequence according to one embodiment of the present disclosure.

Furthermore, as illustrated in FIG. 11, a laminated film (or a SiOCN film) composed of a first film and a second film alternately laminated at a nano level may be formed on the wafer 200 by performing, a predetermined number of times (n times), a cycle which includes:

a step of forming a SiOCN film as the first film by performing, a predetermined number of times ($m_1$ times), a set which non-simultaneously performs a step of supplying a BTCSM gas from the nozzle 249a, a step of supplying a NH₃ gas from the nozzle 249b and supplying a plasma-excited N₂ gas from the buffer chamber 237 and a step of supplying an O₂ gas from the nozzle 249b and supplying a plasma-excited N₂ gas from the buffer chamber 237; and a step of forming a SiOC film as the second film by performing, a predetermined number of times ($m_2$ times), a set which non-simultaneously performs a step of supplying a BTCSM gas from the nozzle 249a and a step of supplying an O₂ gas from the nozzle 249b and supplying a plasma-excited N₂ gas from the buffer chamber 237 (Modification 14). FIG. 11 illustrates an example where the performing times (m1 times or m2 times) of each of the sets are two times.

Figure 12:
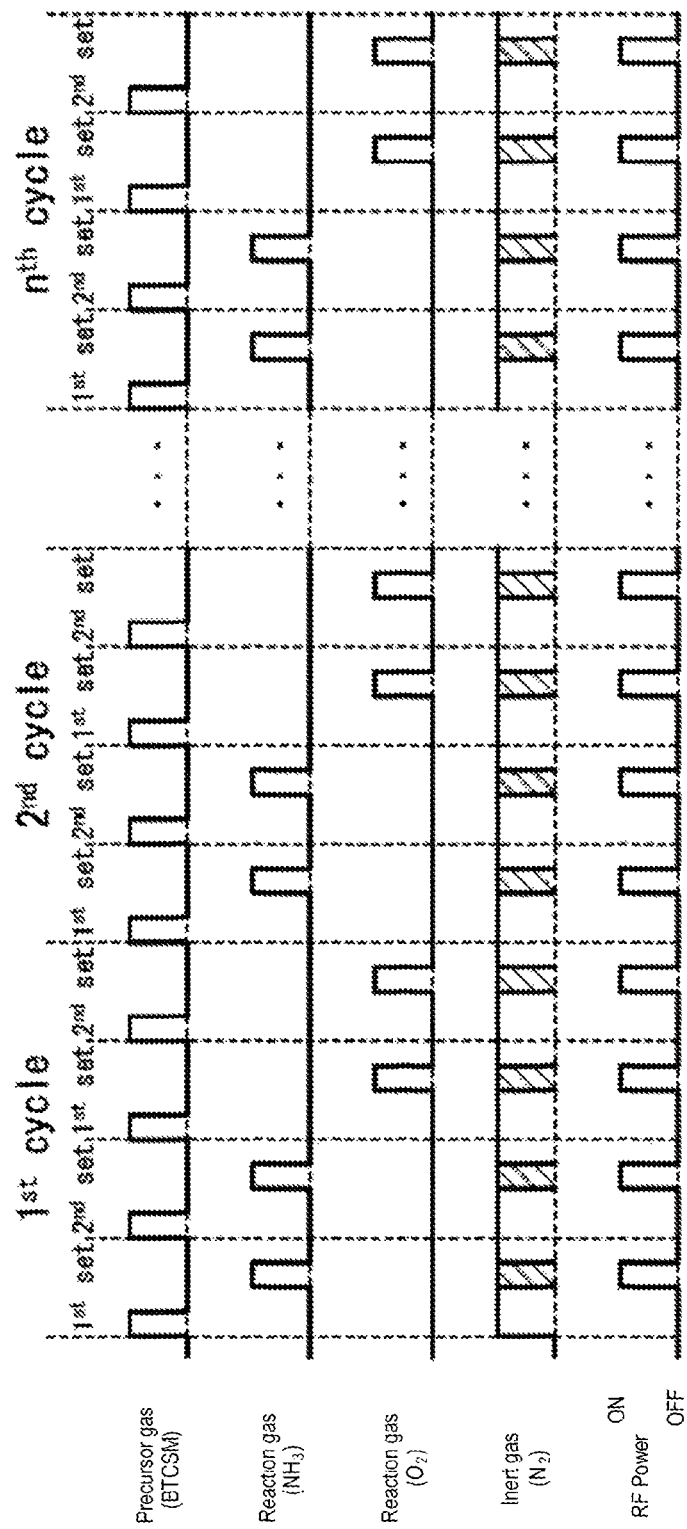
FIG. 12 is a view illustrating gas supply and plasma power supply timings in modification 15 of the film forming sequence according to one embodiment of the present disclosure.
Figure 13:
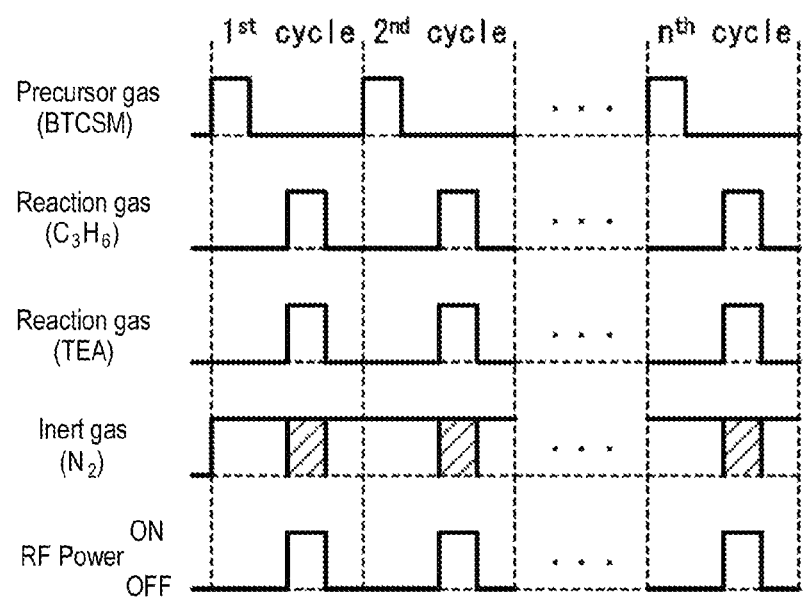
FIG. 13 is a view illustrating gas supply and plasma power supply timings in modification 18 of the film forming sequence according to one embodiment of the present disclosure.

Moreover, as illustrated in FIG. 12, a laminated film (or a SiOCN film) composed of a first film and a second film alternately laminated at a nano level may be formed on the wafer 200 by performing, a predetermined number of times (n times), a cycle which includes:

a step of forming a SiCN film as the first film by performing, a predetermined number of times ($m_1$ times), a set which non-simultaneously performs a step of supplying a BTCSM gas from the nozzle 249a and a step of supplying a NH$_3$ gas from the nozzle 249b and supplying a plasma-excited N$_2$ gas from the buffer chamber 237; and a step of forming a SiOC film as the second film by performing, a predetermined number of times ($m_2$ times), a set which non-simultaneously performs a step of supplying a BTCSM gas from the nozzle 249a and a step of supplying an O$_2$ gas from the nozzle 249b and supplying a plasma-excited N$_2$ gas from the buffer chamber 237 (Modification 15). FIG. 12 illustrates an example where the performing times (m1 times or m2 times) of each of the sets are two times.

In addition, a laminated film (or a borazine-ring-skeleton-free SiBCN film) composed of a first film and a second film alternately laminated at a nano level may be formed on the wafer 200 by performing, a predetermined number of times (n times), a cycle which includes:

a step of forming a SiCN film as the first film by performing, a predetermined number of times ($m_1$ times), a set which non-simultaneously performs a step of supplying a BTCSM gas from the nozzle 249a and a step of supplying a NH$_3$ gas from the nozzle 249b and supplying a plasma-excited N$_2$ gas from the buffer chamber 237; and a step of forming a borazine-ring-skeleton-free SiBCN film as the second film by performing, a predetermined number of times ($m_2$ times), a set which non-simultaneously performs a step of supplying a BTCSM gas from the nozzle 249a, a step of supplying a BCl$_3$ gas from the nozzle 249b and supplying a plasma-excited N$_2$ gas from the buffer chamber 237 and a step of supplying an NH$_3$ gas from the nozzle 249b and supplying a plasma-excited N$_2$ gas from the buffer chamber 237 (Modification 16).

Furthermore, a laminated film (or a borazine-ring-skeleton-containing SiBCN film) composed of a first film and a second film alternately laminated at a nano level may be formed on the wafer 200 by performing, a predetermined number of times (n times), a cycle which includes:

a step of forming a borazine-ring-skeleton-free SiBCN film as the first film by performing, a predetermined number of times ($m_1$ times), a set which non-simultaneously performs a step of supplying a BTCSM gas from the nozzle 249a, a step of supplying a BCl$_3$ gas from the nozzle 249b and supplying a plasma-excited N$_2$ gas from the buffer chamber 237 and a step of supplying an NH$_3$ gas from the nozzle 249b and supplying a plasma-excited N$_2$ gas from the buffer chamber 237; and a step of forming a borazine-ring-skeleton-containing SiBCN film as the second film by performing, a predetermined number of times ($m_2$ times), a set which non-simultaneously performs a step of supplying a BTCSM gas from the nozzle 249a and a step of supplying a TMB gas from the nozzle 249b and supplying a plasma-excited N$_2$ gas from the buffer chamber 237 (Modification 17).

The processing procedures and processing conditions at the respective steps of modifications 13 to 17 may be the same as those of the film forming sequence illustrated in FIG. 4 and those of the respective steps of modifications 1 to 12. In modifications 13 to 17, the performing times (m1 times or m2 times) of each of the sets are controlled such that the thickness of each of the first film and the second film becomes, e.g., 5 nm or less, or 1 nm or less.

In modifications 13 to 17, the same effects as those of the film forming sequence illustrated in FIG. 4 and those of modifications 1 to 12 may be achieved. If the film forming temperature is relatively high, for example, if the film forming process is performed in a temperature zone of 400 degrees C. or more, the plasma-excited N$_2$ gas may not be supplied from the interior of the buffer chamber 237. This is just like modification 2. By doing so, it is possible to appropriately suppress the oxidizing power of the O$_2$ gas. This makes it possible to suppress reduction of the percentage of the Si—C bonds in the finally-formed film and reduction of the C concentration in the finally-formed film.

By alternately laminating the first film and the second film, it becomes possible to improve the controllability of the composition ratio control of the finally-formed laminated film. For example, by making the C concentration in the first film and the C concentration in the second film differ from each other, it becomes possible to control the C concentration in the finally-formed laminated film so as to become an arbitrary concentration between the C concentration in the first film and the C concentration in the second film. At this time, for example, by controlling the ratio of the thickness of the first film to the thickness of the second film, it becomes possible to finely adjust the C concentration in the finally-formed laminated film. That is to say, by alternately laminating the first film and the second film, it becomes possible to control the composition ratio of the finally-formed laminated film so as to become a value which cannot be realized in a case where a single film is formed on the wafer 200 in the same method as used in forming the first film or a case where a single film is formed on the wafer 200 in the same method as used in forming the second film. In other words, it is possible to expand the composition ratio control window.

Furthermore, the finally-formed laminated film can be made of a film having the properties of one or both of the first film and the second film, a film having the intermediate properties between the first film and the second film, or a film having the properties differing from the properties of the first film or the second film. In these cases, as set forth above, the thickness of each of the first film and the second film may be set at, e.g., 0.1 nm or more and 5 nm or less, or 0.1 nm or more and 1 nm or less.

It is difficult to set the thickness of the first film and the second film at a thickness of less than 0.1 nm. Furthermore, if the thickness of one of the first film and the second film is set at a thickness of more than 5 nm, there may be a case where the finally-formed laminated film becomes a film having non-uniform (inconsistent) properties in the laminating direction, namely a film whose properties are made distinct in the laminating direction due to the mere lamination of the first film and the second film. By setting the thickness of the first film and the second film at 0.1 nm or more and 5 nm or less, or 0.1 nm or more and 1 nm or less, the finally-formed laminated film can be a film having consistent properties in the laminating direction, namely a film in which the properties and natures of the first film and the second film are properly fused. That is to say, by setting the thickness of the first film and the second film at a thickness which falls within the aforementioned range, the finally-formed laminated film can be a nano laminate film having integral and inseparable properties in the film as a whole. In addition, if the performing times ($m_1$ times or $m_2$ times) of each of the aforementioned sets are set at one or more times and 50 times or less, or at one or more times and 10 times or less, it is possible to set the thickness of the first film and the second film at a thickness which falls within the aforementioned range.

Furthermore, in modification 17, one or more effects set forth below may be achieved.

(a) By alternately laminating the first film and the second film, it becomes possible to enhance the controllability when controlling the ratio of the B component and the N component (hereinafter also referred to as a "B/N ratio"). The reasons are as follows. The B/N ratio of the second film formed through the use of the BTCSM gas and the TMB gas is decided depending on the ratio of the numbers of B atoms and N atoms contained in one molecule of the TMB gas (the ratio being 1/1 in the TMB gas), namely the kind of the gas containing a borazine ring skeleton. It is difficult to control the B/N ratio so as to become a value which is far away from this value. In contrast, the B/N ratio of the first film formed through the use of the BTCSM gas, the $BCl_3$ gas and the $NH_3$ gas can be freely controlled by, for example, adjusting the flow rate ratio of the $BCl_3$ gas and the $NH_3$ gas. Thus, if the B/N ratio of the first film and the B/N ratio of the second film are made different from each other when alternately laminating the first film and the second film, it is possible to control the B/N ratio of the finally-formed SiBCN film so as to become an arbitrary value between the B/N ratio of the first film and the B/N ratio of the second film.

(b) By alternately laminating the first film and the second film, it is possible to enhance the controllability of the film density of the finally-formed SiBCN film, namely the in-film atomic density. As a result, it becomes possible to enhance the controllability of the dielectric constant control of the finally-formed SiBCN film. The reasons are as follows. The borazine-ring-skeleton-containing second film (the porous film) becomes a film which is lower in the in-film atomic density and in the dielectric constant than the borazine-ring-skeleton-free first film (the non-porous film). Thus, by alternately laminating the first film and the second film, it is possible to control the dielectric constant of the finally-formed SiBCN film so as to become, e.g., an arbitrary value between the dielectric constant of the borazine-ring-skeleton-containing SiBCN film (single film) formed through the use of the BTCSM gas and the TMB gas and the dielectric constant of the borazine-ring-skeleton-free SiBCN film (single film) formed through the use of the BTCSM gas, the $BCl_3$ gas and the $NH_3$ gas. That is to say, by alternately laminating the first film and the second film, it is possible to control the dielectric constant of the finally-formed SiBCN film so as to become a value which cannot be realized in a case where a single film is formed through the use of the BTCSM gas and the TMB gas or a case where a single film is formed through the use of the BTCSM gas, the $BCl_3$ gas and the $NH_3$ gas. This makes it possible to expand the dielectric constant control window. In addition, by controlling the ratio of the thickness of the first film and the thickness of the second film, it is possible to finely adjust the dielectric constant of the finally-formed SiBCN film.

(c) By alternately laminating the first film and the second film, it is possible to improve the surface roughness of the finally-formed SiBCN film. The term "surface roughness" means the height difference in a wafer surface or in an arbitrary object surface. The surface roughness has the same meaning as the surface coarseness. By stating that the surface roughness is improved (good), it is meant that the height difference is reduced (small), namely that the surface is smoothened (smooth). By stating that the surface roughness is worsened (poor), it is meant that the height difference is increased (large), namely that the surface is roughened (rough). There is a tendency that the borazine-ring-skeleton-free first film becomes better in surface roughness than the borazine-ring-skeleton-containing second film. Thus, by alternately laminating the first film and the second film, it becomes possible to improve the surface roughness of the finally-formed SiBCN film. That is to say, by alternately laminating the first film and the second film, it is possible to make the surface roughness of the finally-formed SiBCN film higher than the surface roughness of the borazine-ring-skeleton-containing SiBCN film (single film) formed through the use of the BTCSM gas and the TMB gas.

At this time, if the formation of the borazine-ring-skeleton-free first film is performed prior to the formation of the borazine-ring-skeleton-containing second film, it is possible to further improve the surface roughness of the finally-formed SiBCN film. That is to say, if the first film having good surface roughness is formed as a base of the second film prior to forming the second film and if the second film is formed on the first film, the second film is affected by the base. This makes it possible to improve the surface roughness of the second film. As a result, it becomes possible to further improve the surface roughness of the finally-formed SiBCN film.

Furthermore, at this time, if the borazine-ring-skeleton-free first film is finally formed, it becomes possible to further improve the surface roughness of the finally-formed SiBCN film. That is to say, if the finally-formed SiBCN film, i.e., the uppermost portion of the laminated film, is configured by the first film having good surface roughness, it becomes possible to further improve the surface roughness of the finally-formed SiBCN film.

In addition, at this time, if the thickness of the first film and the second film is set smaller, namely if the performing times ($m_1$ times or $m_2$ times) of each of the aforementioned sets is set smaller, it becomes possible to further improve the surface roughness of the finally-formed SiBCN film.

(d) By alternately laminating the first film and the second film, it is possible to improve the controllability of the oxidation resistance of the finally-formed SiBCN film. The reasons are as follows. The borazine-ring-skeleton-containing second film contains B as one constituent element of the borazine ring skeleton constituting the second film. The B—N bond constituting the borazine ring skeleton is strong. For that reason, the second film is smaller in the amount of desorption of B from the film by oxidation than the first film. Thus, the second film becomes a film which is high in oxidation resistance, e.g., in the resistance to oxygen plasma, namely a film which is high in the ashing resistance. By alternately laminating the first film and the second film, it is possible to control the oxidation resistance of the finally-formed SiBCN film so as to become, e.g., an arbitrary property between the first film and the second film. That is to say, by alternately laminating the first film and the second film, it is possible to control the oxidation resistance of the finally-formed SiBCN film so as to become a property which cannot be realized in a case where a single film is formed through the use of the BTCSM gas and the TMB gas or a case where a single film is formed through the use of the BTCSM gas, the $BCl_3$ gas and the $NH_3$ gas. That is to say, it is possible to expand the window of oxidation resistance control, i.e., ashing resistance control.

Modification 18

In the film forming sequence illustrated in FIG. 4 and the respective modifications described above, a $C_3H_6$ gas as a reaction gas may be supplied simultaneously with a precursor gas such as a BTCSM gas or the like, or simultaneously with a reaction gas such as a $NH_3$ gas, an $O_2$ gas, a TEA gas, a $BCl_3$ gas, a TMB gas or the like. That is to say, a step of supplying a $C_3H_6$ gas may be performed simultaneously with at least one of the steps of supplying the precursor gases and the steps of supplying the reaction gases other than the $C_3H_6$ gas. FIG. 10 illustrates an example where, in modification 2, the step of supplying the $C_3H_6$ gas is performed simultaneously with the step of supplying the TEA gas.

The step of supplying the $C_3H_6$ gas is performed by the same processing procedures and processing conditions as, e.g., those of the $C_3H_6$ gas supply step of modifications 9 to 12. As the carbon-containing gas, in addition to the $C_3H_6$ gas, it may be possible to use the hydrocarbon-based gases described above.

According to this modification, the same effects as those of the film forming sequence illustrated in FIG. 4 and those of the respective modifications described above may be achieved. In addition, according to this modification, the C component contained in the $C_3H_6$ gas can be added to the finally-formed film. This makes it possible to enhance the controllability of the control of the composition ratio of the finally-formed film, thereby increasing the C concentration within the finally-formed film. However, the $C_3H_6$ gas may be supplied simultaneously with the $NH_3$ gas, the $O_2$ gas, the TEA gas, the $BCl_3$ gas or the TMB gas rather than supplying the $C_3H_6$ gas simultaneously with the BTCSM gas. By doing so, it is possible to avoid an excessive gas phase reaction within the process chamber 201 and to suppress generation of particles within the process chamber 201. Furthermore, it may be more desirable to supply the $C_3H_6$ gas simultaneously with the TMB gas or the TEA gas than to supply the $C_3H_6$ gas simultaneously with the $NH_3$ gas, the $O_2$ gas or the $BCl_2$ gas. By doing so, it is possible to enhance the controllability of the control of the composition ratio of the finally-formed film.

Other Embodiments of the Present Disclosure

While one embodiment of the present disclosure has been described above, the present disclosure is not limited to the aforementioned embodiment but may be differently modified without departing from the spirit of the present disclosure.

For example, in the aforementioned embodiment, there has been described an example where the reaction gas is supplied after the supply of the precursor gas. The present disclosure is not limited thereto. The supply order of the precursor gas and the reaction gas may be reversed. That is to say, the precursor gas may be supplied after the supply of the reaction gas. By changing the supply order of the precursor gas and the reaction gas, it is possible to change the quality or the composition ratio of the thin film thus formed. In the case where plural kinds of reaction gases are used, the supply order of the reaction gases may be arbitrarily changed. By changing the supply order of the reaction gases, it is possible to change the quality or the composition ratio of the thin film thus formed. Furthermore, in the case of using plural kinds of reaction gases, one of the reaction gases may be supplied from at least one of the nozzles 249a and 249b or may be supplied from a gas supply part (or a supply part) differing from the nozzles 249a and 249b. At this time, a plasma-excited $N_2$ gas may be or may not be supplied from the buffer chamber 237.

If the silicon-based insulating film formed by the methods of the embodiment or the modifications described above is used as a sidewall spacer, it is possible to provide a technique of forming a device which is small in leak current and superior in workability. If the aforementioned silicon-based insulating film is used as an etching stopper, it is possible to provide a technique of forming a device which is superior in workability. According to the embodiment or the modifications described above, it is possible to form a silicon-based insulating film having an ideal stoichiometric ratio without having to directly plasma-excite the reaction gas, namely while using relatively soft plasma. Since the silicon-based insulating film can be formed while using relatively soft plasma, it is possible to adapt the present disclosure to a process for forming, e.g., a SADP film of a DPT, in which plasma damage is about a concern.

In the aforementioned embodiment, there has been described an example where the silicon-based thin film (the SiCN film, the SiOCN film, the SiOC film or the SiBCN film) containing Si as a semiconductor element is formed as a film containing a specific element. The present disclosure is not limited to the aforementioned form but may be appropriately applied to, e.g., a case where a metal-based thin film containing a metal element such as titanium (Ti), zirconium (Zr), hafnium (Hf), tantalum (Ta), niobium (Nb), aluminum (Al), molybdenum (Mo), tungsten (W) or the like is formed.

That is to say, the present disclosure may be suitably applied to, e.g., a case where a metal-based thin film, namely a metal carbide-based film, such as a TiCN film, a TiOCN film, a TiOC film, a TiBCN film, a ZrCN film, a ZrOCN film, a ZrOC film, a ZrBCN film, a HfCN film, a HfOCN film, a HfOC film, a HfBCN film, a TaCN film, a TaOCN film, a TaOC film, a TaBCN film, a NbCN film, a NbOCN film, a NbOC film, a NbBCN film, an AlCN film, an AlOCN film, an AlOC film, an AlBCN film, a MoCN film, a MoOCN film, a MoOC film, a MoBCN film, a WCN film, a WOCN film, a WOC film, a WBCN film, or the like is formed. In this case, instead of the precursor gas containing Si used in the aforementioned embodiment, a precursor gas containing a metal element may be used as the precursor gas, whereby film formation can be performed by the same sequence as that of the embodiment or the modifications described above.

In the case of forming a Ti-based thin film, a precursor gas containing Ti, C and a halogen element and having a Ti—C bond may be used as a precursor gas containing Ti. As the reaction gas, it may be possible to use the same gas as used in the aforementioned embodiment. The processing conditions used at this time may be the same as, e.g., the processing conditions of the aforementioned embodiment.

In the case of forming a Zr-based thin film, a precursor gas containing Zr, C and a halogen element and having a Zr—C bond may be used as a precursor gas containing Zr. As the reaction gas, it may be possible to use the same gas as used in the aforementioned embodiment. The processing conditions used at this time may be the same as, e.g., the processing conditions of the aforementioned embodiment.

In the case of forming an Hf-based thin film, a precursor gas containing Hf, C and a halogen element and having an Hf—C bond may be used as a precursor gas containing Hf. As the reaction gas, it may be possible to use the same gas as used in the aforementioned embodiment. The processing conditions used at this time may be the same as, e.g., the processing conditions of the aforementioned embodiment.

In the case of forming a Ta-based thin film, a precursor gas containing Ta, C and a halogen element and having a Ta—C bond may be used as a precursor gas containing Ta. As the reaction gas, it may be possible to use the same gas as used in the aforementioned embodiment. The processing conditions used at this time may be the same as, e.g., the processing conditions of the aforementioned embodiment.

In the case of forming an Nb-based thin film, a precursor gas containing Nb, C and a halogen element and having an Nb—C bond may be used as a precursor gas containing Nb.

As the reaction gas, it may be possible to use the same gas as used in the aforementioned embodiment. The processing conditions used at this time may be the same as, e.g., the processing conditions of the aforementioned embodiment.

In the case of forming an Al-based thin film, a precursor gas containing Al, C and a halogen element and having a Al—C bond may be used as a precursor gas containing Al. As the reaction gas, it may be possible to use the same gas as used in the aforementioned embodiment. The processing conditions used at this time may be the same as, e.g., the processing conditions of the aforementioned embodiment.

In the case of forming a Mo-based thin film, a precursor gas containing Mo, C and a halogen element and having a Mo—C bond may be used as a precursor gas containing Mo. As the reaction gas, it may be possible to use the same gas as used in the aforementioned embodiment. The processing conditions used at this time may be the same as, e.g., the processing conditions of the aforementioned embodiment.

In the case of forming a W-based thin film, a precursor gas containing W, C and a halogen element and having a W—C bond may be used as a precursor gas containing W. As the reaction gas, it may be possible to use the same gas as used in the aforementioned embodiment. The processing conditions used at this time may be the same as, e.g., the processing conditions of the aforementioned embodiment.

That is to say, the present disclosure may be suitably applied to a case where a thin film containing a specific element such as a semiconductor element, a metal element or the like as a first element and containing a nonmetallic element such as N, O, B or the like as a second element (or a third element) is formed.

Process recipes (e.g., programs describing processing procedures and processing conditions) used in forming these various kinds of films may be prepared individually (in a plural number) according to the contents of substrate processing (e.g., the kind, composition ratio, quality and thickness of the film to be formed). In addition, at the start of the substrate processing, an appropriate process recipe may be properly selected from the process recipes according to the substrate processing contents. Specifically, the process recipes individually prepared according to the substrate processing contents may be stored (or installed) in advance in the memory device $121c$ of the substrate processing apparatus via a telecommunication line or a recording medium (e.g., the external memory device 123) storing the process recipes. Moreover, at the start of the substrate processing, the CPU $121a$ of the substrate processing apparatus may properly select an appropriate process recipe from the process recipes stored in the memory device $c$ according to the substrate processing contents. This configuration enables a single substrate processing apparatus to form films of different kinds, composition ratios, qualities and thicknesses for general purposes and with enhanced reproducibility. In addition, this configuration makes it possible to reduce an operator's operation burden (e.g., a burden borne by an operator when inputting processing procedures and processing conditions) and to quickly start the substrate processing while avoiding an operation error.

The process recipes mentioned above are not limited to newly-prepared ones but may be prepared by, for example, modifying the existing process recipes already installed in the substrate processing apparatus. When modifying the process recipes, the modified process recipes may be installed in the substrate processing apparatus via a telecommunication line or a recording medium storing the process recipes. In addition, the existing process recipes already installed in the substrate processing apparatus may be directly modified by operating the input/output device 122 of the substrate processing apparatus.

In the aforementioned embodiment, there has been described an example in which thin films are formed using a batch type substrate processing apparatus capable of processing a plurality of substrates at a time. The present disclosure is not limited to the aforementioned embodiment but may be appropriately applied to, e.g., a case where thin films are formed using a single-wafer-type substrate processing apparatus capable of processing a single substrate or several substrates at a time. In addition, in the aforementioned embodiment, there has been described an example in which thin films are formed using a substrate processing apparatus provided with a hot-wall-type processing furnace. The present disclosure is not limited to the aforementioned embodiment but may be appropriately applied to a case where thin films are formed using a substrate processing apparatus provided with a cold-wall-type processing furnace. In these cases, the processing conditions may be the same as, e.g., those of the aforementioned embodiment.

Figure 16A:
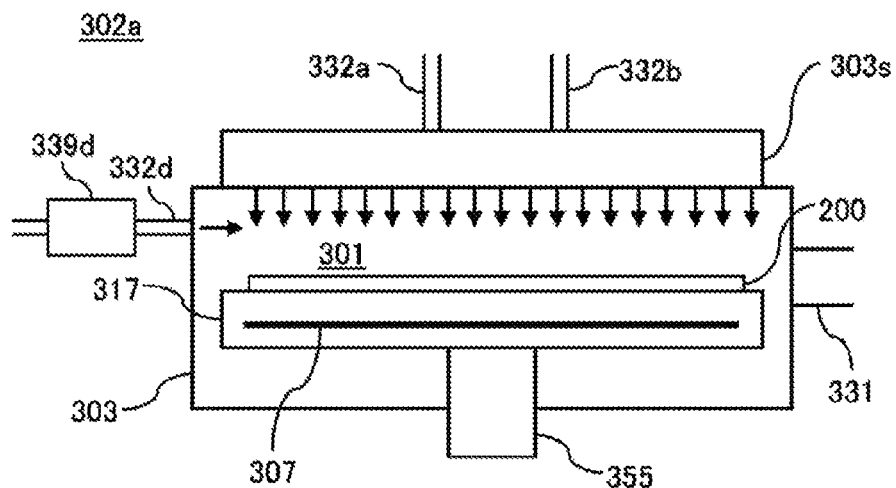
FIGS. 16A to 16C are schematic configuration views of processing furnaces of substrate processing apparatuses suitably used in other embodiments of the present disclosure, in which portions of the processing furnaces are shown in a vertical cross section.

The present disclosure may be suitably applied to, e.g., a case where a film is formed using a substrate processing apparatus provided with a processing furnace $302a$ illustrated in FIG. 16A. The processing furnace $302a$ includes a process vessel 303 which defines a process chamber 301, a shower head $303s$ as a gas supply part (or a supply part) configured to supply a gas into the process chamber 301 in a shower-like manner, a support table 317 configured to horizontally support one or more wafers 200, a rotary shaft 355 configured to support the support table 317 from below, and a heater 307 installed in the support table 317. A gas supply port $332a$ configured to supply the aforementioned precursor gas and a gas supply port $332b$ configured to the supply the aforementioned reaction gas are connected to inlets (gas introduction holes) of the shower head $303s$. A gas supply port $332d$ as a gas supply part (or a supply part) configured to supply the plasma-excited inert gas mentioned above is connected to the sidewall of the process vessel 303, namely the lateral side of the end portions of the wafers 200 carried into the process chamber 301. A precursor gas supply system identical with the precursor gas supply system of the aforementioned embodiment is connected to the gas supply port $332a$. A reaction gas supply system identical with the reaction gas supply system of the aforementioned embodiment is connected to the gas supply port $332b$. A remote plasma unit (or a plasma generating device) $339d$ as an exciting unit configured to supply the aforementioned inert gas by plasma-exciting the same and an inert gas supply system identical with the inert gas supply system of the aforementioned embodiment are connected to the gas supply port $332d$. A gas distribution plate configured to supply a gas into the process chamber 301 in a shower-like manner is installed in outlets (gas discharge holes) of the shower head $303s$. The shower head $303s$ is installed at such a position as to face the surfaces of the wafers 200 carried into the process chamber 301. The gas supply port $332d$ is formed at such a position as not to face the surfaces of the wafers 200 carried into the process chamber 301. An exhaust port 331 configured to evacuate the interior of the process chamber 301 is installed in the process vessel 303. An exhaust system identical with the exhaust system of the aforementioned embodiment is connected to the exhaust port 331.

Figure 16B:
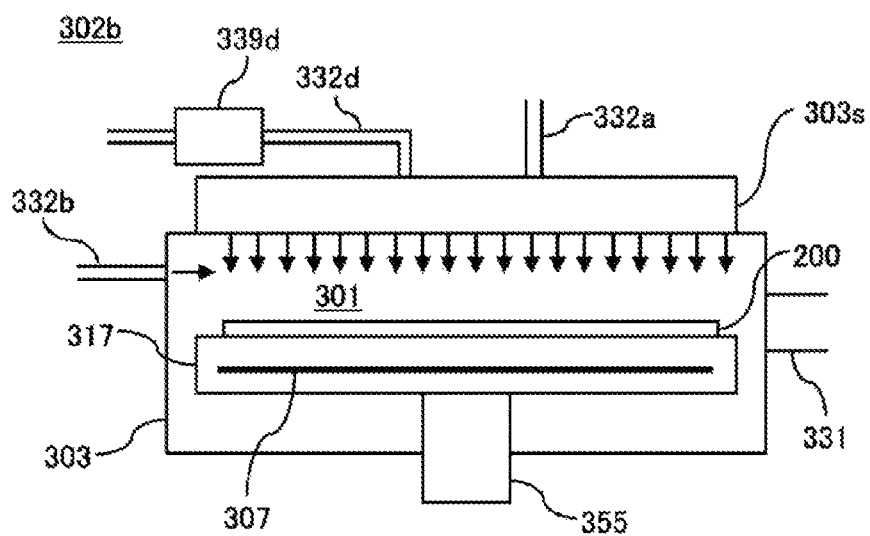

Furthermore, the present disclosure may be suitably applied to, e.g., a case where a film is formed using a substrate processing apparatus provided with a processing furnace $302b$ illustrated in FIG. 16B. A gas supply port $332a$ configured to supply the aforementioned precursor gas and a gas supply port 332d configured to supply the plasma-excited inert gas mentioned above are connected to inlets of a shower head 303s as a gas supply part (or a supply part). A gas supply port 332b as a gas supply part (or a supply part) configured to supply the aforementioned reaction gas is connected to the sidewall of a process vessel 303, namely the lateral side of the end portions of the wafers 200 carried into a process chamber 301. A precursor gas supply system identical with the precursor gas supply system of the aforementioned embodiment is connected to the gas supply port 332a. A reaction gas supply system identical with the reaction gas supply system of the aforementioned embodiment is connected to the gas supply port 332b. A remote plasma unit 339d having the configuration mentioned above and an inert gas supply system identical with the inert gas supply system of the aforementioned embodiment are connected to the gas supply port 332d. The shower head 303s is installed at such a position as to face the surfaces of the wafers 200 carried into the process chamber 301. The gas supply port 332b is formed at such a position as not to face the surfaces of the wafers 200 carried into the process chamber 301. Other components having the same configurations as those of the processing furnace 302a illustrated in FIG. 16A are designated by like reference symbols with the description thereof omitted.

Figure 16C:
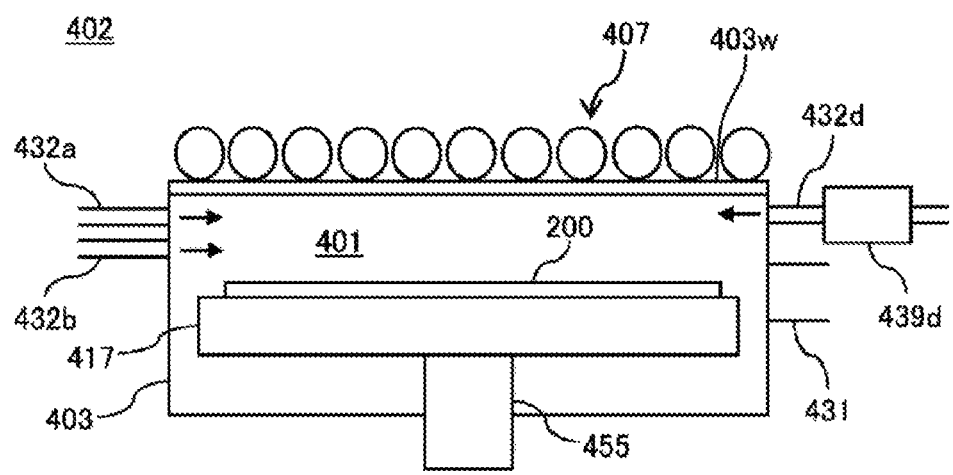

In addition, the present disclosure may be suitably applied to, e.g., a case where a film is formed using a substrate processing apparatus provided with a processing furnace 402 illustrated in FIG. 16C. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed within the process vessel 403, and a quartz window 403w which transmits the light irradiated from the lamp heater 407. A gas supply port 432a as a gas supply part (or a supply part) configured to supply the aforementioned precursor gas, a gas supply port 432b as a gas supply part (or a supply part) configured to supply the aforementioned reaction gas and a gas supply port 432d as a gas supply part (or a supply part) configured to supply the plasma-excited inert gas mentioned above are connected to the process vessel 403. A precursor gas supply system identical with the precursor gas supply system of the aforementioned embodiment is connected to the gas supply port 432a. A reaction gas supply system identical with the reaction gas supply system of the aforementioned embodiment is connected to the gas supply port 432b. A remote plasma unit 439d configured to supply the aforementioned inert gas by plasma-exciting the same and an inert gas supply system identical with the inert gas supply system of the aforementioned embodiment are connected to the gas supply port 432d. The gas supply ports 432a, 432b and 432d are respectively installed at the lateral side of the end portions of the wafers 200 carried into the process chamber 401, namely at such positions as not to face the surfaces of the wafers 200 carried into the process chamber 40. An exhaust port 431 configured to evacuate the interior of the process chamber 401 is installed in the process vessel 403. An exhaust system identical with the exhaust system of the aforementioned embodiment is connected to the exhaust port 431. In the processing furnace 402 illustrated in FIG. 16C, a perpendicular bisector of a straight line interconnecting a gas ejection hole of the gas supply port 432b and a gas ejection hole of the gas supply port 432d may pass through the center of each of the wafers 200 disposed within the process vessel 403. The aforementioned perpendicular bisector may also pass through the center of an exhaust hole of the exhaust port 431.

In the case of using these substrate processing apparatuses, film formation can be performed by the same sequences and processing conditions as those of the embodiments and modifications described above.

The embodiments and modifications described above may be appropriately combined with one another. In addition, the processing conditions used at this time may be the same as, e.g., the processing conditions of the embodiments described above.

Aspects of the Present Disclosure

Hereinafter, some aspects of the present disclosure are additionally described as supplementary notes.

Supplementary Note 1

According to one aspect of the present disclosure, there are provided a method of manufacturing a semiconductor device and a substrate processing method, including forming a film containing a first element, a second element and carbon on a substrate by performing a cycle a predetermined number of times, wherein the cycle includes non-simultaneously performing: forming a first layer containing the first element and carbon by supplying a precursor gas having a chemical bond of the first element and carbon from a first supply part to the substrate in a process chamber; and forming a second layer by supplying a first reaction gas containing the second element from a second supply part to the substrate in the process chamber and supplying a plasma-excited inert gas from a third supply part to the substrate in the process chamber to modify the first layer, the third supply part being different from the second supply part.

Supplementary Note 2

In the method of Supplementary Note 1, in the act of forming the second layer, the first reaction gas and the plasma-excited inert gas are mixed (post-mixed) within the process chamber.

Supplementary Note 3

In the method of Supplementary Note 1 or 2, in the act of forming the second layer, the first reaction gas excited with heat and the plasma-excited inert gas are mixed (post-mixed) within the process chamber.

Supplementary Note 4

In the method of any one of Supplementary Notes 1 to 3, in the act of forming the second layer, the first reaction gas is excited by the plasma-excited inert gas within the process chamber.

Supplementary Note 5

In the method of any one of Supplementary Notes 1 to 4, in the act of forming the second layer, the first reaction gas, which has been excited with heat, is further excited by the plasma-excited inert gas within the process chamber.

Supplementary Note 6

In the method of any one of Supplementary Notes 1 to 5, the act of forming the first layer is performed under a condition in which at least a part of the chemical bond of the first element and carbon included in the precursor gas is maintained without being broken.

Supplementary Note 7

In the method of any one of Supplementary Notes 1 to 6, in the act of forming the first layer, at least a part of the chemical bond of the first element and carbon contained in the precursor gas is introduced into the first layer while the at least a part of the chemical bond of the first element and carbon is maintained without being broken.

Supplementary Note 8

In the method of any one of Supplementary Notes 1 to 7, the act of forming the second layer is performed under a condition in which at least a part of the chemical bond of the first element and carbon included in the first layer is maintained without being broken.

Supplementary Note 9

In the method of any one of Supplementary Notes 1 to 8, in the act of forming the second layer, at least a part of the chemical bond of the first element and carbon included in the first layer is maintained without being broken.

Supplementary Note 10

In the method of any one of Supplementary Notes 1 to 9, in the act of forming the second layer, the first reaction gas and the plasma-excited inert gas are above a surface of the substrate (such that a mixing point of the first reaction gas and the plasma-excited inert gas exists within the plane of the substrate).

Supplementary Note 11

In the method of any one of Supplementary Notes 1 to 10, when seen from a plane view, a perpendicular bisector of a straight line interconnecting the second supply part and the third supply part passes through a center of the substrate (and a center of an exhaust port through which the interior of the process chamber is evacuated).

Supplementary Note 12

In the method of any one of Supplementary Notes 1 to 11, each of the second supply part and the third supply part is installed at a lateral side of an end portion of the substrate.

Supplementary Note 13

In the method of any one of Supplementary Notes 1 to 11, the second supply part is arranged to face a surface of the substrate, and the third supply part is arranged not to face the surface of the substrate. For example, the second supply part is configured as a shower head arranged to face the surface of the substrate.

Supplementary Note 14

In the method of any one of Supplementary Notes 1 to 11, the second supply part is arranged not to face a surface of the substrate, and the third supply part is arranged to face the surface of the substrate. For example, the third supply part is configured as a shower head arranged to face the surface of the substrate.

Supplementary Note 15

In the method of any one of Supplementary Notes 1 to 14, in the act of forming the second layer, an inert gas plasma-excited by a plasma unit is supplied from the third supply part.

Supplementary Note 16

In the method of any one of Supplementary Notes 1 to 15, the cycle further includes performing supplying a second reaction gas containing a third element to the substrate in the process chamber, and wherein the cycle is performed the predetermined number of times to form a film containing the first element, the second element, the third element, and carbon on the substrate.

Supplementary Note 17

In the method of any one of Supplementary Notes 1 to 16, the cycle further includes non-simultaneously performing forming a third layer by supplying a second reaction gas containing a third element to the substrate in the process chamber to modify the second solid layer, and wherein the cycle is performed the predetermined number of times to form a film containing the first element, the second element, the third element, and carbon on the substrate.

At this time, the second reaction gas containing the third element may be supplied from at least one of the first supply part and the second supply part or may be supplied from a supply part differing from the first supply part and the second supply part. Furthermore, at this time, a plasma-excited inert gas may be supplied from the third supply part.

Supplementary Note 18

In the method of any one of Supplementary Notes 1 to 17, the precursor gas contains the first element, carbon and a halogen element.

Supplementary Note 19

In the method of any one of Supplementary Notes 1 to 18, the precursor gas has at least two chemical bonds of the first element and carbon in one molecule thereof (in a chemical structural formula thereof).

Supplementary Note 20

In the method of any one of Supplementary Notes 1 to 19, the first reaction gas includes at least one selected from a group consisting of a nitrogen-containing gas (a nitriding gas or a hydrogen nitride-based gas), a carbon-containing gas (a hydrocarbon-based gas), a nitrogen- and carbon-containing gas (an amine-based gas or an organic hydrazine-based gas), an oxygen-containing gas (an oxidizing gas), a boron-containing gas (a borane-based gas), and a boron-, nitrogen- and carbon-containing gas (a borazine-based gas).

Supplementary Note 21

According to another aspect of the present disclosure, there is provided a substrate processing apparatus, including a process chamber configured to accommodate a substrate; a first gas supply system configured to supply a precursor gas having a chemical bond of a first element and carbon from a first supply part to a substrate in the process chamber; a second gas supply system configured to supply a reaction gas containing a second element from a second supply part to the substrate in the process chamber; a third gas supply system configured to supply a plasma-excited inert gas from a third supply part to the substrate in the process chamber, the third supply part being different from the second supply part; and a control unit configured to control the first gas supply system, the second gas supply system, and the third gas supply system so as to perform a process of forming a film containing the first element, the second element, and carbon on the substrate by performing a cycle a predetermined number of times, wherein the cycle includes non-simultaneously performing: forming a first layer containing the first element and carbon by supplying the precursor gas from the first supply part to the substrate in the process chamber; and forming a second layer by supplying the reaction gas from the second supply part to the substrate in the process chamber and supplying the plasma-excited inert gas from the third supply part to the substrate in the process chamber to modify the first layer.

Supplementary Note 22

According to a further aspect of the present disclosure, there are provided a program and a non-transitory computer-readable recording medium storing the program, wherein the program is configured to cause a computer to perform a process of forming a film containing a first element, a second element and carbon on a substrate by performing a cycle a predetermined number of times, wherein the cycle includes non-simultaneously performing: forming a first layer containing the first element and carbon by supplying a precursor gas having a chemical bond of the first element and carbon from a first supply part to the substrate in a process chamber; and forming a second layer by supplying a reaction gas containing the second element from a second supply part to the substrate in the process chamber and supplying a plasma-excited inert gas from a third supply part to the substrate in the process chamber to modify the first layer, the third supply part being different from the second supply part.

According to the present disclosure, it is possible to form a film having a high carbon concentration.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a film containing a first element, a second element and carbon on a substrate by performing a cycle a predetermined number of times, the cycle including non-simultaneously performing:
forming a first layer containing the first element and carbon by supplying a precursor gas having a chemical bond of the first element and carbon from a first supply part to the substrate in a process chamber; and
forming a second layer by supplying a first reaction gas containing the second element from a second supply part to the substrate in the process chamber and supplying a plasma-excited inert gas from a third supply part different from the second supply part to the substrate, the first reaction gas and the plasma-excited inert gas being separately supplied, such that the first reaction gas and the plasma-excited inert gas are mixed above a surface of the substrate in the process chamber to modify the first layer.

2. The method of claim 1, wherein in the act of forming the second layer, the first reaction gas excited with heat and the plasma-excited inert gas are mixed above the surface of the process chamber.

3. The method of claim 1, wherein in the act of forming the second layer, the first reaction gas is excited by the plasma-excited inert gas above the surface of the process chamber.

4. The method of claim 1, wherein in the act of forming the second layer, the first reaction gas, which has been excited with heat, is further excited by the plasma-excited inert gas above the surface of the process chamber.

5. The method of claim 1, wherein the act of forming the first layer is performed under a condition in which at least a part of the chemical bond of the first element and carbon included in the precursor gas is maintained without being broken.

6. The method of claim 1, wherein the act of forming the second layer is performed under a condition in which at least a part of the chemical bond of the first element and carbon included in the first layer is maintained without being broken.

7. The method of claim 1, wherein, when seen from a plane view, a perpendicular bisector of a straight line interconnecting the second supply part and the third supply part passes through a center of the substrate.

8. The method of claim 1, wherein each of the second supply part and the third supply part is installed at a lateral side of an end portion of the substrate.

9. The method of claim 1, wherein the second supply part is arranged to face a surface of the substrate, and the third supply part is arranged not to face the surface of the substrate.

10. The method of claim 1, wherein the second supply part is arranged not to face a surface of the substrate, and the third supply part is arranged to face the surface of the substrate.

11. The method of claim 1, wherein in the act of forming the second layer, an inert gas plasma-excited by a plasma unit is supplied from the third supply p art.

12. The method of claim 1, wherein the cycle further includes performing:
supplying a second reaction gas containing a third element to the substrate in the process chamber, and
wherein the cycle is performed the predetermined number of times to form a film containing the first element, the second element, the third element, and carbon on the substrate.

13. The method of claim 1, wherein the cycle further includes non-simultaneously performing:
forming a third layer by supplying a second reaction gas containing a third element to the substrate in the process chamber to modify the second solid layer, and
wherein the cycle is performed the predetermined number of times to form a film containing the first element, the second element, the third element, and carbon on the substrate.

* * * * *